United States Patent
Nakao et al.

(10) Patent No.: US 10,297,468 B2
(45) Date of Patent: May 21, 2019

(54) SEMICONDUCTOR DEVICE WITH RECESS AND METHOD OF MAKING

(71) Applicant: ROHM CO., LTD., Kyoto-shi, Kyoto (JP)

(72) Inventors: Yuichi Nakao, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/884,926

(22) Filed: Jan. 31, 2018

(65) Prior Publication Data

US 2018/0158696 A1 Jun. 7, 2018

Related U.S. Application Data

(63) Continuation of application No. 14/639,588, filed on Mar. 5, 2015, now Pat. No. 9,916,991.

(30) Foreign Application Priority Data

| Mar. 6, 2014 | (JP) | ................................. | 2014-043732 |
| Mar. 6, 2014 | (JP) | ................................. | 2014-043733 |

(Continued)

(51) Int. Cl.
*H01L 27/14* (2006.01)
*H01L 21/52* (2006.01)
(Continued)

(52) U.S. Cl.
CPC .............. *H01L 21/52* (2013.01); *H01L 21/56* (2013.01); *H01L 23/13* (2013.01); *H01L 23/147* (2013.01);
(Continued)

(58) Field of Classification Search
None
See application file for complete search history.

(56) References Cited

U.S. PATENT DOCUMENTS 6,013,948 A * 1/2000 Akram ................... H01L 23/13
257/680
8,324,728 B2 12/2012 Tabrizi
(Continued)

FOREIGN PATENT DOCUMENTS

| JP | 2012-99673 | 5/2012 |
| JP | 2012-142410 A | 7/2012 |

OTHER PUBLICATIONS

Japanese Office Action issued in the corresponding Japanese Patent application, dated Sep. 11, 2018, and English machine translation.

*Primary Examiner* — Hung K Vu
(74) *Attorney, Agent, or Firm* — Hamre, Schumann, Mueller & Larson, P.C.

(57) ABSTRACT

A semiconductor device is provided with a substrate made of a semiconductor material, an interconnect layer, at least one electronic element, and a sealing resin. The substrate has a main surface and a pair of lateral surfaces that are orthogonal to the main surface and face in opposite directions to each other. A recessed portion that is recessed from the main surface and has an opening portion that opens on at least one of the pair of lateral surfaces is formed in the substrate. The interconnect layer is formed on the substrate. The electronic element is an orientation sensor, for example, and is accommodated in the recessed portion of the substrate. The sealing resin covers the electronic element.

43 Claims, 74 Drawing Sheets

(30) Foreign Application Priority Data

Mar. 6, 2014 (JP) ................................. 2014-043738
Feb. 26, 2015 (JP) ................................. 2015-036491

(51) Int. Cl.
*H01L 25/16* (2006.01)
*H01L 21/56* (2006.01)
*H01L 23/13* (2006.01)
*H01L 23/14* (2006.01)
*H01L 23/498* (2006.01)
*H01L 23/31* (2006.01)
*H01L 25/065* (2006.01)
*H01L 25/10* (2006.01)

(52) U.S. Cl.
CPC .... *H01L 23/3121* (2013.01); *H01L 23/49827* (2013.01); *H01L 25/0657* (2013.01); *H01L 25/105* (2013.01); *H01L 25/165* (2013.01); *H01L 2224/16225* (2013.01); *H01L 2224/16227* (2013.01); *H01L 2225/06517* (2013.01); *H01L 2225/06555* (2013.01); *H01L 2225/06572* (2013.01); *H01L 2225/1023* (2013.01); *H01L 2225/1058* (2013.01); *H01L 2225/1088* (2013.01); *H01L 2924/15151* (2013.01); *H01L 2924/15156* (2013.01); *H01L 2924/15311* (2013.01); *H01L 2924/15333* (2013.01)

(56) References Cited

U.S. PATENT DOCUMENTS

| | | |
|---|---|---|
| 8,415,811 B2 | 4/2013 | Fukumura et al. |
| 9,331,006 B2 | 5/2016 | Nakao et al. |
| 9,337,116 B2* | 5/2016 | Pagaila ................ H01L 23/3128 |
| 2007/0164403 A1 | 7/2007 | Huang et al. |
| 2011/0186998 A1* | 8/2011 | Wu ........................ H01L 21/486 |
| | | 257/738 |
| 2012/0104623 A1 | 5/2012 | Pagaila et al. |
| 2012/0322206 A1 | 12/2012 | Tabrizi |
| 2013/0069218 A1 | 3/2013 | Seah |

* cited by examiner

SEMICONDUCTOR DEVICE WITH RECESS AND METHOD OF MAKING

BACKGROUND OF THE INVENTION

1. Field of the Invention

The present invention relates to a semiconductor device and a method for making a semiconductor device.

2. Description of Related Art

A semiconductor device that performs a specific function with respect to input and output of current from outside has been proposed in various forms (e.g., see JP-A-2012-99673). Generally, in order to perform the function of this semiconductor device, a plurality of elements each constituting part of an electrical circuit are incorporated. A metal lead is used for the purpose of supporting these elements and establishing an electrical connection therebetween. The number, shape and size of this lead are determined according to the function, shape and size of the plurality of elements. The plurality of elements mounted on this lead are covered with a sealing resin. The sealing resin is for protecting these elements and part of the lead. Such a semiconductor device is mounted for use on the circuit board of an electronic apparatus, for example.

The lead is often formed by punch processing using a metal mold, for example. The technique using a metal mold has the advantage of being able to form the lead efficiently and accurately. However, the lead generally differs in number, size and shape depending on the plurality of elements. It is thus necessary to change the size and/or shape of the lead when the function or the like required of the semiconductor device is changed. In order to realize this, the metal mold inevitably needs to be newly remade. Since the metal mold is comparatively expensive, the cost of the semiconductor device will be increased in the case where the semiconductor device is produced in small batches.

Also, such electronic devices are mounted for use on the circuit board of electronic apparatuses, for example. There are increasing demands for miniaturization of electronic devices following advances in technology.

SUMMARY OF THE INVENTION

The present invention was conceived under the above circumstances. As such, a main object of the present invention is to provide a semiconductor device and a method for making a semiconductor device that enable a reduction in manufacturing cost and miniaturization to be achieved. Also, a main object of the present invention is to provide an electronic device suitable for achieving miniaturization.

An electronic device according to a first aspect of the present invention is provided with a substrate made of a semiconductor material and having a main surface and a back surface that face in opposite directions to each other, a first electronic element disposed on the substrate, and a conductive layer electrically connected to the first electronic element. A through hole that passes through a portion of the substrate is formed in the substrate, the through hole having a through hole inner surface, and the conductive layer being formed from a region of the through hole inner surface on the main surface side to a region of the through hole inner surface the back surface side.

Preferably, a recessed portion for element disposition that is recessed from the main surface is formed in the substrate, and the first electronic element is disposed in the recessed portion for element disposition.

Preferably, the recessed portion for element disposition has a depth of 100 to 300 µm.

Preferably, the recessed portion for element disposition has a recessed portion bottom surface for element disposition that faces in a first thickness direction that is one thickness direction of the substrate and a recessed portion lateral surface for element disposition that stands up from the recessed portion bottom surface for element disposition, and the first electronic element is disposed on the recessed portion bottom surface for element disposition.

Preferably, the recessed portion bottom surface for element disposition is orthogonal to the thickness direction.

Preferably, the recessed portion bottom surface for element disposition includes two band-like surfaces that extend in one direction as viewed in the thickness direction, and the first electronic element is disposed on the two band-like surfaces.

Preferably, the recessed portion bottom surface for element disposition has a connecting surface that connects the two band-like surfaces as viewed in the thickness direction, and the connecting surface extends in a direction that intersects the direction in which each of the two band-like surfaces extend.

Preferably, the recessed portion lateral surface for element disposition is connected to the recessed portion bottom surface for element disposition.

Preferably, the recessed portion lateral surface for element disposition slopes relative to the thickness direction.

Preferably, the recessed portion lateral surface for element disposition is at an angle of 55 degrees relative to a plane that is orthogonal to the thickness direction.

Preferably, the recessed portion lateral surface for element disposition is connected to the main surface.

Preferably, the conductive layer is formed on the recessed portion lateral surface for element disposition.

Preferably, the conductive layer includes a plurality of main surface side interconnects, and the plurality of main surface side interconnects are insulated from each other and are formed on the recessed portion lateral surface for element disposition.

Preferably, the electronic device is further provided with a bottom surface electrode pad formed on the recessed portion bottom surface for element disposition, and the bottom surface electrode pad is electrically connected to the first electronic element and is interposed between the first electronic element and the conductive layer.

Preferably, a recessed portion for interconnects is formed in the substrate, and the recessed portion for interconnects communicates with the through hole.

Preferably, the recessed portion for interconnects has a region that overlaps with the first electronic element as viewed in the thickness direction of the substrate.

Preferably, the recessed portion for interconnects entirely overlaps with the recessed portion for element disposition as viewed in the thickness direction.

Preferably, the recessed portion for interconnects has a depth of 250 to 350 µm.

Preferably, there are a plurality of the recessed portion for interconnects.

Preferably, the recessed portion for interconnects has a recessed portion lateral surface for interconnects, and the recessed portion lateral surface for interconnects is connected to the through hole inner surface.

Preferably, the recessed portion lateral surface for interconnects slopes relative to the thickness direction.

Preferably, the recessed portion lateral surface for interconnects is at an angle of 55 degrees relative to a plane that is orthogonal to the thickness direction.

Preferably, the conductive layer is formed on the recessed portion lateral surface for interconnects.

Preferably, the conductive layer includes a plurality of main surface side interconnects, and the plurality of main surface side interconnects are insulated from each other and are formed on the recessed portion lateral surface for interconnects.

Preferably, the main surface side interconnects have a region that is located closer to a center of the through hole than is a portion of the conductive layer formed on the through hole inner surface, as viewed in a depth direction of the through hole.

Preferably, the through hole has a depth of 10 to 50 µm.

Preferably, a ratio of the depth of the through hole to a maximum opening size of the through hole as viewed in the thickness direction of the substrate is 0.2 to 5.

Preferably, there are a plurality of the through hole.

Preferably, the through hole inner surface extends in the thickness direction of the substrate.

Preferably, the conductive layer includes a plurality of back surface side interconnects, and the plurality of back surface side interconnects are insulated from each other and are formed on the through hole inner surface.

Preferably, the substrate has a thickness of 200 to 550 µm.

Preferably, the substrate is made of a single-crystal semiconductor material.

Preferably, the semiconductor material is Si.

Preferably, the main surface and the back surface are orthogonal to the thickness direction of the substrate and are flat.

Preferably, the main surface is a (100) surface.

Preferably, the substrate has a first lateral surface, a second lateral surface, a third lateral surface and a fourth lateral surface, the first lateral surface, the second lateral surface, the third lateral surface and the fourth lateral surface all face in a direction that is orthogonal to the thickness direction of the substrate, and the first lateral surface and the second lateral surface, the second lateral surface and the third lateral surface, the third lateral surface and the fourth lateral surface, and the fourth lateral surface and the first lateral surface are respectively connected to each other.

Preferably, the electronic device is further provided with an insulating layer formed on the substrate, and the insulating layer is interposed between the conductive layer and the substrate.

Preferably, the insulating layer is made of $SiO_2$ or SiN.

Preferably, the insulating layer includes a main surface side insulating part, and the main surface side insulating part is at least partially formed on the main surface of the substrate.

Preferably, the main surface side insulating part is formed by thermal oxidation.

Preferably, the insulating layer includes a hole inner surface insulating part, and the hole inner surface insulating part is formed on the through hole inner surface.

Preferably, the hole inner surface insulating part is formed by CVD.

Preferably, the insulating layer includes a back surface side insulating part, and the back surface side insulating part is at least partially formed on the back surface of the substrate.

Preferably, the back surface side insulating part is formed by thermal oxidation.

Preferably, the conductive layer includes a seed layer and a plating layer, and the seed layer is interposed between the substrate and the plating layer.

Preferably, the seed layer has a thickness of less than or equal to 1 µm, and the plating layer has a thickness of 3 to 10 µm.

Preferably, the seed layer is made of Cu, and the plating layer is made of Cu.

Preferably, the electronic device is further provided with a main surface side insulating film that is at least partially formed on the main surface, and the conductive layer is interposed between the main surface side insulating film and the substrate.

Preferably, the electronic device is further provided with a back surface side insulating film that is at least partially formed on the back surface, the back surface side insulating film has a region formed inside the through hole, and the conductive layer is interposed between the back surface side insulating film and the substrate.

Preferably, the main surface side insulating film and the back surface side insulating film are made of SiN.

Preferably, the main surface side insulating film and the back surface side insulating film are formed by CVD.

Preferably, the electronic device is further provided with a main surface electrode pad formed on the main surface, and the main surface electrode pad contacts the conductive layer and is electrically connected to the first electronic element.

Preferably, the electronic device is further provided with a back surface electrode pad formed on the back surface, and the back surface electrode pad contacts the conductive layer and is electrically connected to the first electronic element.

Preferably, the electronic device is further provided with a sealing resin part that fills the recessed portion for element disposition and covers the first electronic element.

Preferably, the sealing resin part leaves the main surface electrode pad exposed.

Preferably, the electronic device is further provided with a second electronic element and a third electronic element that are disposed on the back surface side.

Preferably, the first electronic element is an integrated circuit element, the second electronic element is an inductor, and the third electronic element is a capacitor.

Preferably, a size of the second electronic element and the third electronic element in the thickness direction of the substrate is 400 to 600 µm.

An electronic device according to a second aspect of the present invention is provided with a substrate made of a semiconductor material and having a main surface and a back surface that face in opposite directions to each other, a first electronic element and an additional first electronic element disposed on the substrate and stacked one on another, and a conductive layer electrically connected to the first electronic element. A through hole that passes through a portion of the substrate is formed in the substrate, the through hole having a through hole inner surface, and the conductive layer being formed from a region of the through hole inner surface on the main surface side to a region of the through hole inner surface the back surface side.

Preferably, a recessed portion for element disposition that is recessed from the main surface is formed in the substrate, and the first electronic element is disposed in the recessed portion for element disposition.

Preferably, the recessed portion for element disposition has a recessed portion bottom surface for element disposition that faces in a first thickness direction that is one thickness direction of the substrate, and a recessed portion lateral surface for element disposition that stands up from the recessed portion bottom surface for element disposition, and the first electronic element is disposed on the recessed portion bottom surface for element disposition.

Preferably, the recessed portion bottom surface for element disposition is orthogonal to the thickness direction.

Preferably, the recessed portion lateral surface for element disposition slopes relative to the thickness direction.

Preferably, the recessed portion lateral surface for element disposition is at an angle of 55 degrees relative to a plane that is orthogonal to the thickness direction.

Preferably, the recessed portion lateral surface for element disposition is connected to the main surface.

Preferably, an additional recessed portion for element disposition that is recessed from the recessed portion for element disposition is formed in the substrate, and the additional first electronic element is disposed in the additional recessed portion for element disposition.

Preferably, a recessed portion for interconnects is formed in the substrate, and the recessed portion for interconnects communicates with the through hole.

Preferably, the recessed portion for interconnects has a region that overlaps with the first electronic element as viewed in the thickness direction of the substrate.

Preferably, the recessed portion for interconnects entirely overlaps with the recessed portion for element disposition as viewed in the thickness direction.

Preferably, the recessed portion for interconnects has a recessed portion lateral surface for interconnects, and the recessed portion lateral surface for interconnects is connected to the through hole inner surface.

Preferably, the recessed portion lateral surface for interconnects slopes relative to the thickness direction.

Preferably, the recessed portion lateral surface for interconnects is at an angle of 55 degrees relative to a plane that is orthogonal to the thickness direction.

Preferably, the conductive layer is formed on the recessed portion lateral surface for interconnects.

Preferably, the conductive layer includes a plurality of main surface side interconnects, and the plurality of main surface side interconnects are insulated from each other and are formed on the recessed portion lateral surface for interconnects.

Preferably, the main surface side interconnects have a region that is located closer to a center of the through hole than is a portion of the conductive layer formed on the through hole inner surface, as viewed in a depth direction of the through hole.

Preferably, the through hole has a depth of 10 to 50 μm.

Preferably, a ratio of the depth of the through hole to a maximum opening size of the through hole as viewed in the thickness direction of the substrate is 0.2 to 5.

Preferably, there are a plurality of the through hole.

Preferably, the through hole inner surface extends in the thickness direction of the substrate.

Preferably, the conductive layer include a plurality of back surface side interconnects, and the plurality of back surface side interconnects are insulated from each other and are formed on the through hole inner surface.

Preferably, the substrate is made of a single-crystal semiconductor material.

Preferably, the semiconductor material is Si.

Preferably, the main surface and the back surface are orthogonal to the thickness direction of the substrate and are flat.

Preferably, the main surface is a (100) surface.

Preferably, the electronic device is further provided with a second electronic element disposed on the substrate, and the second electronic element is disposed on an opposite side to the first electronic element with the through hole sandwiched therebetween.

Preferably, a back surface side recessed portion for element disposition that is recessed from the back surface is formed in the substrate, with the recessed portion for element disposition as a main surface side recessed portion for element disposition, and the second electronic element is disposed in the back surface side recessed portion for element disposition.

Preferably, the electronic device is further provided with an additional second electronic element disposed on the substrate, the second electronic element and the additional second electronic element are stacked one on another, an additional back surface side recessed portion for element disposition that is recessed from the back surface side recessed portion for element disposition is formed in the substrate, and the additional second electronic element is disposed in the additional back surface side recessed portion for element disposition.

Preferably, the electronic device is further provided with an insulating layer formed on the substrate, and the insulating layer is interposed between the conductive layer and the substrate.

Preferably, the insulating layer is made of $SiO_2$ or SiN.

Preferably, the insulating layer includes a main surface side insulating part, and the main surface side insulating part is at least partially formed on the main surface of the substrate.

Preferably, the main surface side insulating part is formed by thermal oxidation.

Preferably, the insulating layer includes a hole inner surface insulating part, and the hole inner surface insulating part is formed on the through hole inner surface.

Preferably, the hole inner surface insulating part is formed by CVD.

Preferably, the insulating layer includes aback surface side insulating part, and the back surface side insulating part is at least partially formed on the back surface of the substrate.

Preferably, the back surface side insulating part is formed by thermal oxidation.

Preferably, the conductive layer includes a seed layer and a plating layer, and the seed layer is interposed between the substrate and the plating layer.

Preferably, the seed layer has a thickness of less than or equal to 1 μm, and the plating layer has a thickness of 3 to 10 μm.

Preferably, the seed layer is made of Cu, and the plating layer is made of Cu.

Preferably, the electronic device is further provided with a main surface side insulating film that is at least partially formed on the main surface, and the conductive layer is interposed between the main surface side insulating film and the substrate.

Preferably, the electronic device is further provided with a back surface side insulating film that is at least partially formed on the back surface, the back surface side insulating film has a region formed inside the through hole, and the conductive layer is interposed between the back surface side insulating film and the substrate.

Preferably, the main surface side insulating film and the back surface side insulating film are made of SiN.

Preferably, the main surface side insulating film and the back surface side insulating film are formed by CVD.

Preferably, the electronic device is further provided with a main surface electrode pad formed on the main surface.

Preferably, the electronic device is further provided with a back surface electrode pad formed on the back surface.

An electronic device unit according to a third aspect of the present invention is provided with a plurality of electronic devices according to the first aspect or the second aspect, and the plurality of electronic devices are stacked one on another.

Preferably, the plurality of electronic devices are joined to each other via a conductive junction element.

A semiconductor device according to a fourth aspect of the present invention is provided with a substrate made of a semiconductor material, having a main surface and a pair of lateral surfaces that are orthogonal to the main surface and face in opposite directions to each other, and in which is formed a recessed portion that is recessed from the main surface and has an opening portion that opens on at least one of the pair of lateral surfaces, an interconnect layer formed on the substrate, one or more elements accommodated in the recessed portion, and a sealing resin that at least partially covers the one or more elements.

Preferably, the recessed portion has a pair of opening portions that respectively open on the pair of lateral surfaces.

Preferably, the semiconductor device has an additional element that at least partially covers the one or more elements.

Preferably, the recessed portion accommodates the one or more elements, and includes a first recessed portion having a first bottom surface and a first sloping surface and a second recessed portion having a second bottom surface that is connected to the first sloping surface and a second sloping surface that is connected to the second bottom surface and the main surface.

Preferably, the additional element is supported by the second bottom surface, and at least partially overlaps with the first recessed portion as viewed in a direction of the normal of the main surface.

Preferably, the additional element is supported by at least two regions of the second bottom surface that sandwich the first recessed portion.

Preferably, at least one of the one or more elements is supported by the first bottom surface.

Preferably, at least one of the one or more elements is supported by the first sloping surface.

Preferably, the substrate is made of a single-crystal semiconductor material.

Preferably, the semiconductor material is Si.

Preferably, the main surface is a (100) surface, the first recessed portion has two of the first sloping surface, and the second recessed portion has two of the second sloping surface.

Preferably, the one or more elements include three orientation sensor elements that have detection reference axes that extend in different directions to each other.

Preferably, the interconnect layer has a plurality of external terminals formed on the main surface.

Preferably, the interconnect layer is formed on the second bottom surface, and has a plurality of second bottom surface pads for mounting the additional element.

Preferably, the interconnect layer is formed on the first bottom surface, and has a plurality of first bottom surface pads for mounting the element.

Preferably, the interconnect layer is formed on the first sloping surface, and has a plurality of first sloping surface pads for mounting the element.

Preferably, the interconnect layer has a connection path that connects any of the external terminal, the second bottom surface pad, the first bottom surface pad and the first sloping surface pad to each other.

Preferably, the connection path passes via the second sloping surface.

Preferably, the connection path passes via the first sloping surface.

Preferably, the sealing resin includes a first sealing resin that covers at least one of the one or more elements and a second sealing resin that at least partially covers the additional element.

Preferably, the second sealing resin entirely covers the additional element.

Preferably, the second sealing resin leaves the external terminal exposed.

According to a fifth aspect of the present invention, a method for making a semiconductor device is provided. The method includes a step of forming one or more recessed portions that are elongated in a first direction in a substrate material, a step of forming an interconnect layer on the substrate that includes the recessed portion, a step of mounting a plurality of elements in a dispersed manner in the first direction so as to be accommodated in the recessed portion, a step of forming a sealing resin that covers the plurality of elements, and a step of cutting the substrate material and the sealing resin in a second direction that intersects both the first direction and a direction of the normal of the main surface, such that elements among the plurality of elements are separated from each other.

Preferably, in the step of forming the recessed portion, a first recessed portion having a first bottom surface and a first sloping surface and a second recessed portion having a second bottom surface that is connected to the first sloping surface and a second sloping surface that is connected to the second bottom surface and the main surface are formed.

Preferably, in the step of mounting the plurality of elements, the plurality of elements are mounted so as to be accommodated in the first recessed portion.

Preferably, the method includes a step of mounting a plurality of additional elements such that each additional element at least partially covers one of the plurality of elements, after the step of mounting the plurality of elements and before the step of forming the sealing resin.

Preferably, in the step of mounting the plurality of additional elements, the additional elements are supported by the second bottom surface and at least partially overlapped with the first recessed portion as viewed in a direction of the normal of the main surface.

Preferably, in the step of mounting the plurality of elements, one of the plurality of elements is supported by the first bottom surface.

Preferably, in the step of mounting the plurality of elements, one of the plurality of elements is supported by the first sloping surface.

Preferably, the substrate is made of a single-crystal semiconductor material.

Preferably, the semiconductor material is Si.

Preferably, the main surface is a (100) surface, the first recessed portion has two of the first sloping surface, and the second recessed portion has two of the second sloping surface.

Preferably, the plurality of elements include an orientation sensor element having a detection reference axis.

Other features and advantages of the present invention will become apparent from the detailed description that will be given below with reference to the attached drawings.

DESCRIPTION OF THE PREFERRED EMBODIMENTS

Hereinafter, embodiments of the present invention will be specifically described with reference to the drawings.

First Embodiment

A first embodiment of the present invention will be described using FIGS. 1 to 41.

Figure 1:
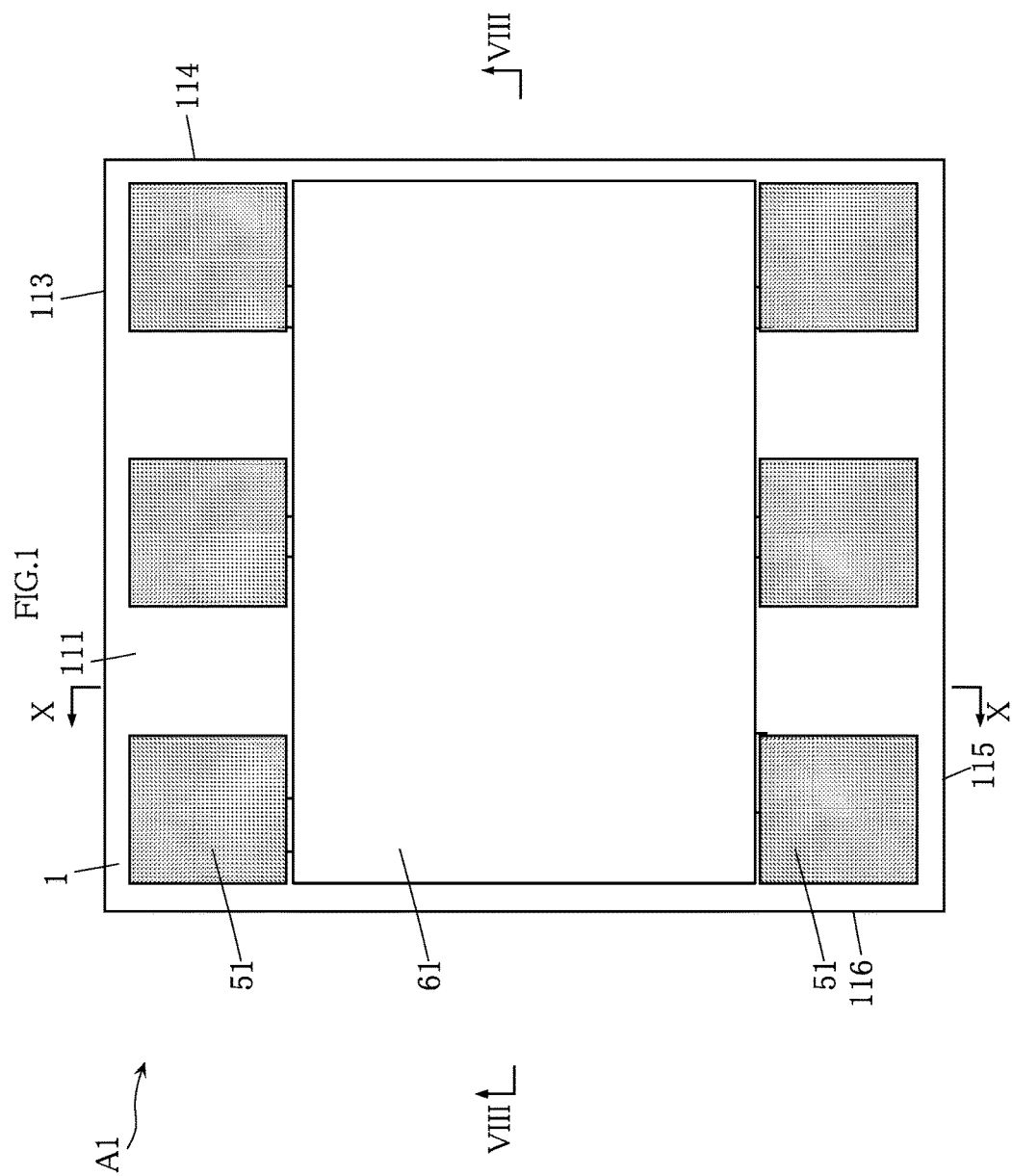
FIG. 1 is a plan view of an electronic device according to a first embodiment of the present invention.
Figure 8:
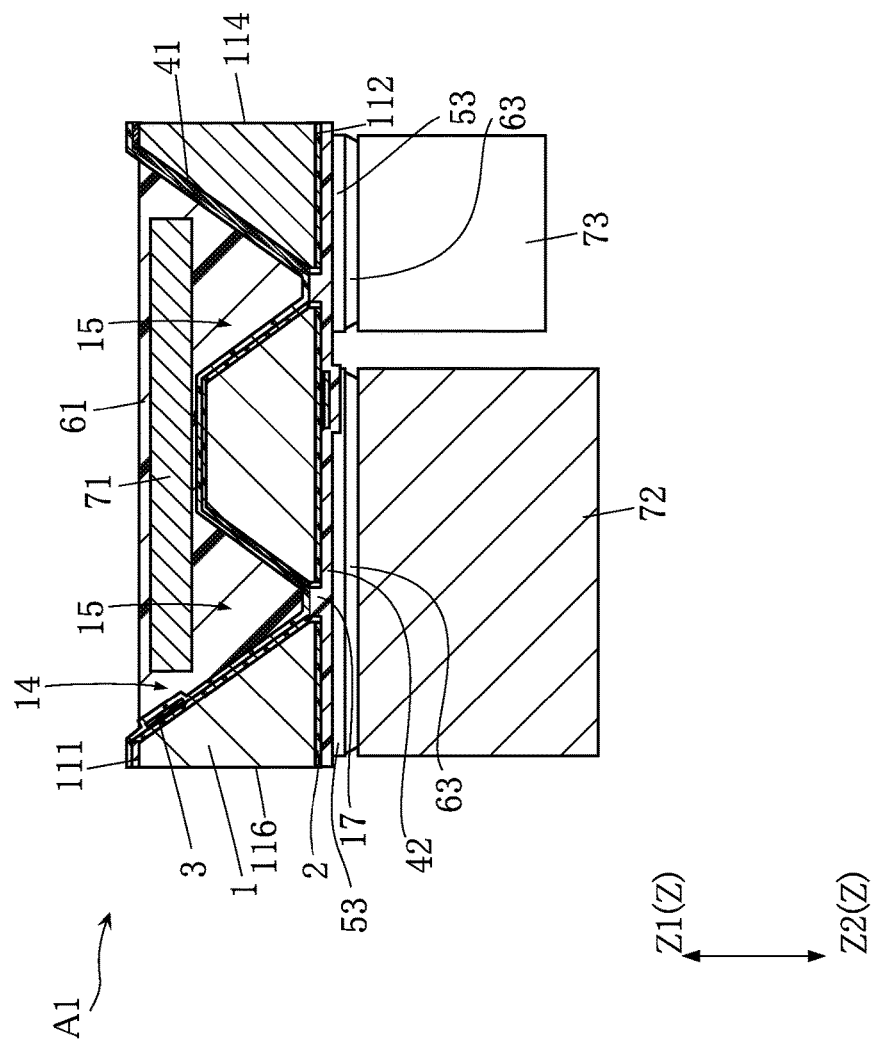
FIG. 8 is a cross-sectional view along a line VIII-VIII in FIG. 1.
Figure 9:
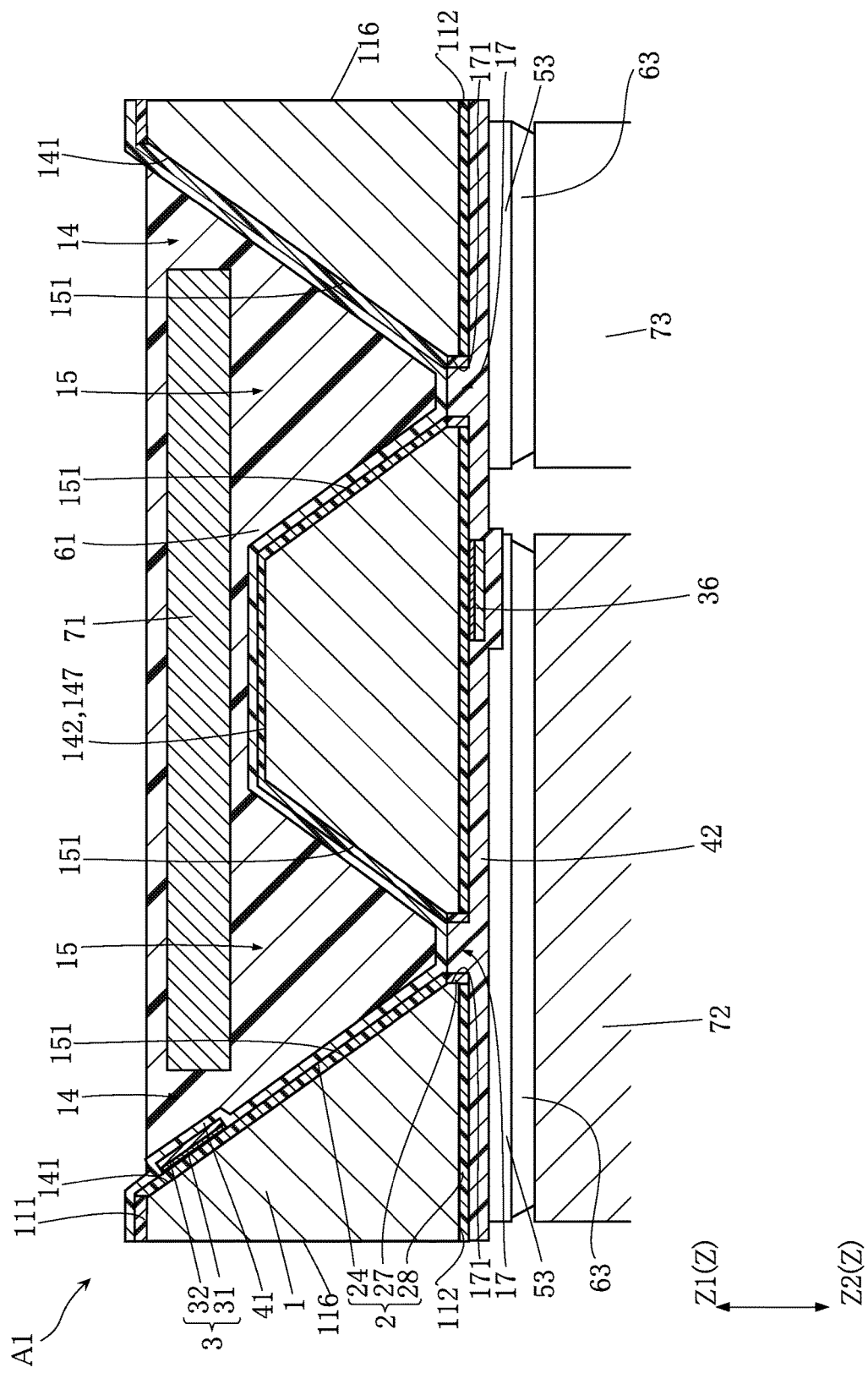
FIG. 9 is a partially enlarged view of FIG. 8.
Figure 10:
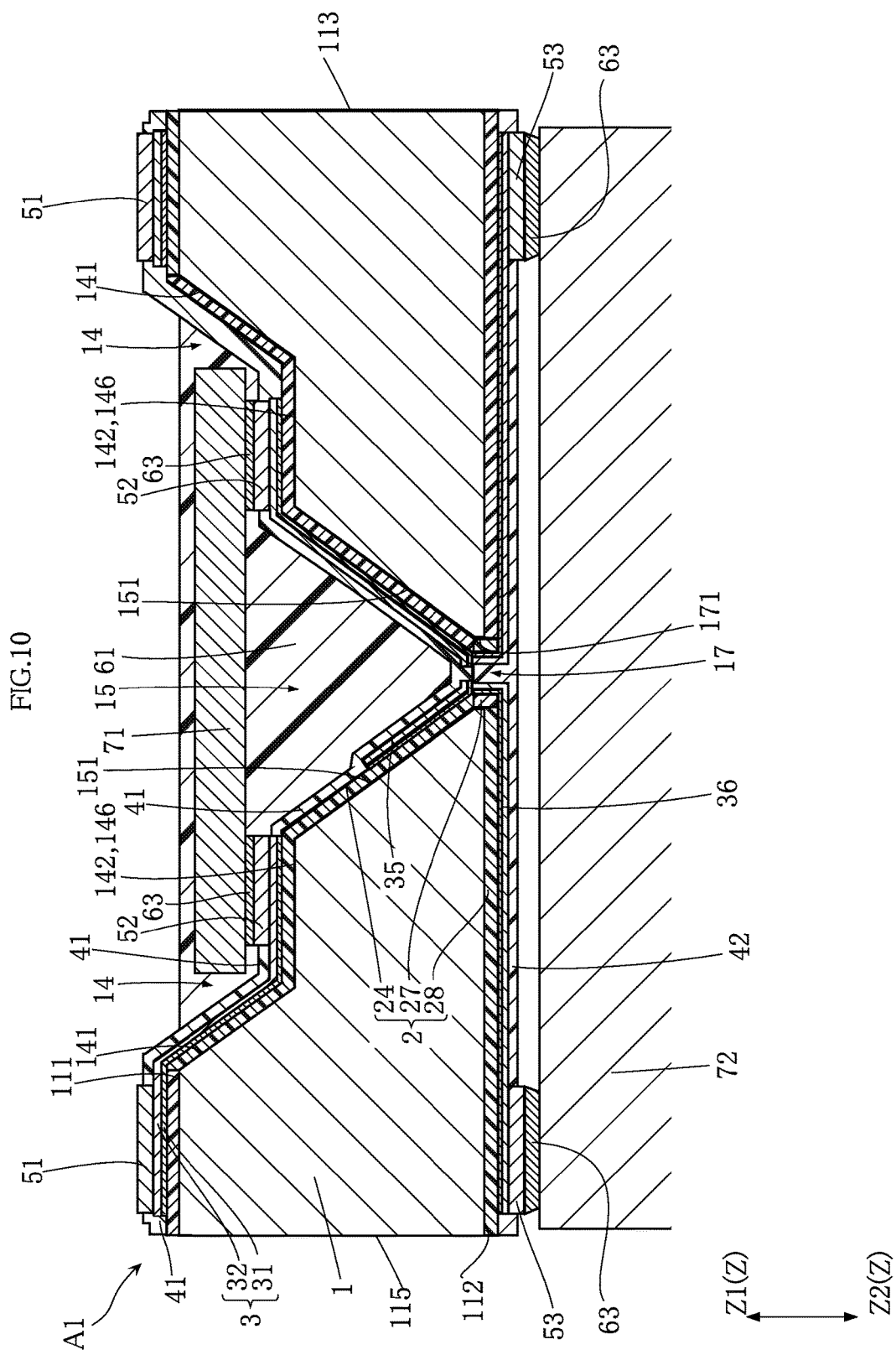
FIG. 10 is a cross-sectional view along a line X-X in FIG. 1.
Figure 11:
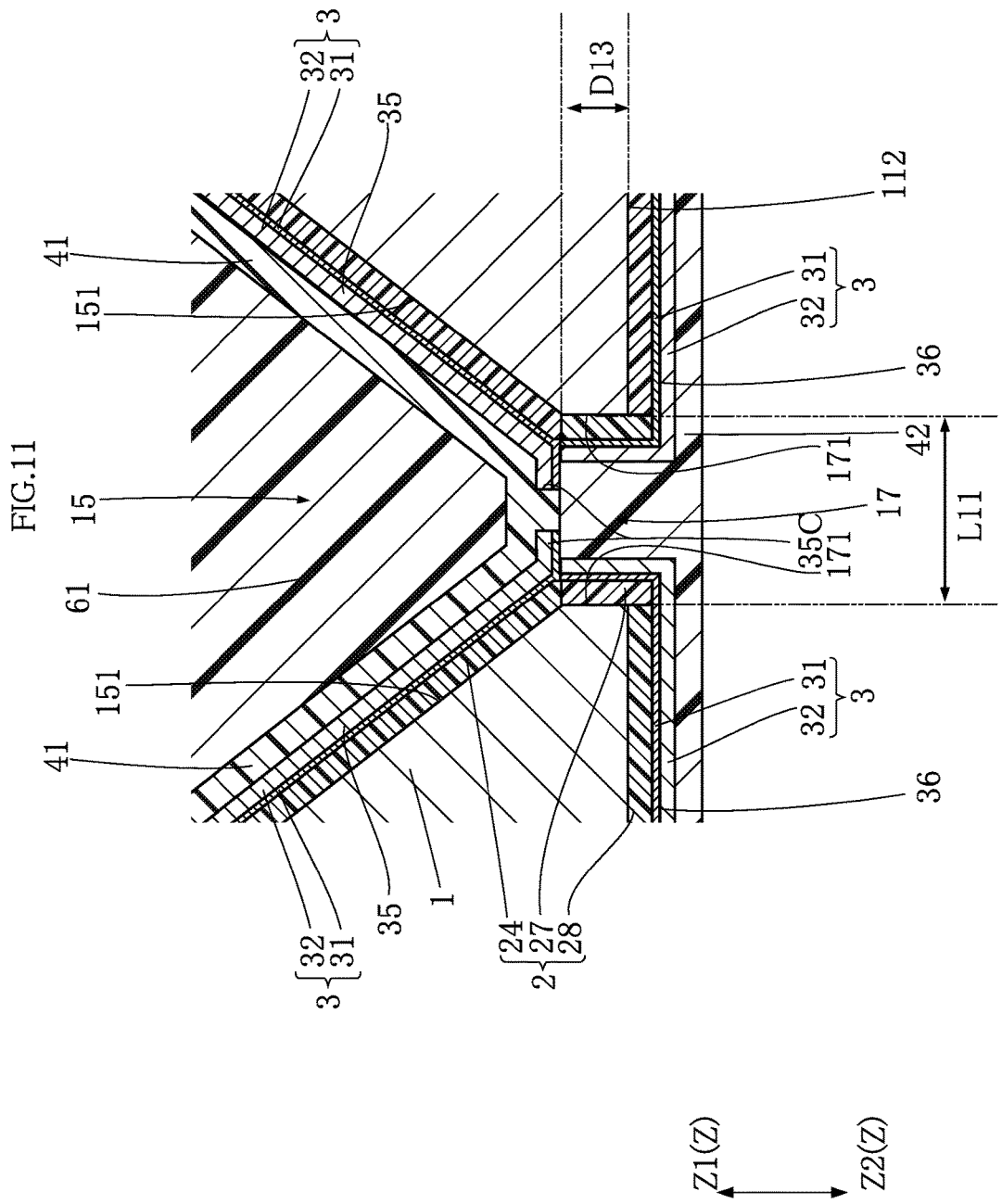
FIG. 11 is a partially enlarged view of FIG. 10.

FIG. 1 is a plan view of an electronic device according to the first embodiment of the present invention. FIG. 8 is a cross-sectional view along a line VIII-VIII in FIG. 1. FIG. 9 is a partially enlarged view of FIG. 8. FIG. 10 is a cross-sectional view along a line X-X in FIG. 1. FIG. 11 is a partially enlarged view of FIG. 10.

An electronic device A1 shown in these diagrams is provided with a substrate 1, an insulating layer 2, a conductive layer 3, a main surface side insulating film 41, a back surface side insulating film 42, a main surface electrode pad 51, a bottom surface electrode pad 52, a back surface electrode pad 53, a sealing resin part 61, a conductive junction 63, a first electronic element 71, a second electronic element 72, and a third electronic element 73.

Figure 2:
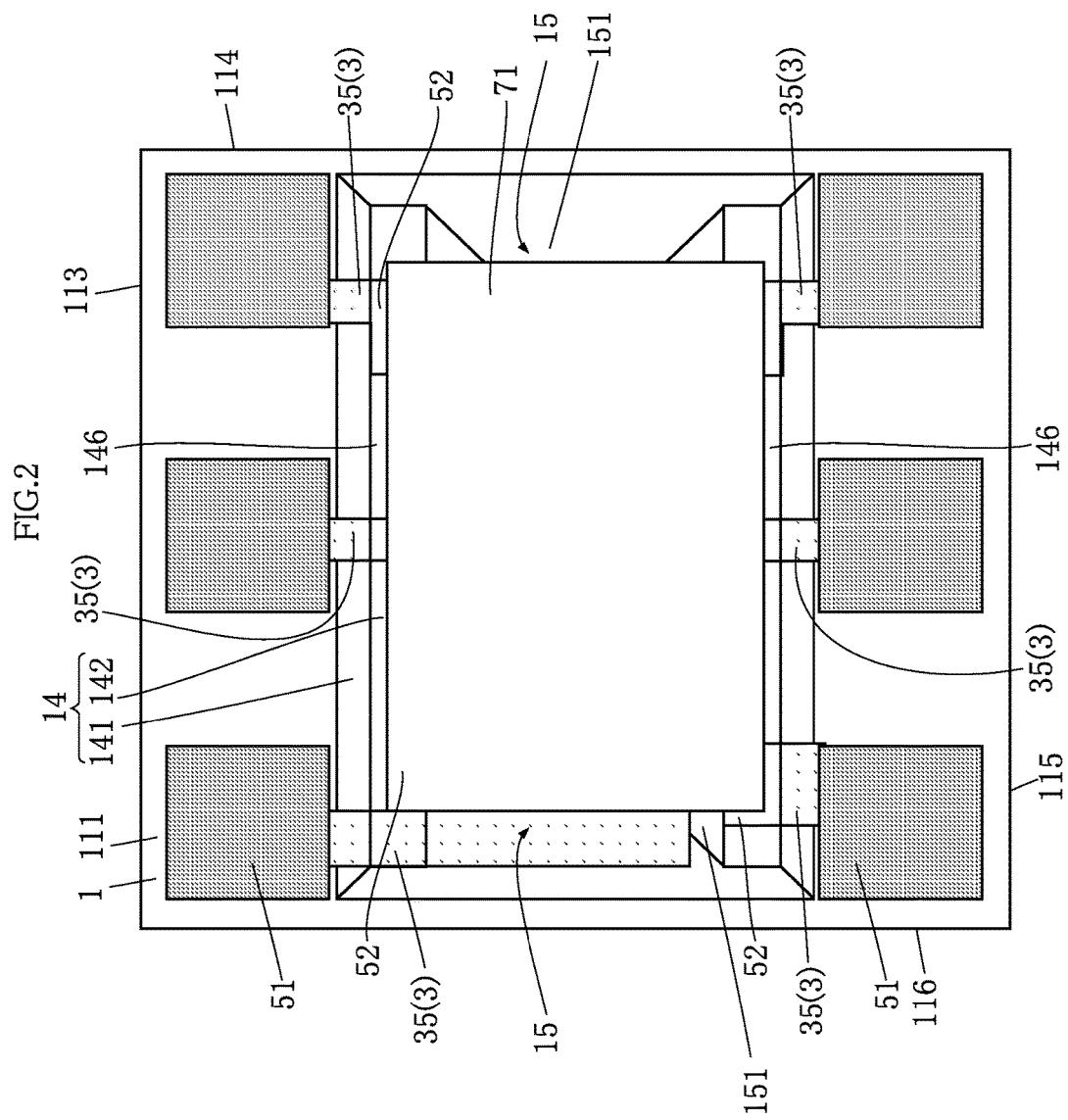
FIG. 2 is a diagram of the electronic device shown in FIG. 1 from which a sealing resin part has been omitted.
Figure 3:
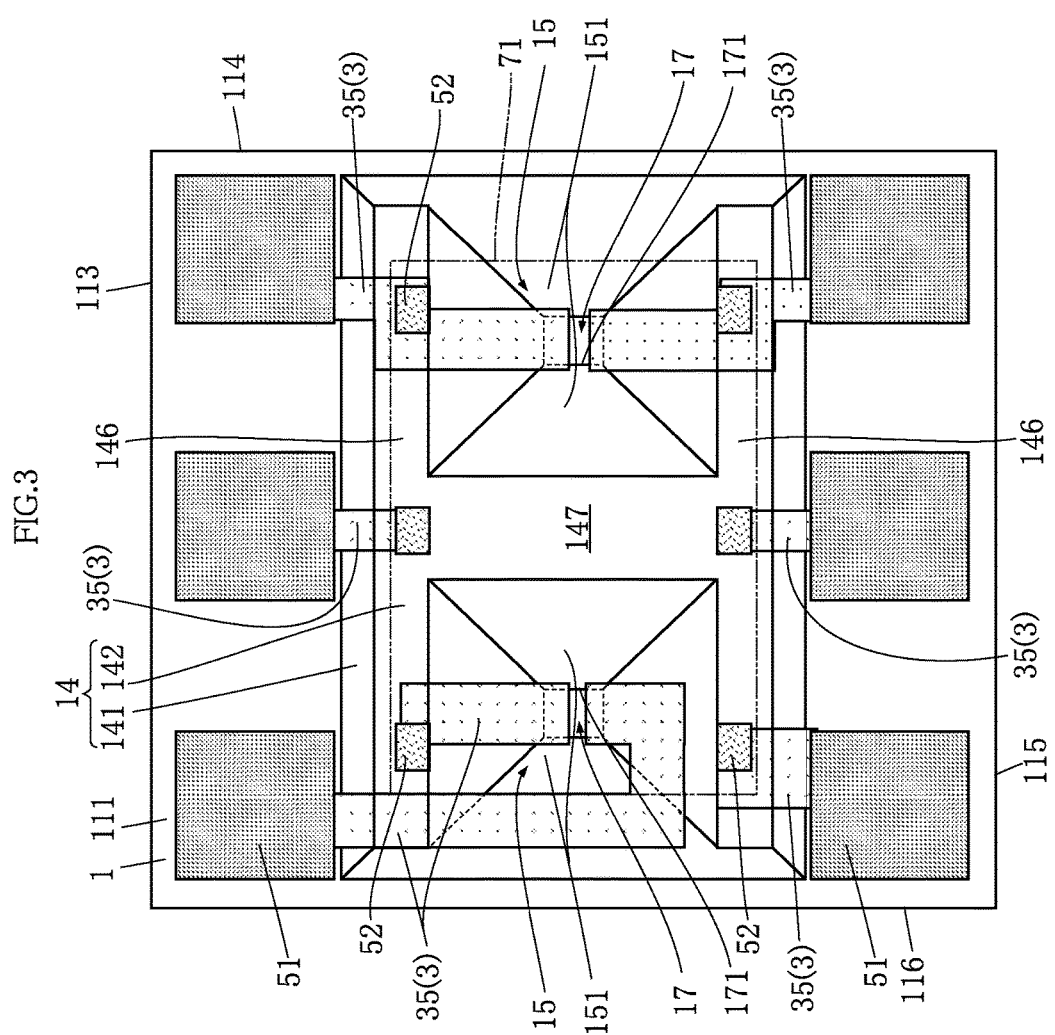
FIG. 3 is a diagram of the electronic device shown in FIG. 2 from which a first electronic element has been omitted.
Figure 4:
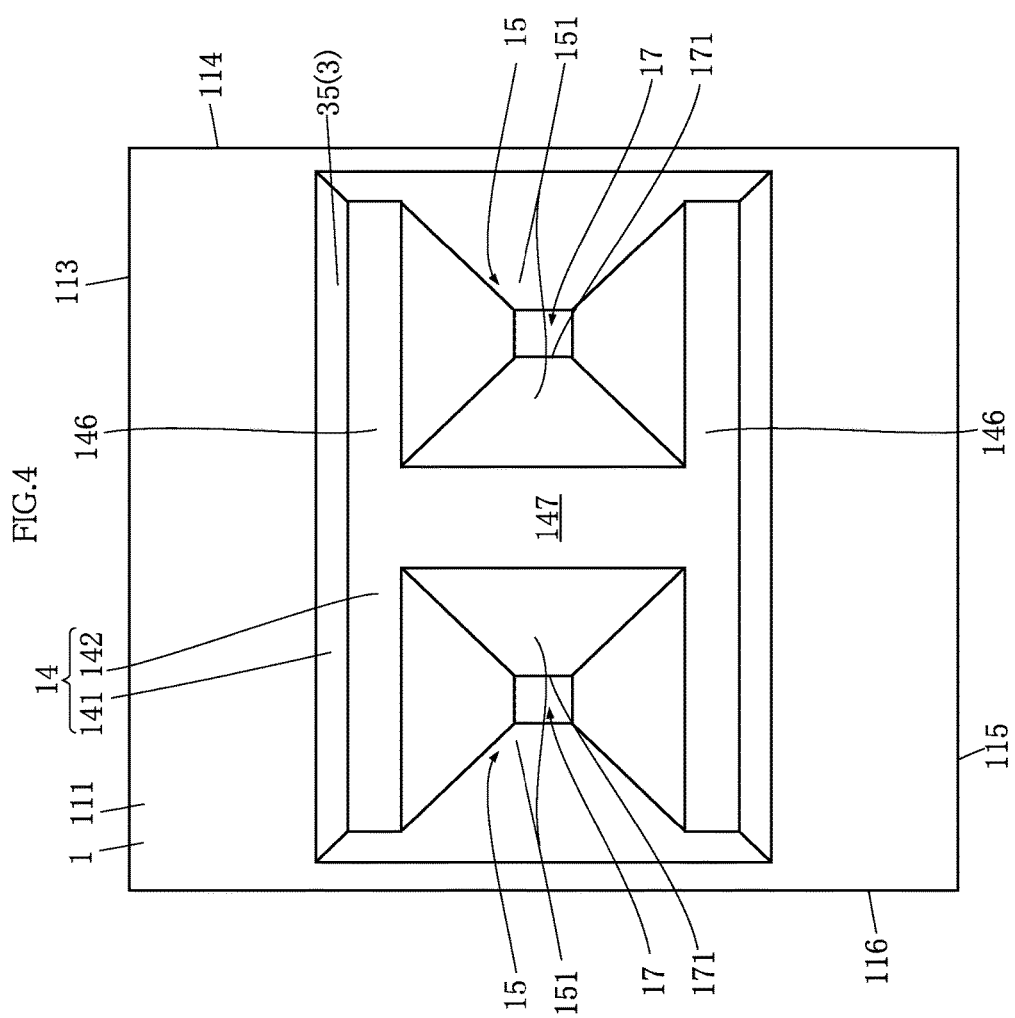
FIG. 4 is a diagram showing only a substrate of the electronic device shown in FIG. 2.
Figure 5:
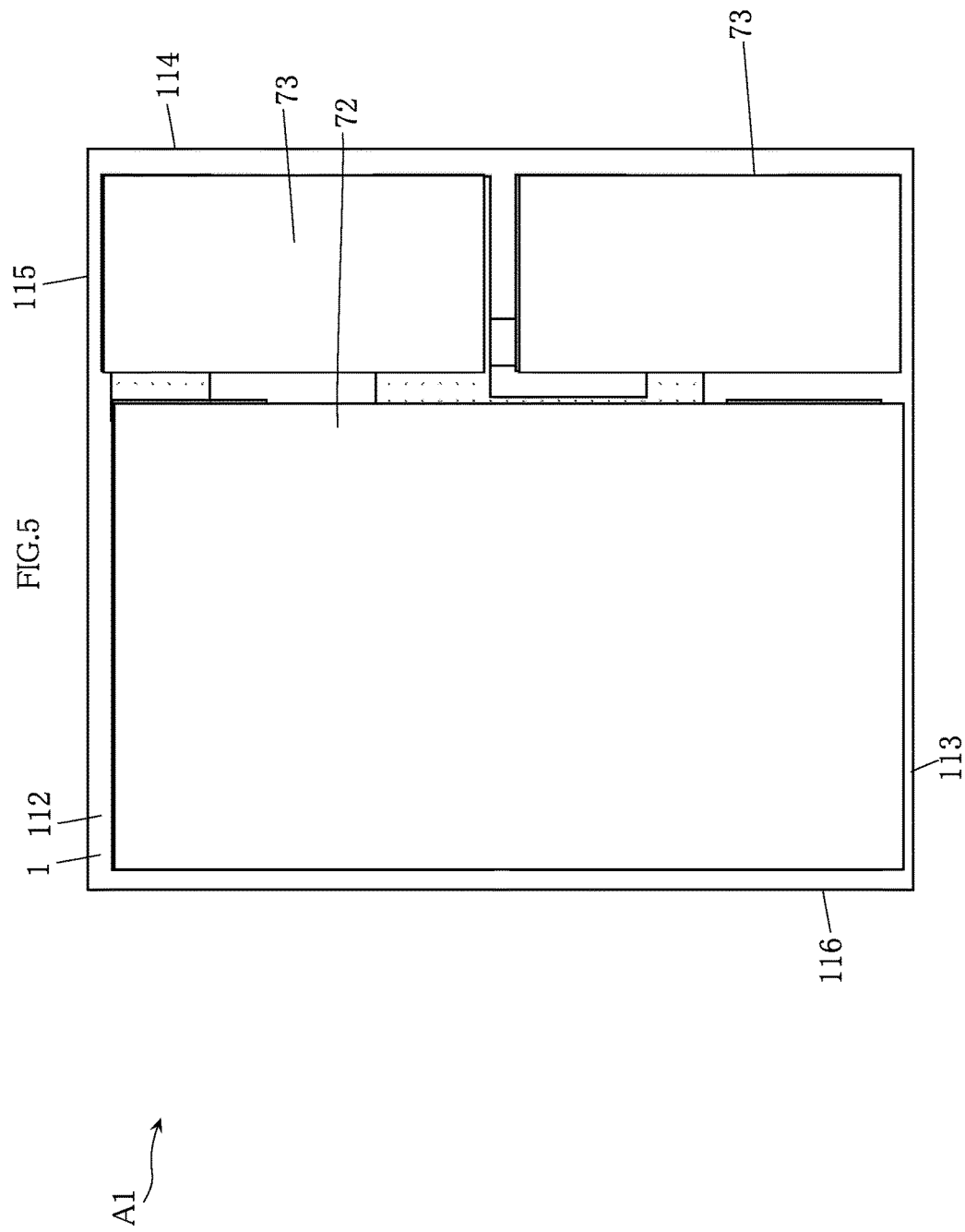
FIG. 5 is a bottom view of the electronic device according to the first embodiment of the present invention.
Figure 6:
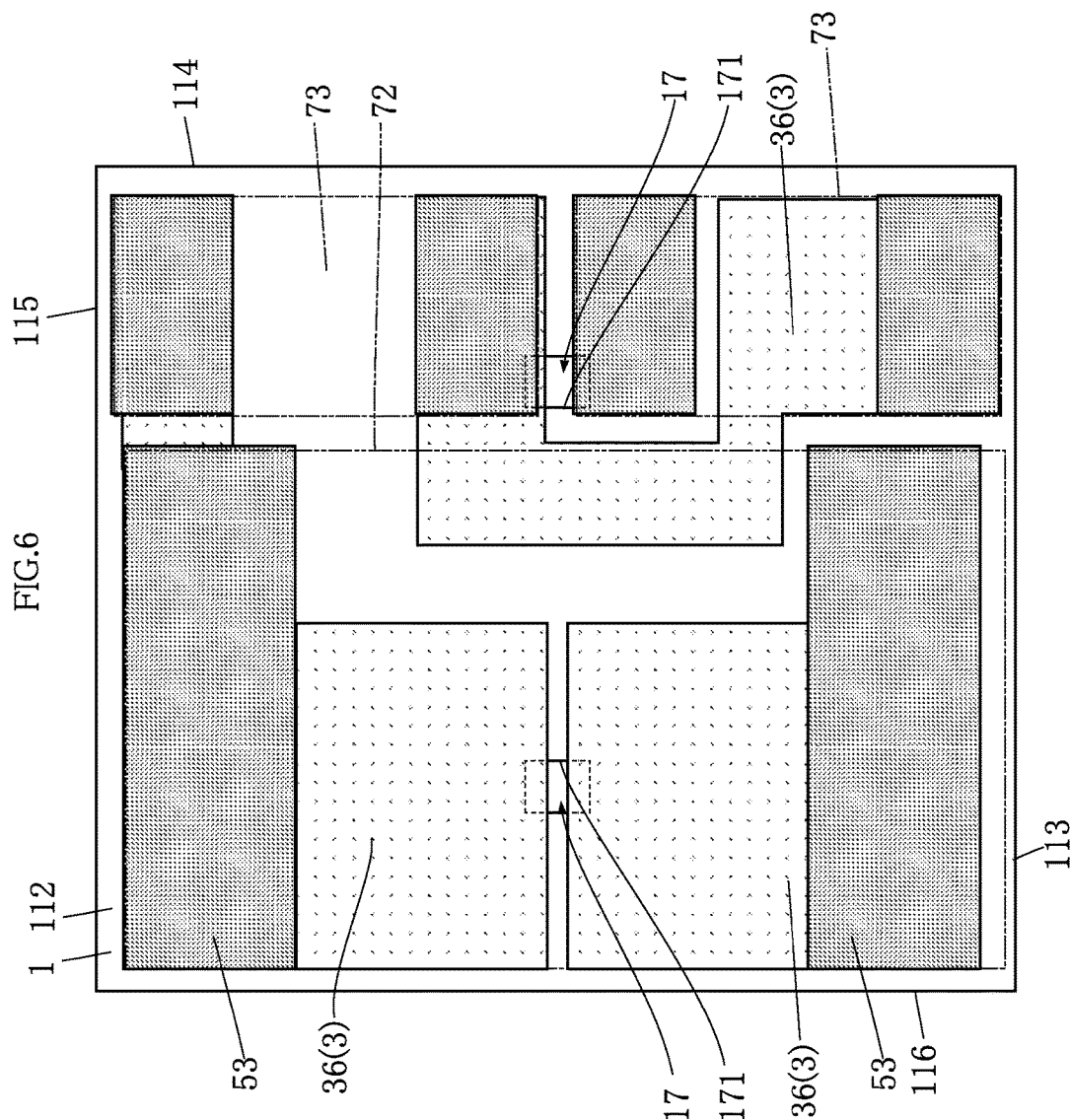
FIG. 6 is a diagram of the electronic device shown in FIG. 5 from which a second electronic element and a third electronic element have been omitted.
Figure 7:
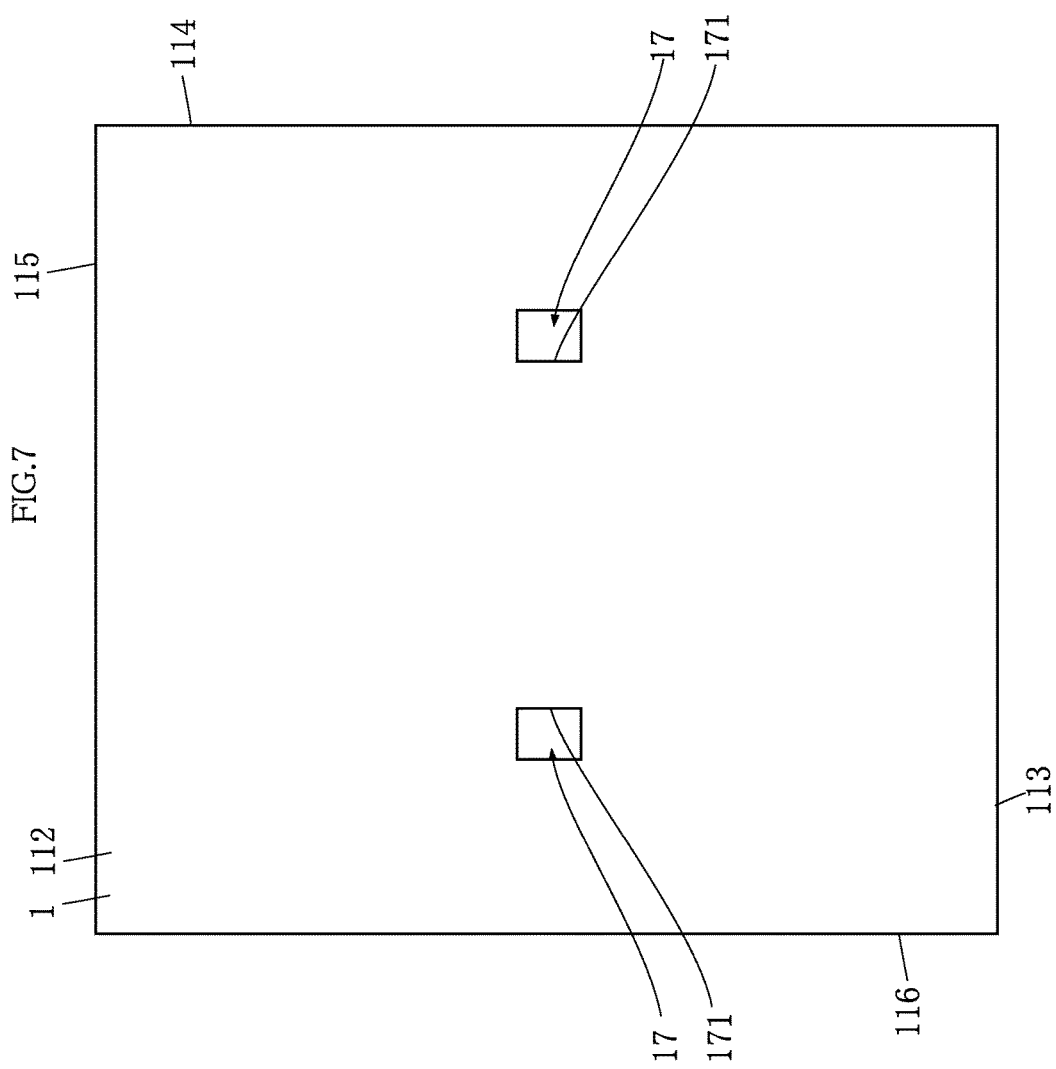
FIG. 7 is a diagram showing only a substrate of the electronic device shown in FIG. 6.

FIG. 2 is a diagram of the electronic device A1 shown in FIG. 1 from which the sealing resin part 61 has been omitted. FIG. 3 is a diagram of the electronic device A1 shown in FIG. 2 from which the first electronic element 71 has been omitted. FIG. 4 is a diagram showing only the substrate 1 of the electronic device A1 shown in FIG. 2. FIG. 5 is a bottom view of the electronic device A1 according to the first embodiment of the present invention. FIG. 6 is a diagram of the electronic device A1 shown in FIG. 5 from which the second electronic element 72 and the third electronic element 73 have been omitted. FIG. 7 is a diagram showing only the substrate 1 of the electronic device A1 shown in FIG. 6. Note that, in FIGS. 1 to 3 and FIGS. 5 and 6, the insulating layer 2, the main surface side insulating film 41 and the back surface side insulating film 42 are not illustrated.

The substrate 1 shown in FIGS. 1 to 11 is made of a single-crystal semiconductor material. In the present embodiment, the substrate 1 is made of single-crystal Si. The material of the substrate 1 is not limited to Si, and may be SiC, for example. The substrate 1 has a thickness of 200 to 550 µm, for example. The first electronic element 71, the second electronic element 72 and the third electronic element 73 are disposed on the substrate 1.

The substrate 1 has a main surface 111, a back surface 112, a first lateral surface 113, a second lateral surface 114, a third lateral surface 115, and a fourth lateral surface 116.

The main surface 111 faces in a first thickness direction Z1 which is one thickness direction Z. The main surface 111 is flat. The main surface 111 is orthogonal to the thickness direction Z. The main surface 111 is a (100) surface or a (110) surface. In the present embodiment, the main surface 111 is a (100) surface.

The back surface 112 faces in a second thickness direction Z2 which is another thickness direction Z. That is, the back surface 112 and the main surface 111 face in opposite directions to each other. The back surface 112 is flat. The back surface 112 is orthogonal to the thickness direction Z.

The first lateral surface 113, the second lateral surface 114, the third lateral surface 115 and the fourth lateral surface 116 all face in a direction that is orthogonal to the thickness direction Z of the substrate 1. The first lateral surface 113, the second lateral surface 114, the third lateral surface 115 and the fourth lateral surface 116 are all flat. The first lateral surface 113 and the second lateral surface 114, the second lateral surface 114 and the third lateral surface 115, the third lateral surface 115 and the fourth lateral surface 116, and the fourth lateral surface 116 and the first lateral surface 113 are respectively connected to each other. Also, the first lateral surface 113, the second lateral surface 114, the third lateral surface 115 and the fourth lateral surface 116 are all connected to the main surface 111 and the back surface 112.

As shown in FIGS. 2 to 4, 9 to 11 and the like, a recessed portion 14 for element disposition, a recessed portion 15 for interconnects and a through hole 17 are formed in the substrate 1.

The recessed portion 14 for element disposition is recessed from the main surface 111. The first electronic element 71 is disposed in the recessed portion 14 for element disposition. The depth (distance in the thickness direction Z by which the main surface 111 is separated from a recessed portion bottom surface 142 for element disposition discussed later) of the recessed portion 14 for element disposition is 100 to 300 µm, for example. The recessed portion 14 for element disposition has a rectangular shape as viewed in the thickness direction Z. The shape of the recessed portion 14 for element disposition is dependent on having adopted the (100) surface as the main surface 111.

As clearly shown in FIG. 4, the recessed portion 14 for element disposition has a recessed portion side surface 141 for element disposition and a recessed portion bottom surface 142 for element disposition.

The recessed portion bottom surface 142 for element disposition faces in the first thickness direction Z1 which is one thickness direction Z of the substrate 1. The first electronic element 71 is disposed on the recessed portion bottom surface 142 for element disposition. The recessed portion bottom surface 142 for element disposition is orthogonal to the thickness direction Z. The recessed portion bottom surface 142 for element disposition has two band-like surfaces 146 and a connecting surface 147. The two band-like surfaces 146 each extend in one direction as viewed in the thickness direction Z. The first electronic element 71 is disposed on the two band-like surfaces 146. The connecting surface 147 connects the two band-like surfaces 146 as viewed in the thickness direction Z. The connecting surface 147 extends in a direction that intersects the direction in which each of the two band-like surfaces 146 extend. In the present embodiment, the connecting surface 147 extends in a direction that is orthogonal to the direction in which each of the two band-like surfaces 146 extend.

The recessed portion side surface 141 for element disposition shown in FIGS. 4, 9, 10 and the like stands up from the recessed portion bottom surface 142 for element disposition. The recessed portion side surface 141 for element disposition is connected to the recessed portion bottom surface 142 for element disposition. The recessed portion side surface 141 for element disposition slopes relative to the thickness direction Z. The recessed portion side surface 141 for element disposition is at an angle of 55 degrees relative to a plane that is orthogonal to the thickness direction Z. This is due to having adopted the (100) surface as the main surface 111. The recessed portion side surface 141 for element disposition is connected to the main surface 111. The recessed portion side surface 141 for element disposition has four flat surfaces.

In the present embodiment, there are a plurality (two) of the recessed portion 15 for interconnects. The recessed portion 15 for interconnects communicates with the through hole 17. The recessed portion 15 for interconnects has a region that overlaps with the first electronic element 71 as viewed in the thickness direction Z of the substrate 1. The recessed portion 15 for interconnects entirely overlaps with the recessed portion 14 for element disposition as viewed in the thickness direction Z. The recessed portion 15 for interconnects has a depth of 250 to 350 μm, for example (coincides with the size of a later-discussed recessed portion side surface 151 for interconnects in the thickness direction Z). The shape of the recessed portion 15 for interconnects is dependent on having adopted the (100) surface as the main surface 111.

The recessed portion 15 for interconnects has a recessed portion side surface 151 for interconnects. The recessed portion side surface 151 for interconnects slopes relative to the thickness direction Z. The recessed portion side surface 151 for interconnects is at an angle of 55 degrees relative to the thickness direction Z. This is due to having adopted the (100) surface as the main surface 111. The recessed portion side surface 151 for interconnects has four flat sides. The recessed portion side surface 151 for interconnects is connected to the recessed portion side surface 141 for element disposition. The recessed portion side surface 151 for interconnects is connected to the recessed portion bottom surface 142 for element disposition.

The through hole 17 shown in FIGS. 4, 7, 11 and the like passes through a portion of the substrate 1. In the present embodiment, there are a plurality (two) of the through hole 17. A depth D13 of the through hole 17 is 10 to 50 μm, for example. A maximum opening size L11 of the through hole 17 as viewed in the thickness direction Z of the substrate 1 is 10 to 50 μm, for example. The ratio of the depth D13 of the through hole 17 to the maximum opening size L11 of the through hole 17 as viewed in the thickness direction Z of the substrate 1 is 0.2 to 5. In the present embodiment, the through hole 17 has a rectangular shape as viewed in the thickness direction Z.

The through hole 17 has a through hole inner surface 171.

The through hole inner surface 171 extends in the thickness direction Z of the substrate 1. The through hole inner surface 171 is connected to the recessed portion side surface 151 for interconnects. The through hole inner surface 171 has four flat sides. In the present embodiment, the through hole inner surface 171 is connected to the back surface 112.

The insulating layer 2 shown in FIGS. 9 to 11 and the like is interposed between the conductive layer 3 and the substrate 1. The insulating layer 2 has a thickness of about 0.1 to 1.0 μm, for example. The insulating layer 2 is made of $SiO_2$ or SiN, for example.

The insulating layer 2 has a main surface side insulating part 24, a hole inner surface insulating part 27, and a back surface side insulating part 28.

The main surface side insulating part 24 is at least partially formed on the main surface 111 of the substrate 1. In the present embodiment, the main surface side insulating part 24 is formed on the recessed portion side surface 141 for element disposition, the recessed portion bottom surface 142 for element disposition and the recessed portion side surface 151 for interconnects, in addition to being formed on the main surface 111. The main surface side insulating part 24 is formed by thermal oxidation. The main surface side insulating part 24 is made of $SiO_2$, for example.

The hole inner surface insulating part 27 is formed on the through hole inner surface 171. The hole inner surface insulating part 27 is formed by CVD (chemical vapor deposition). The hole inner surface insulating part 27 is made of SiN, for example.

The back surface side insulating part 28 is at least partially formed on the back surface 112 of the substrate 1. The back surface side insulating part 28 is formed by thermal oxidation. The back surface side insulating part 28 is made of $SiO_2$, for example.

The conductive layer 3 shown in FIGS. 9 to 11 and the like is electrically connected to the first electronic element 71, the second electronic element 72, and the third electronic element 73. The conductive layer 3 is for constituting a current path between the first electronic element 71, the second electronic element 72, and the third electronic element 73. The conductive layer 3 is formed on the main surface 111, the recessed portion side surface 141 for element disposition, the recessed portion bottom surface 142 for element disposition, the recessed portion side surface 151 for interconnects, the through hole inner surface 171, and the back surface 112. More specifically, the conductive layer 3 is formed from a region on the main surface 111 side of the through hole inner surface 171 to a region on the back surface 112 side of the through hole inner surface 171.

As shown in FIGS. 9 to 11, the conductive layer 3 includes a seed layer 31 and a plating layer 32.

The seed layer 31 is a base layer for forming a desired plating layer 32. The seed layer 31 is interposed between the substrate 1 and the plating layer 32. The seed layer 31 is made of Cu, for example. The seed layer 31 is formed by sputtering, for example. The seed layer 31 has a thickness of less than or equal to 1 μm, for example.

The plating layer 32 is formed by electrolytic plating using the seed layer 31. The plating layer 32 is made of Cu, for example. The plating layer 32 has a thickness of about 3 to 10 μm, for example. The plating layer 32 is thicker than the seed layer 31.

As shown in FIGS. 2, 3, 6, 10, 11 and the like, the conductive layer 3 includes a plurality of main surface side interconnects 35 and a plurality of back surface side interconnects 36.

The main surface side interconnects 35 and the back surface side interconnects 36 are respectively for constituting a path for electrically connecting two electrode pads (any two of the main surface electrode pad 51, the bottom surface electrode pad 52, and the back surface electrode pad 53) to each other.

The plurality of main surface side interconnects 35 are insulated from each other. In the present embodiment, a plurality (two) of the main surface side interconnects 35 are formed on one recessed portion side surface 141 for element disposition. Also, the remaining main surface side interconnects 35 are formed from the main surface 111 to the recessed portion bottom surface 142 for element disposition. As shown in FIG. 11, the main surface side interconnects 35 have a region 35C that is located closer to the center of the through hole 17 than is a portion (back surface side interconnects 36) of the conductive layer 3 formed on the through hole inner surface 171, as viewed in the direction of the depth D13 of the through hole 17 (as viewed in the thickness direction Z).

The back surface side interconnects 36 are insulated from each other. The back surface side interconnects 36 is formed on the back surface 112. As shown in FIG. 11, a given back surface side interconnect 36 is connected to one of the main surface side interconnects 35.

As shown in FIG. 10, at least a portion of the main surface side insulating film 41 is formed on the main surface 111. The conductive layer 3 is interposed between the main surface side insulating film 41 and the substrate 1. As shown in FIGS. 10 and 11, at least a portion of the back surface side insulating film 42 is formed on the back surface 112. The back surface side insulating film 42 has a region formed inside the through hole 17. The conductive layer 3 is interposed between the back surface side insulating film 42 and the substrate 1. The main surface side insulating film 41 and the back surface side insulating film 42 are made of SiN, for example. The main surface side insulating film 41 and the back surface side insulating film 42 are formed by CVD, for example.

A plurality (six) of the main surface electrode pad 51 shown in FIGS. 1 to 3, 10 and the like are formed on the main surface 111. The main surface electrode pad 51 contacts the conductive layer 3 and is electrically connected to the first electronic element 71. The main surface electrode pad 51 has a structure in which a Ni layer, a Pd layer and an Au layer are stacked in order of approximation to the substrate 1. In the present embodiment, the main surface electrode pad 51 has a rectangular shape.

A plurality (six) of the bottom surface electrode pad 52 shown in FIGS. 3, 10 and the like are formed on the recessed portion bottom surface 142 for element disposition. The bottom surface electrode pad 52 is electrically connected to the first electronic element 71, and is interposed between the first electronic element 71 and the conductive layer 3. The bottom surface electrode pad 52 contacts the conductive layer 3. The bottom surface electrode pad 52 has a structure in which a Ni layer, a Pd layer and an Au layer are stacked in order of approximation to the substrate 1. In the present embodiment, the bottom surface electrode pad 52 has a rectangular shape.

A plurality (six) of the back surface electrode pad 53 shown in FIGS. 6, 9 and 10 are formed on the back surface 112. The back surface electrode pad 53 contacts the conductive layer 3 and is electrically connected to the first electronic element 71. The back surface electrode pad 53 has a structure in which a Ni layer, a Pd layer and an Au layer are stacked in order of approximation to the substrate 1. In the present embodiment, the back surface electrode pad 53 has a rectangular shape.

The sealing resin part 61 shown in FIGS. 9 to 11 and the like fills the recessed portion 14 for element disposition and covers the first electronic element 71. The sealing resin part 61 leaves the main surface electrode pad 51 exposed. On the other hand, the sealing resin part 61 does not cover the second electronic element 72 and the third electronic element 73. Exemplary materials of the sealing resin part 61 include epoxy resin, phenol resin, polyimide resin, polybenzoxazole (PBO) resin, and silicone resin. The sealing resin part 61 may be either a translucent resin or an opaque resin, but in the present embodiment is preferably an opaque resin.

In the present embodiment, the first electronic element 71 is an integrated circuit element, and is, specifically, an ASIC (application-specific integrated circuit) element. The size of the first electronic element 71 in the thickness direction Z is 80 to 100 μm, for example.

The second electronic element 72 and the third electronic element 73 are disposed on the back surface 112 of the substrate 1. In the present embodiment, the second electronic element 72 is an inductor and the third electronic element 73 is a capacitor. The second electronic element 72 and the third electronic element 73 are electrically connected to the first electronic element 71. Specifically, the second electronic element 72 and the third electronic element 73 are electrically connected to the first electronic element 71 via the main surface side interconnects 35 and the back surface side interconnects 36. The size of the second electronic element 72 and the third electronic element 73 in the thickness direction Z is 400 to 600 μm, for example. Note that, alternatively to the present embodiment, the second electronic element 72 and the third electronic element 73 may be resistors or semiconductor modules.

The conductive junction 63 shown in FIG. 10 is interposed between the first electronic element 71 and the bottom surface electrode pad 52, between the second electronic element 72 and the back surface electrode pad 53, and between the third electronic element 73 and the back surface electrode pad 53. The conductive junction 63 electrically connects the first electronic element 71 and the bottom surface electrode pad 52, the second electronic element 72 and the back surface electrode pad 53, and the third electronic element 73 and the back surface electrode pad 53 to each other.

Next, a method for making the electronic device A1 will be described below, with reference to FIGS. 12 to 41.

Figure 12:
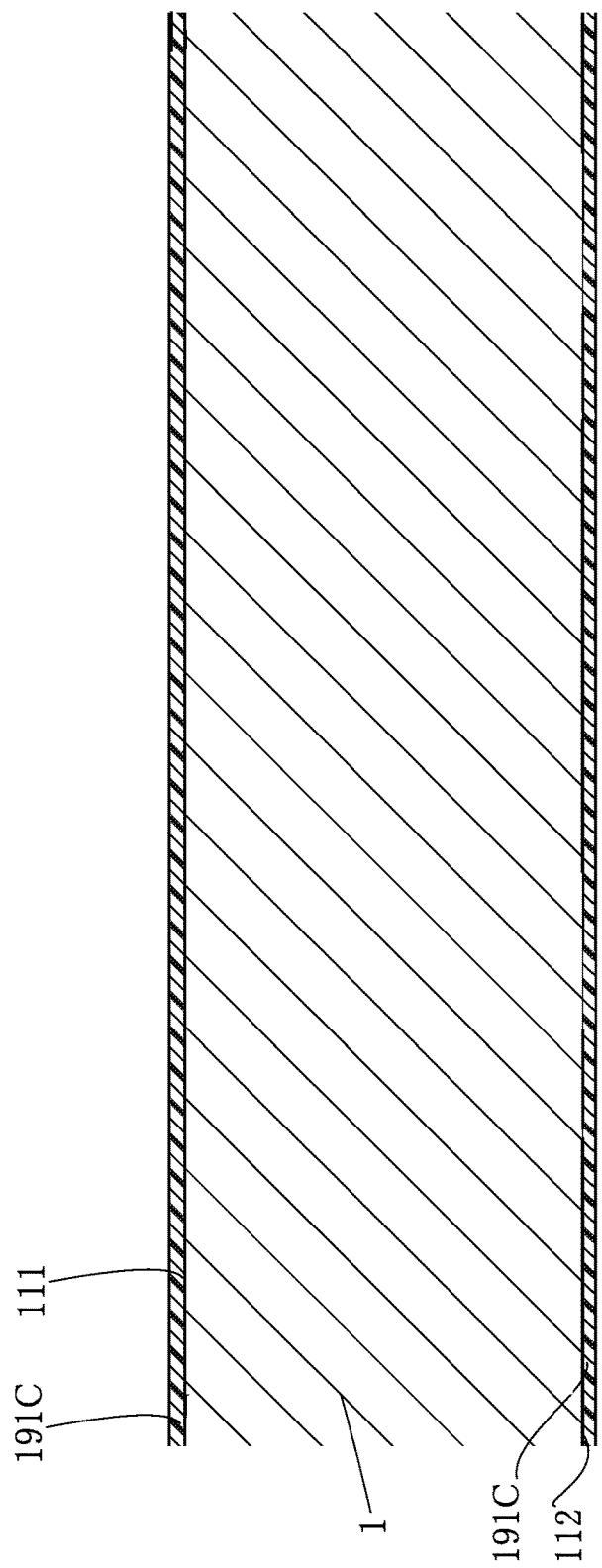
FIG. 12 is a cross-sectional view showing one process of a method for making the electronic device shown in FIG. 1.

First, the substrate 1 is prepared as shown in FIG. 12. The substrate 1 is made of a single-crystal semiconductor material, and in the present embodiment is made of single-crystal Si. The substrate 1 has a thickness of about 200 to 550 μm, for example. The substrate 1 is of a size that enables a plurality of substrates 1 of the abovementioned electronic device A1 to be obtained. That is, the following manufacturing process is premised on batch manufacturing a plurality of electronic devices A1. Although a method for making one electronic device A1 is possible, a technique for batch manufacturing a plurality of electronic devices A1 is more realistic when industrial efficiency is taken into consideration. Note that all substrates will be given as substrate 1, although the substrate 1 shown in FIG. 12 is not strictly the same as the substrate 1 of the electronic device A1.

The substrate 1 has a main surface 111 and a back surface 112 that face in opposite directions to each other. In the present embodiment, a surface having a crystal orientation of (100), that is, a (100) surface, is adopted as the main surface 111.

Next, a mask layer 191C made of $SiO_2$ is formed by oxidizing, for example, the main surface 111 and the back surface 112. The mask layer 191C has a thickness of about 0.7 to 1.0 μm, for example.

Figure 13:
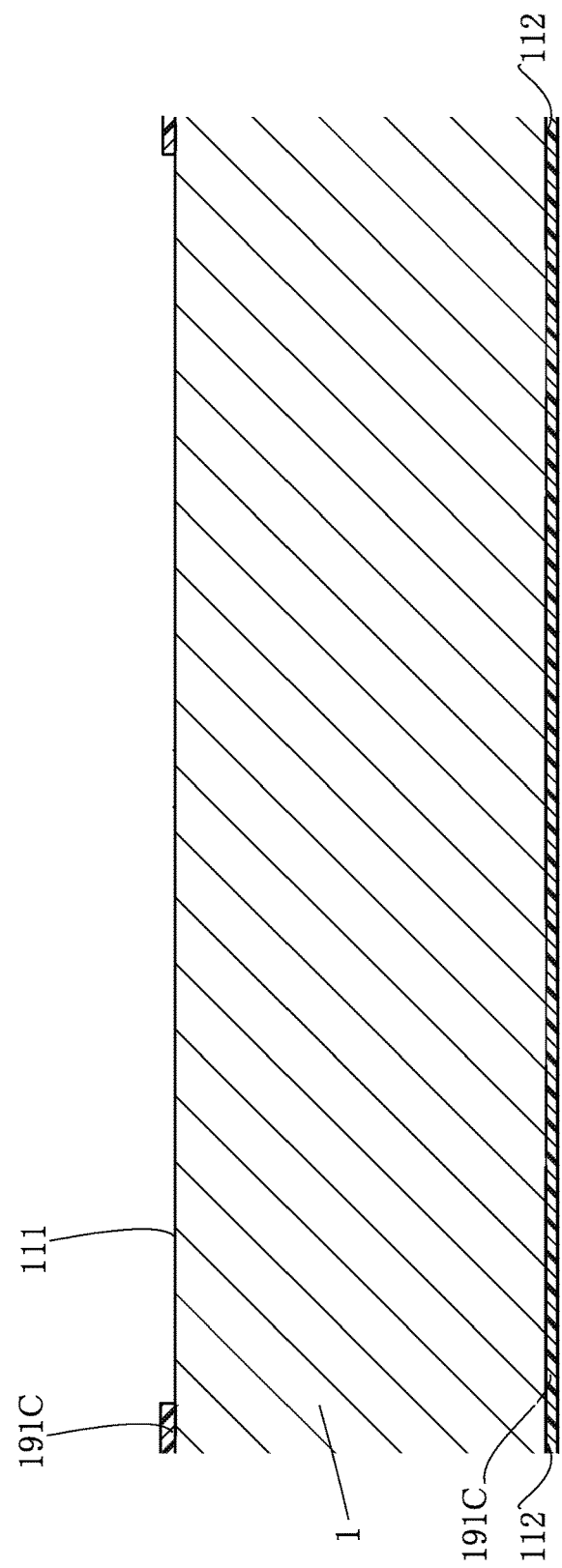
FIG. 13 is a diagram showing one process following on from FIG. 12.

Next, as shown in FIG. 13, patterning is performed by etching, for example, on the main surface 111 side of the mask layer 191C. An opening having a rectangular shape, for example, is thereby formed in the mask layer 191C. The shape and size of this opening are set according to the shape and size of the recessed portion 14 for element disposition that is to ultimately be obtained.

Figure 14:
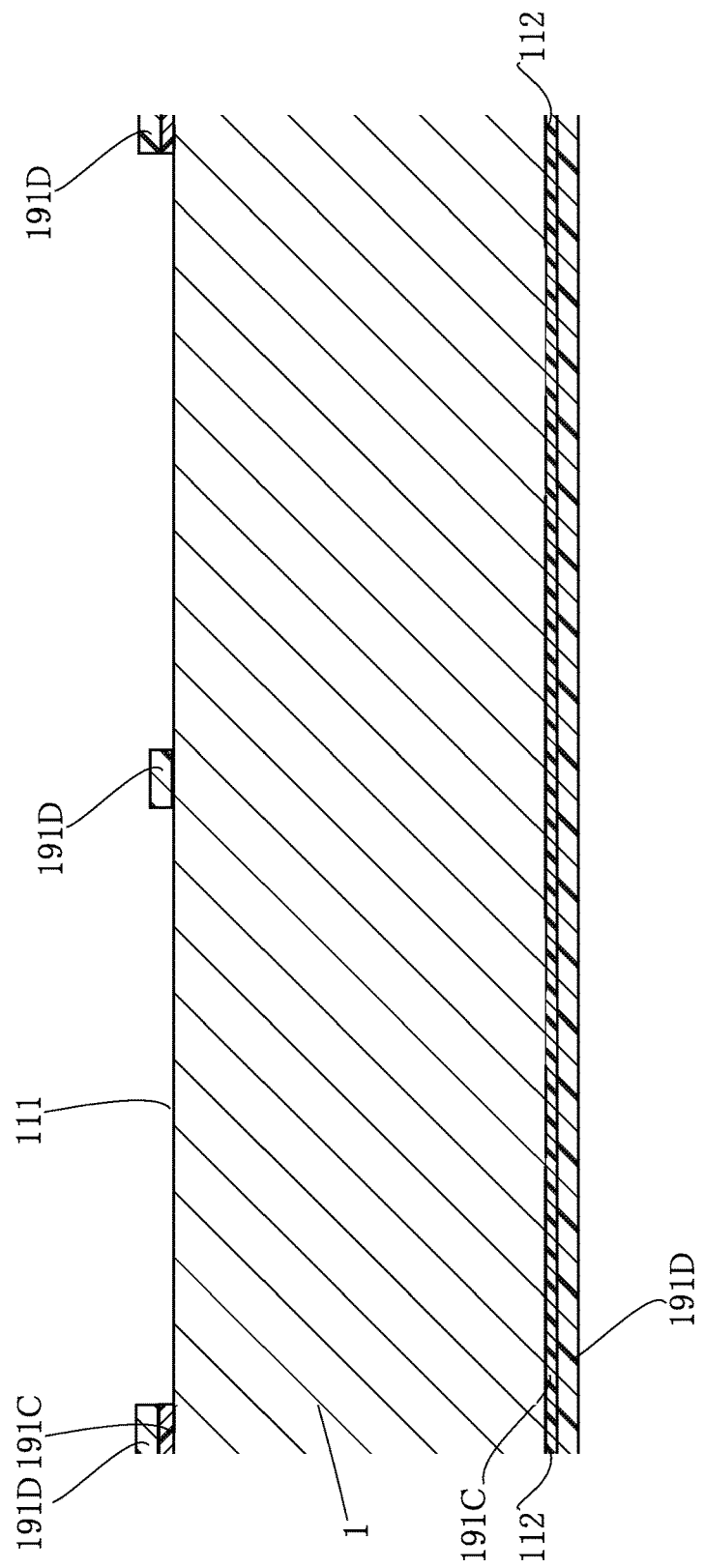
FIG. 14 is a diagram showing one process following on from FIG. 13.

Next, as shown in FIG. 14, a mask layer 191D made of SiN is formed on the main surface 111 and the back surface 112 by CVD, for example. Patterning is performed by etching, for example, on the main surface 111 side of the mask layer 191D. Two rectangular openings are thereby formed in the main surface 111 side of the mask layer 191D. The shape and size of these openings are set according to the shape and size of the recessed portion 15 for interconnects that is to ultimately be obtained.

Figure 15:
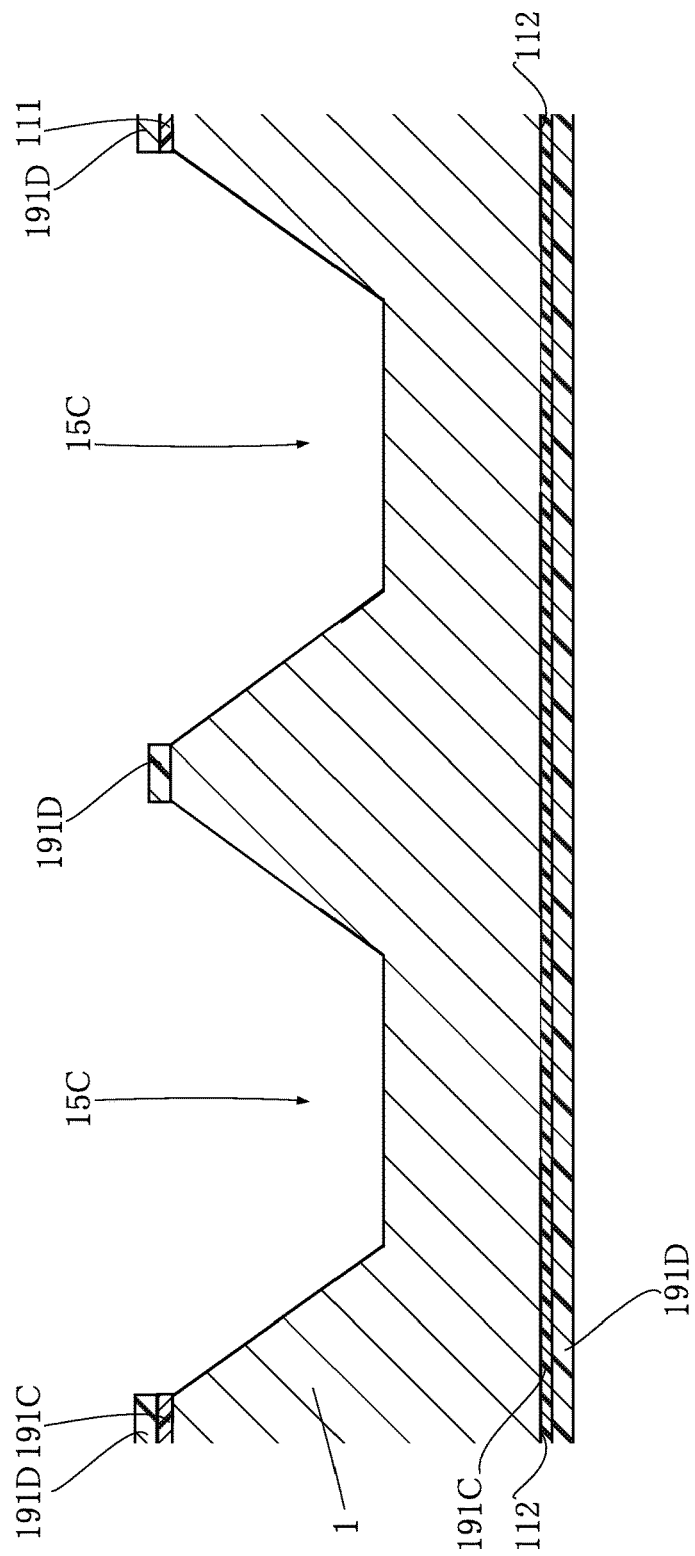
FIG. 15 is a diagram showing one process following on from FIG. 14.

Next, as shown in FIG. 15, two recessed portions 15C are formed. The two recessed portions 15C are formed by anisotropic etching using KOH, for example. KOH is an example of an alkali etching solution that can realize favorable anisotropic etching on single-crystal Si.

Figure 16:
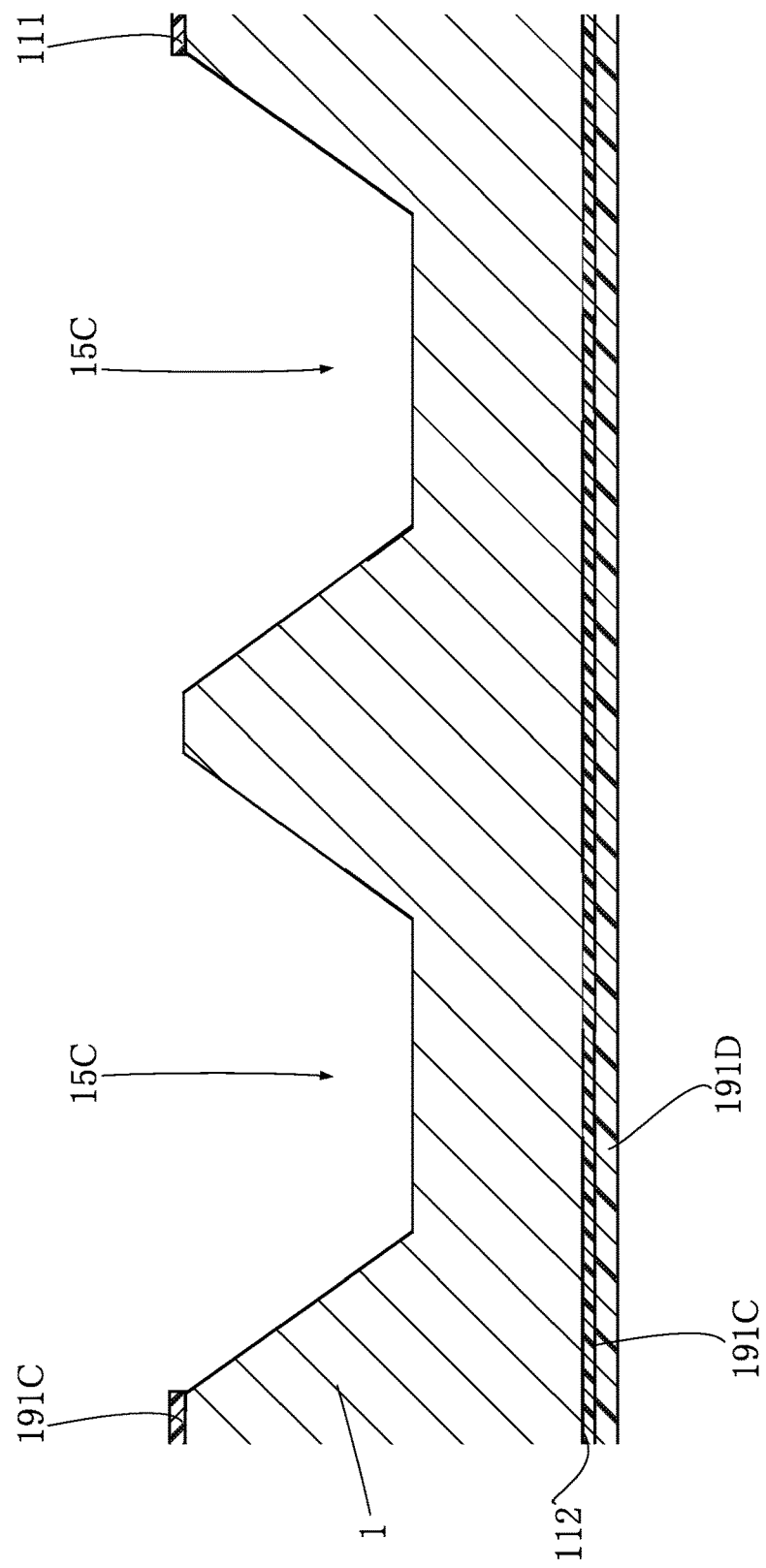
FIG. 16 is a diagram showing one process following on from FIG. 15.

Next, as shown in FIG. 16, the mask layer 191D that is formed on the main surface 111 is removed by etching.

Figure 17:
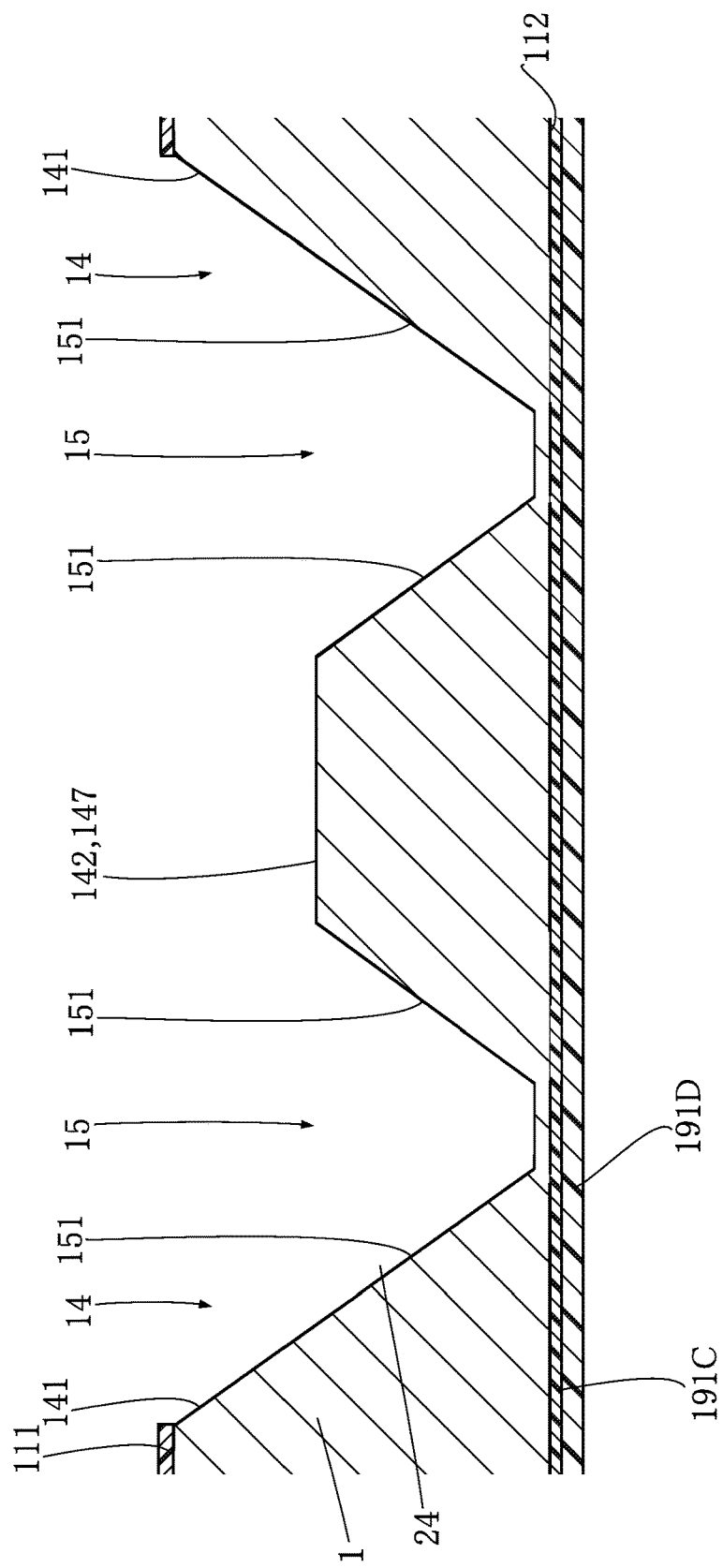
FIG. 17 is a diagram showing one process following on from FIG. 16.

Next, as shown in FIG. 17, anisotropic etching using KOH is performed. Two recessed portions 15 for interconnects and two recessed portions 14 for element disposition are thereby formed. As a result of the anisotropic etching, the recessed portion side surface 141 for element disposition and the recessed portion side surface 151 for interconnects is at an angle of about 55 degrees to a plane that is orthogonal to the thickness direction Z, as mentioned above. Note that, as shown in FIG. 17, the recessed portions 15 for interconnects do not pass through the substrate 1. This is in order to prevent metal particles from adhering to a mounting table during formation of a seed layer 31C shown with reference to FIG. 21 by sputtering.

Figure 18:
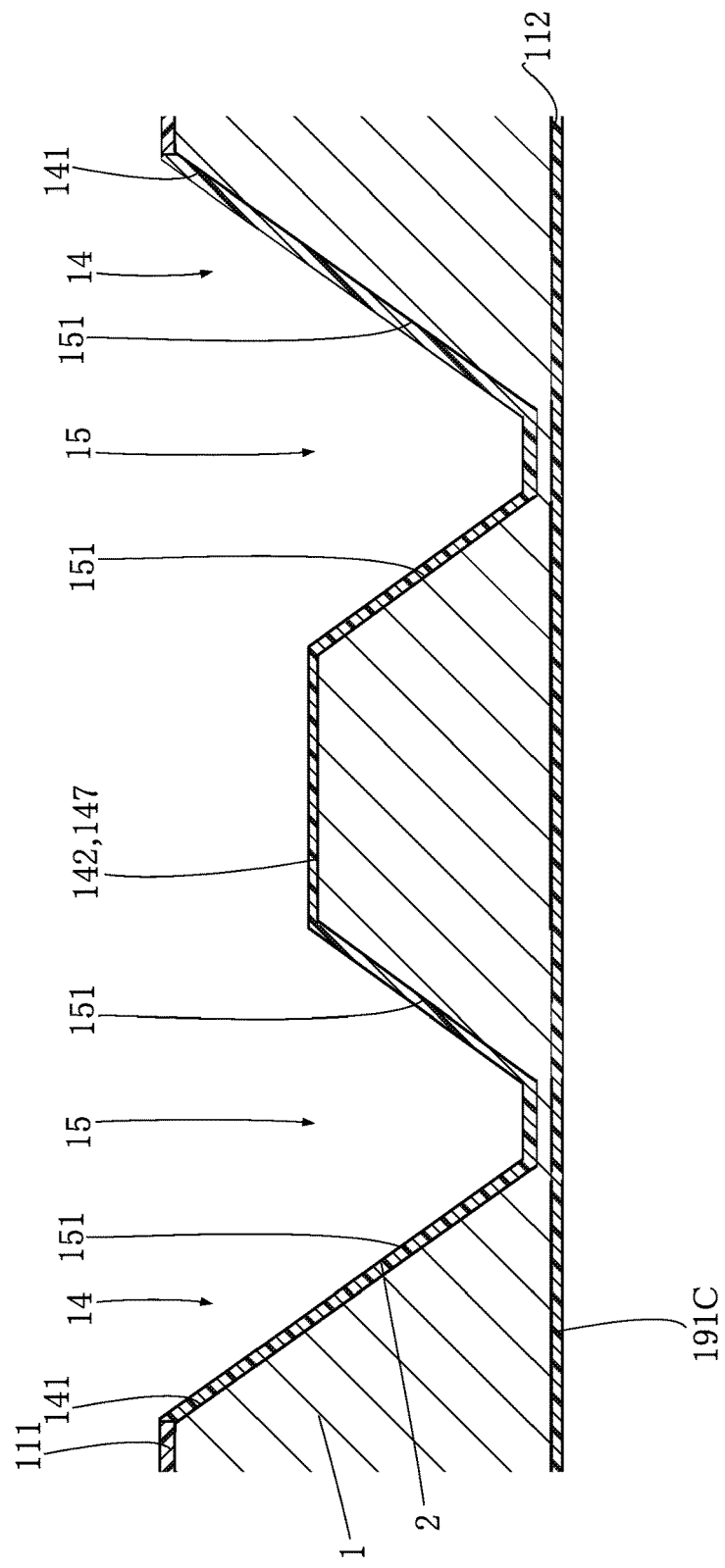
FIG. 18 is a diagram showing one process following on from FIG. 17.
Figure 19:
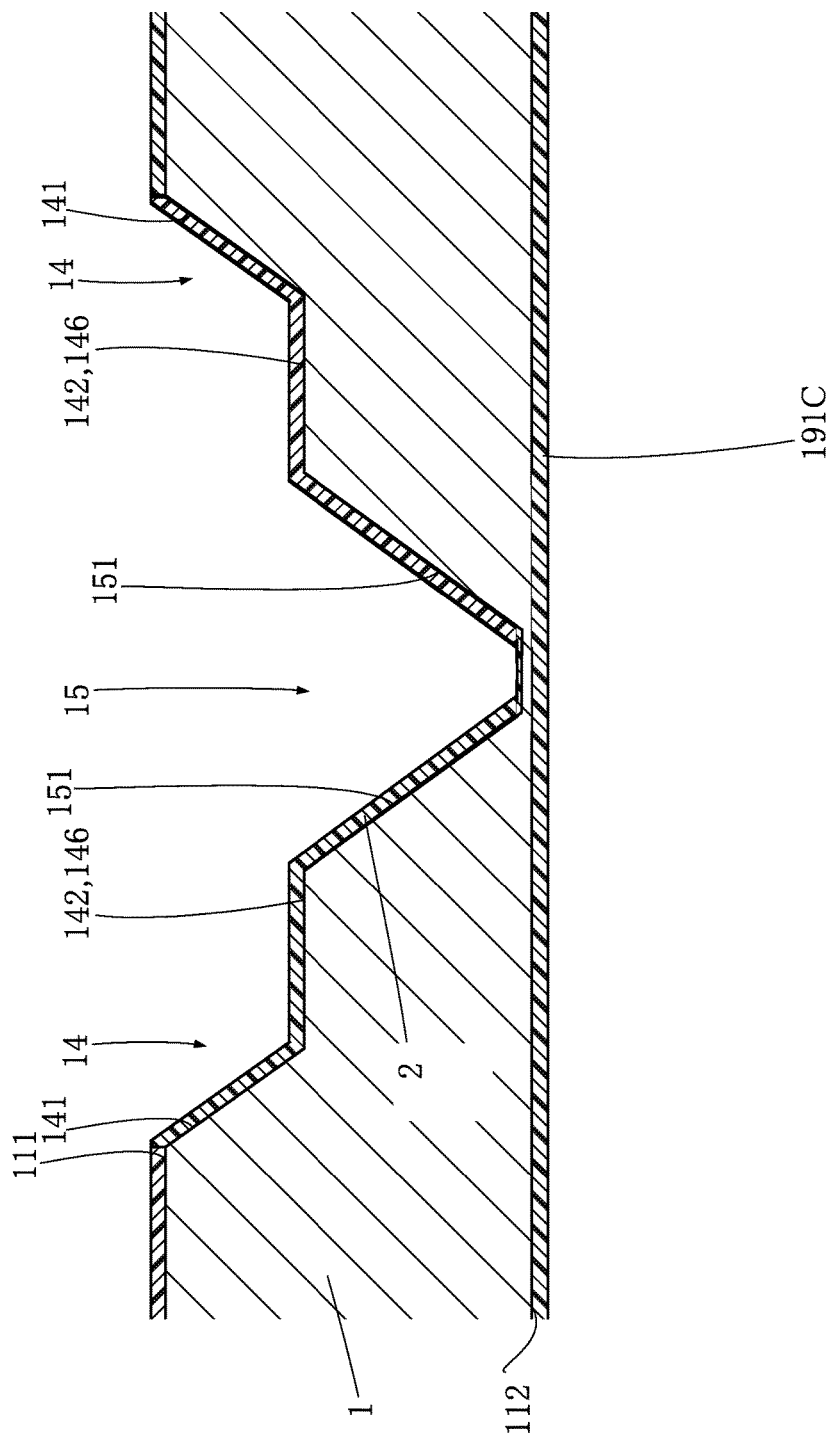
FIG. 19 is a cross-sectional view showing a cross-section corresponding to FIG. 10 at the time of performing the process shown in FIG. 18.
Figure 20:
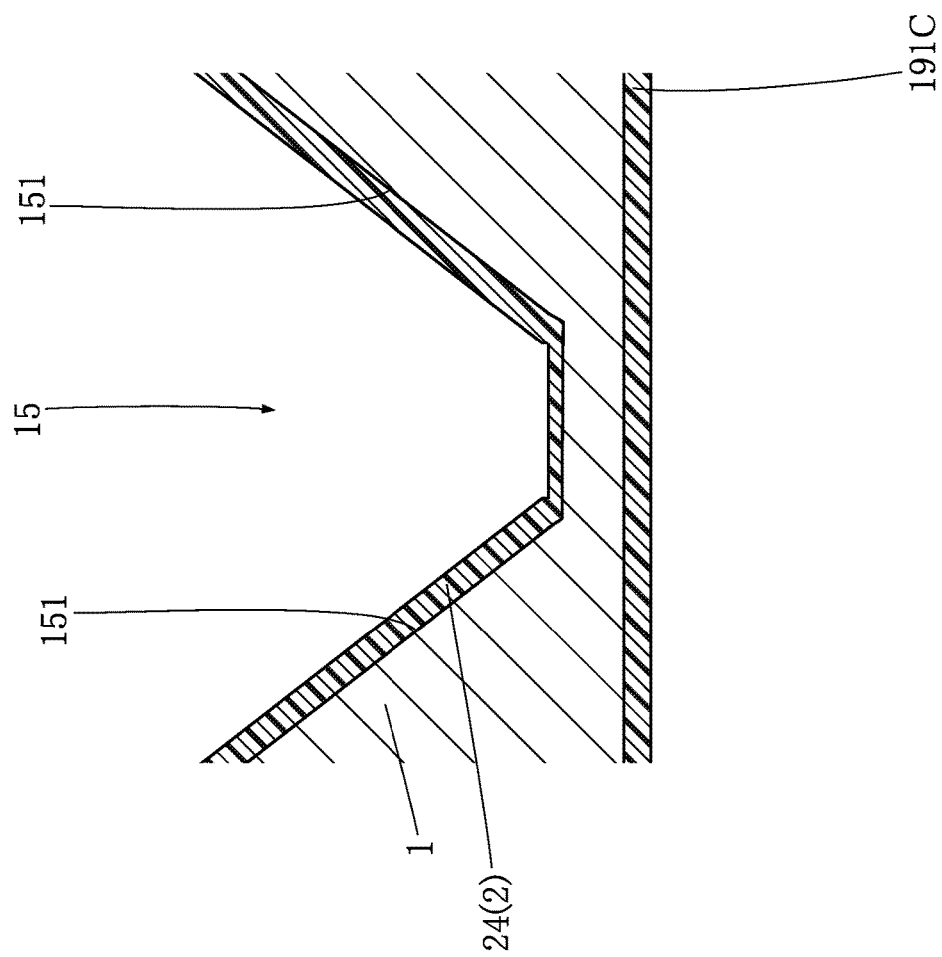
FIG. 20 is a partially enlarged view of FIG. 19.

Next, as shown in FIGS. 18 to 20, the mask layer 191D is removed by etching.

Next, as shown in FIGS. 18 to 20, an insulating layer 2 is formed on the recessed portion side surface 141 for element disposition, the recessed portion bottom surface 142 for element disposition, and the recessed portion side surface 151 for interconnects by thermally oxidizing these surfaces. The insulating layer 2 formed on the recessed portion bottom surface 142 for element disposition and the recessed portion side surface 151 for interconnects forms the abovementioned main surface side insulating part 24. Note that since the substrate 1 is oxidized in the vicinity of the recessed portion side surface 141 for element disposition, the recessed portion side surface 141 for element disposition shown in FIGS. 18 to 20 and the recessed portion side surface 141 for element disposition shown in FIG. 17 are not strictly the same, but description of the specification and drawings will be given using the same reference numerals.

Figure 21:
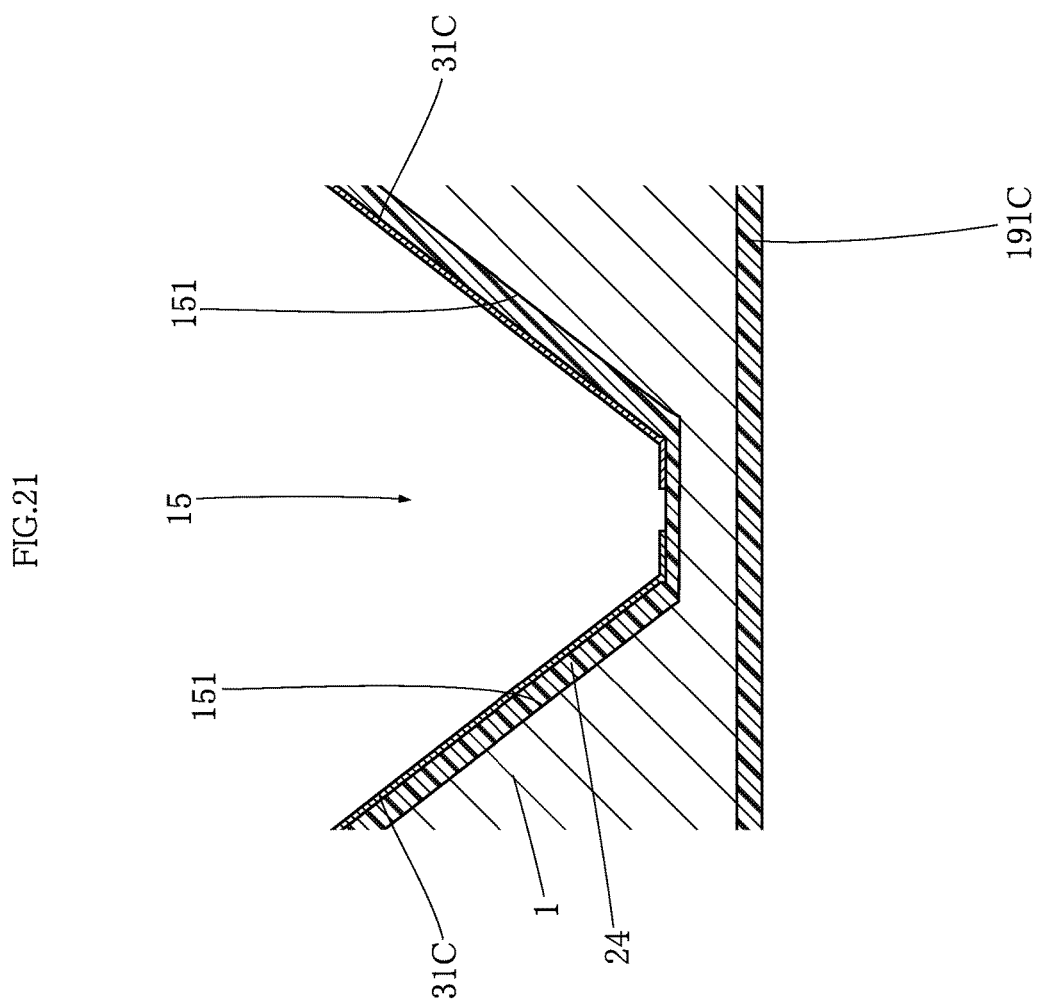
FIG. 21 is a diagram showing one process following on from FIG. 20.

Next, as shown in FIG. 21, the seed layer 31C is formed. The seed layer 31C is formed by patterning after performing sputtering, for example. The seed layer 31C is formed on the main surface 111, the recessed portion side surface 141 for element disposition, the recessed portion bottom surface 142 for element disposition, and the recessed portion side surface 151 for interconnects.

Figure 22:
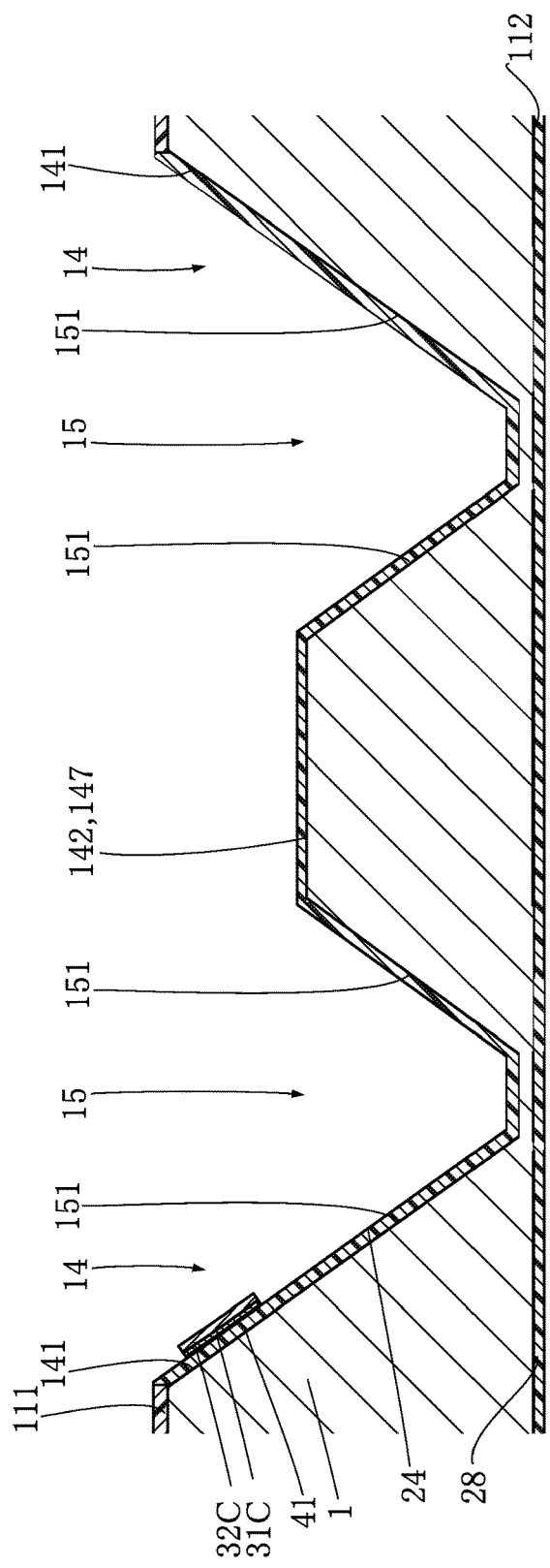
FIG. 22 is a diagram showing one process following on from FIG. 21.
Figure 23:
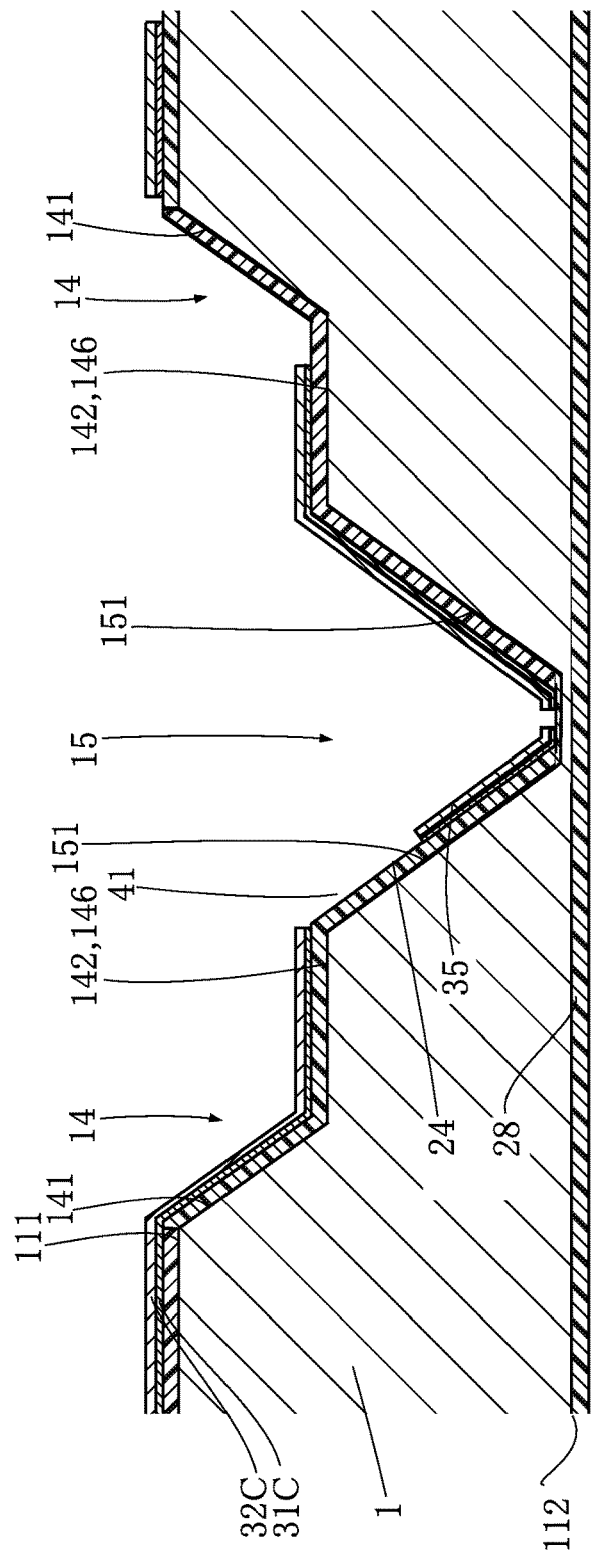
FIG. 23 is a cross-sectional view showing a cross-section corresponding to FIG. 10 at the time of performing the process shown in FIG. 22.
Figure 24:
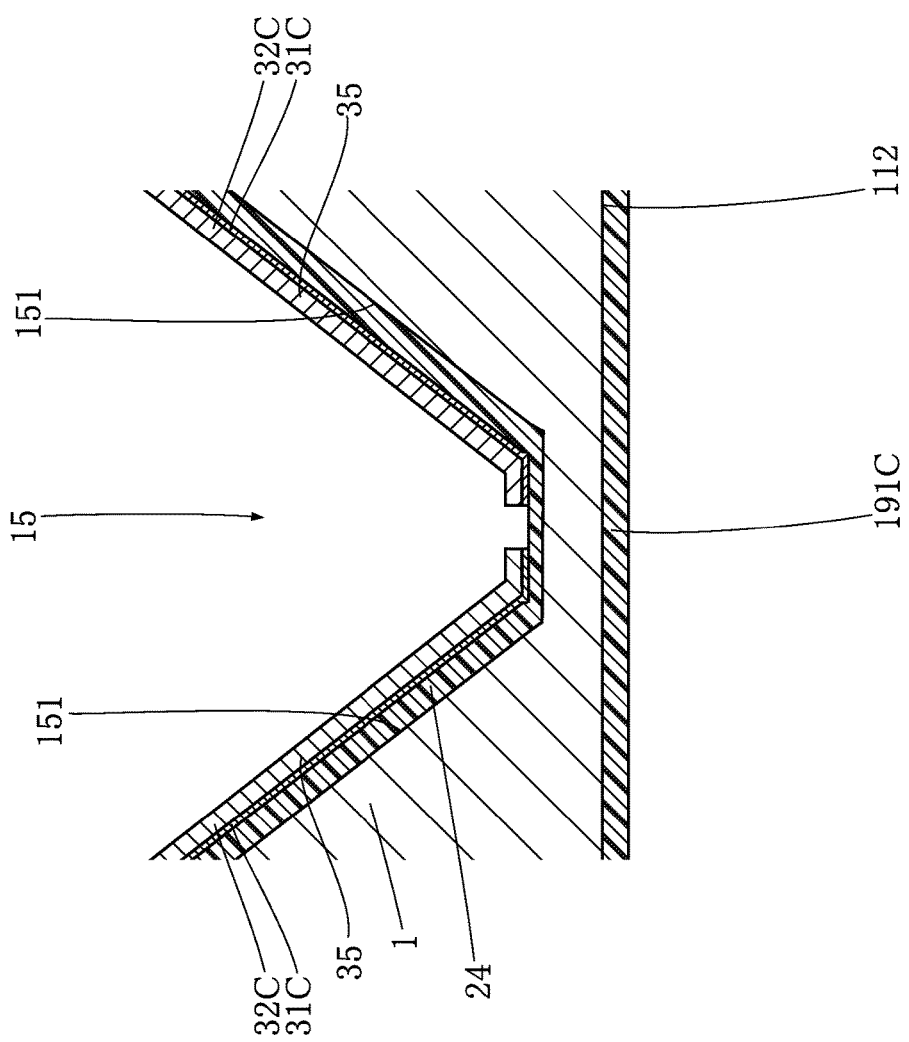
FIG. 24 is a partially enlarged view of FIG. 23.

Next, as shown in FIGS. 22 to 24, a plating layer 32C is formed. The plating layer 32C is formed by electrolytic plating using the seed layer 31C, for example. As a result, a plating layer 32C made of Cu, for example, is obtained. Main surface side interconnects 35 are thereby formed.

Figure 25:
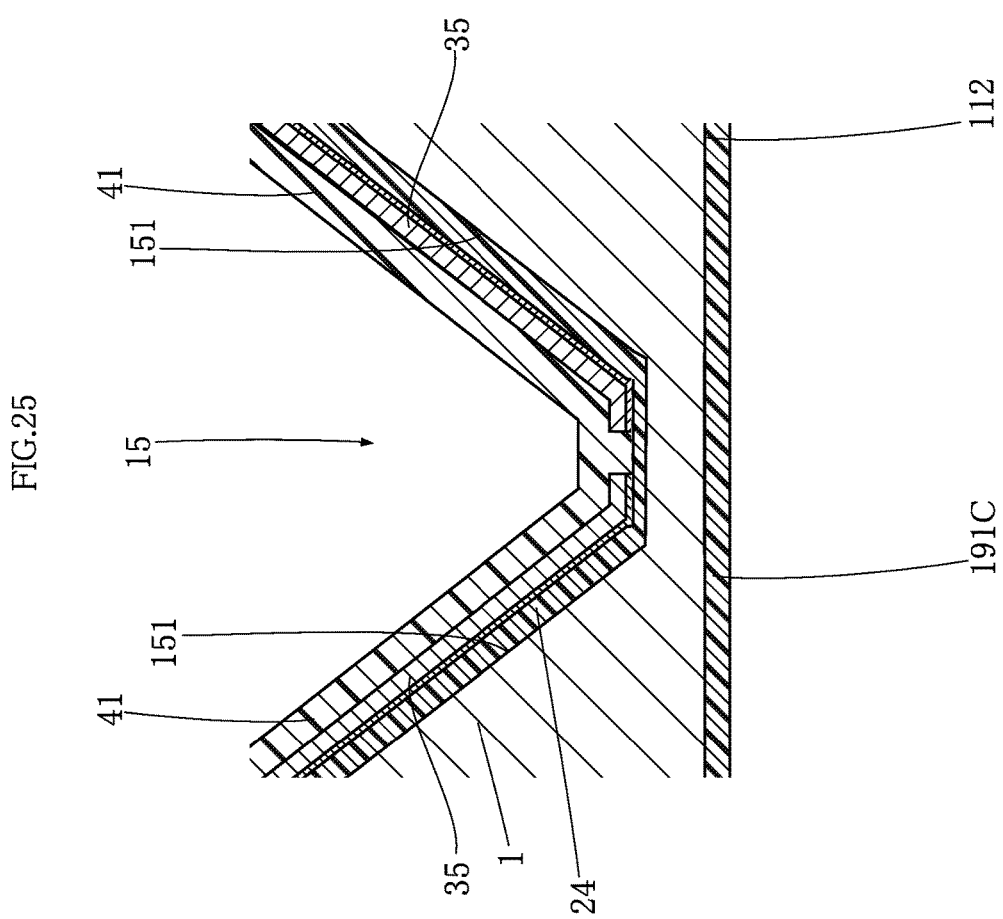
FIG. 25 is a diagram showing one process following on from FIG. 24.

Next, as shown in FIG. 25, a main surface side insulating film 41 is formed on the main surface side interconnects 35. The main surface side insulating film 41 is formed by patterning after performing CVD.

Figure 26:
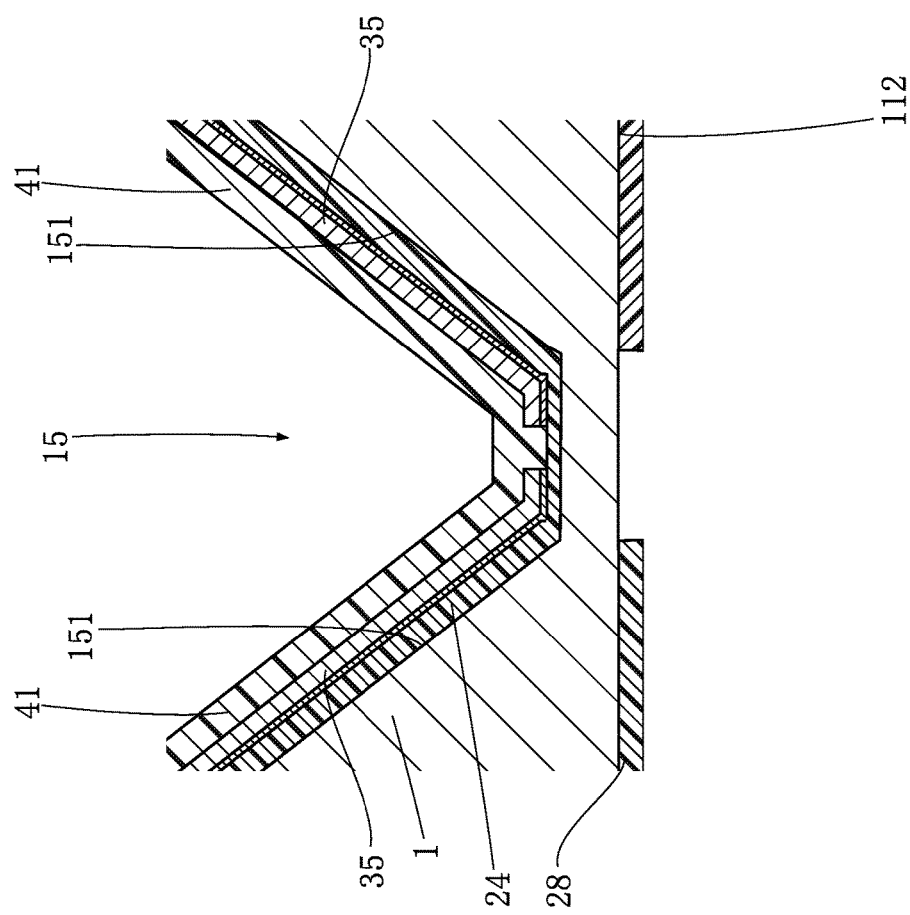
FIG. 26 is a diagram showing one process following on from FIG. 25.

Next, as shown in FIG. 26, the portion of the mask layer 191C formed on the back surface 112 is removed by etching. The back surface side insulating part 28 is thereby formed.

Figure 27:
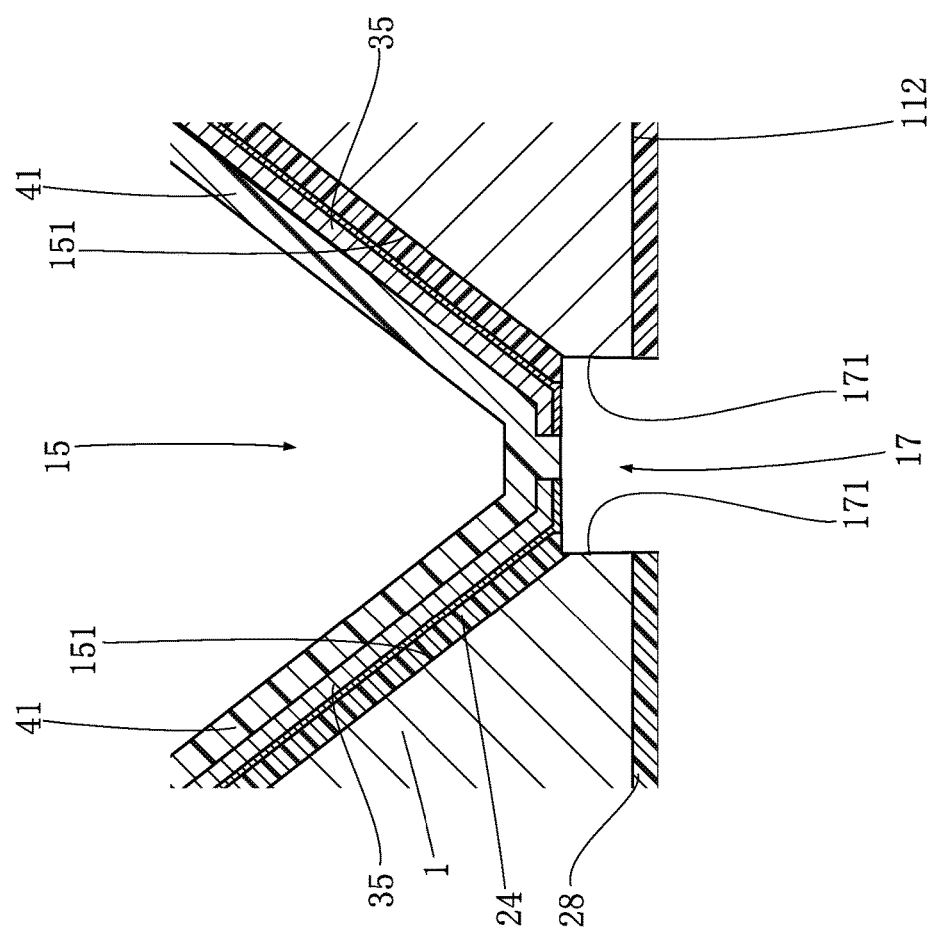
FIG. 27 is a diagram showing one process following on from FIG. 26.

Next, as shown in FIG. 27, a through hole 17 communicates with the recessed portion 15 for interconnects is formed by etching.

Figure 28:
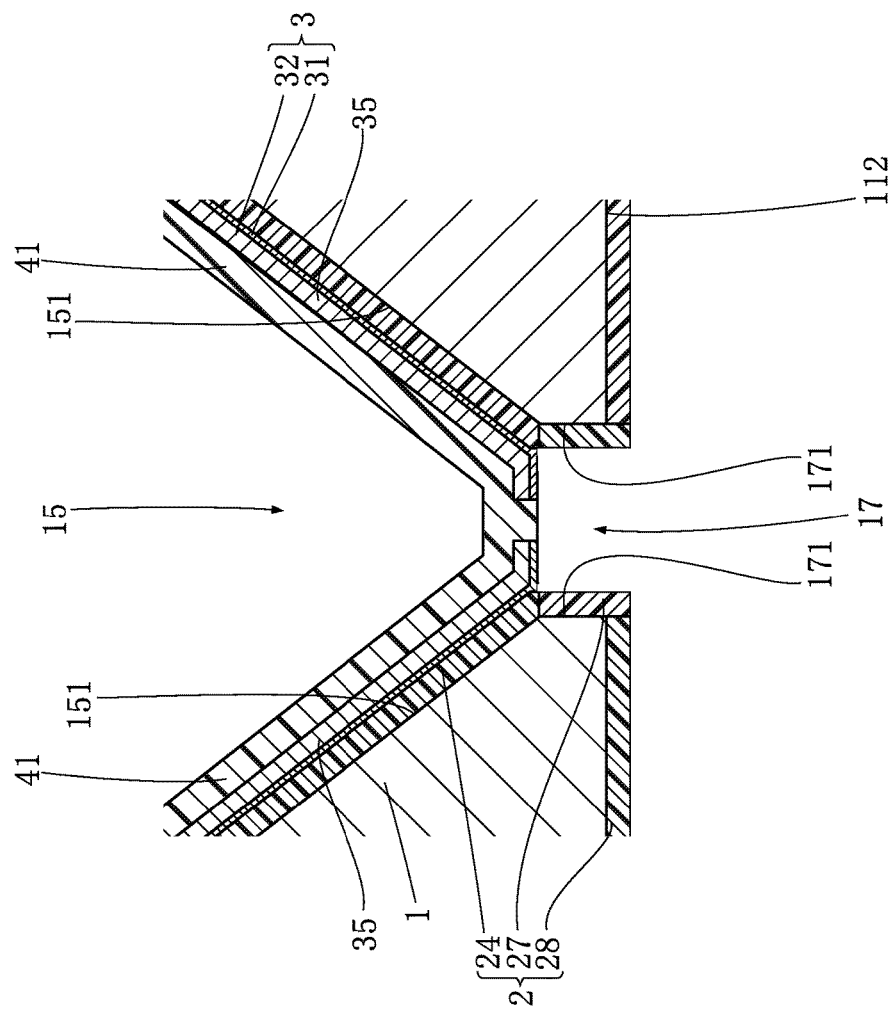
FIG. 28 is a diagram showing one process following on from FIG. 27.

Next, as shown in FIG. 28, a hole inner surface insulating part 27 is formed on a through hole inner surface 171 of the through hole 17. The hole inner surface insulating part 27 is formed performing sputtering on the through hole inner surface 171, the main surface side interconnects 35 and the back surface 112, and then performing patterning to remove the portion formed on the main surface side interconnects 35 and the back surface 112.

Figure 29:
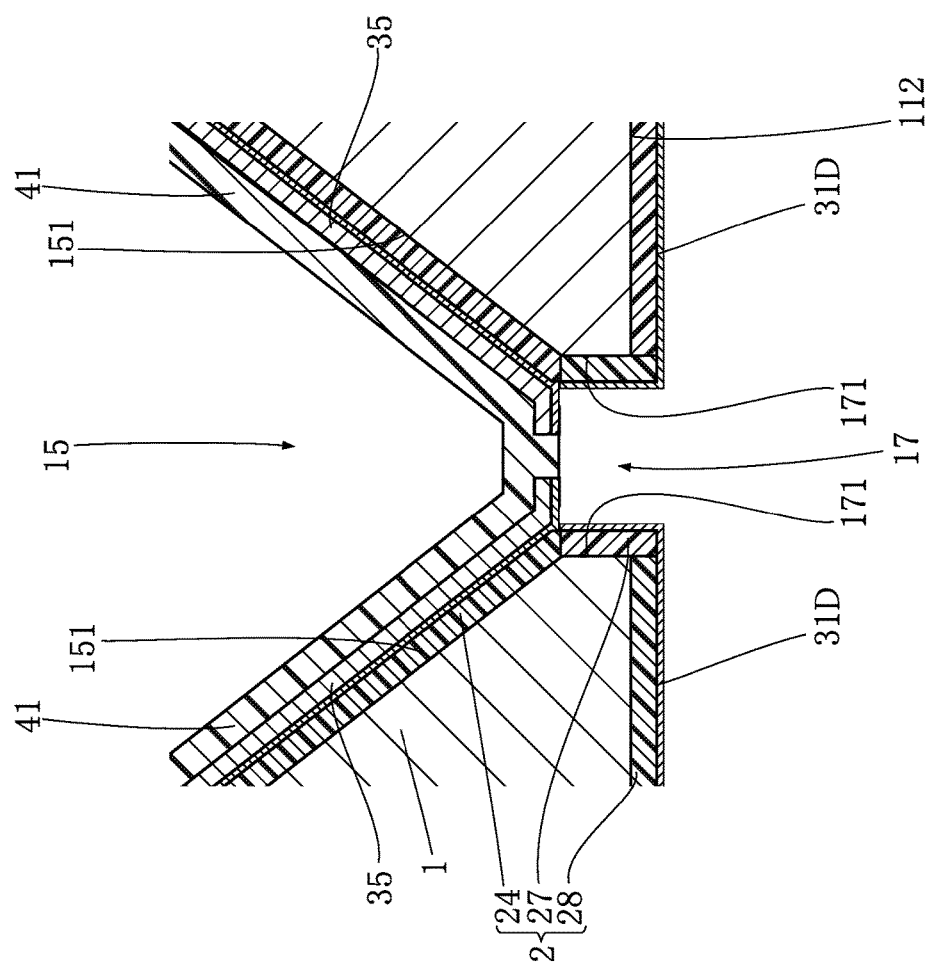
FIG. 29 is a diagram showing one process following on from FIG. 28.

Next, as shown in FIG. 29, a seed layer 31D is formed. The seed layer 31D is formed by patterning after performing sputtering, for example. The seed layer 31D is formed on the insulating layer 2 (hole inner surface insulating part 27 and back surface insulating part 28) formed on the through hole inner surface 171 and the back surface 112.

Figure 30:
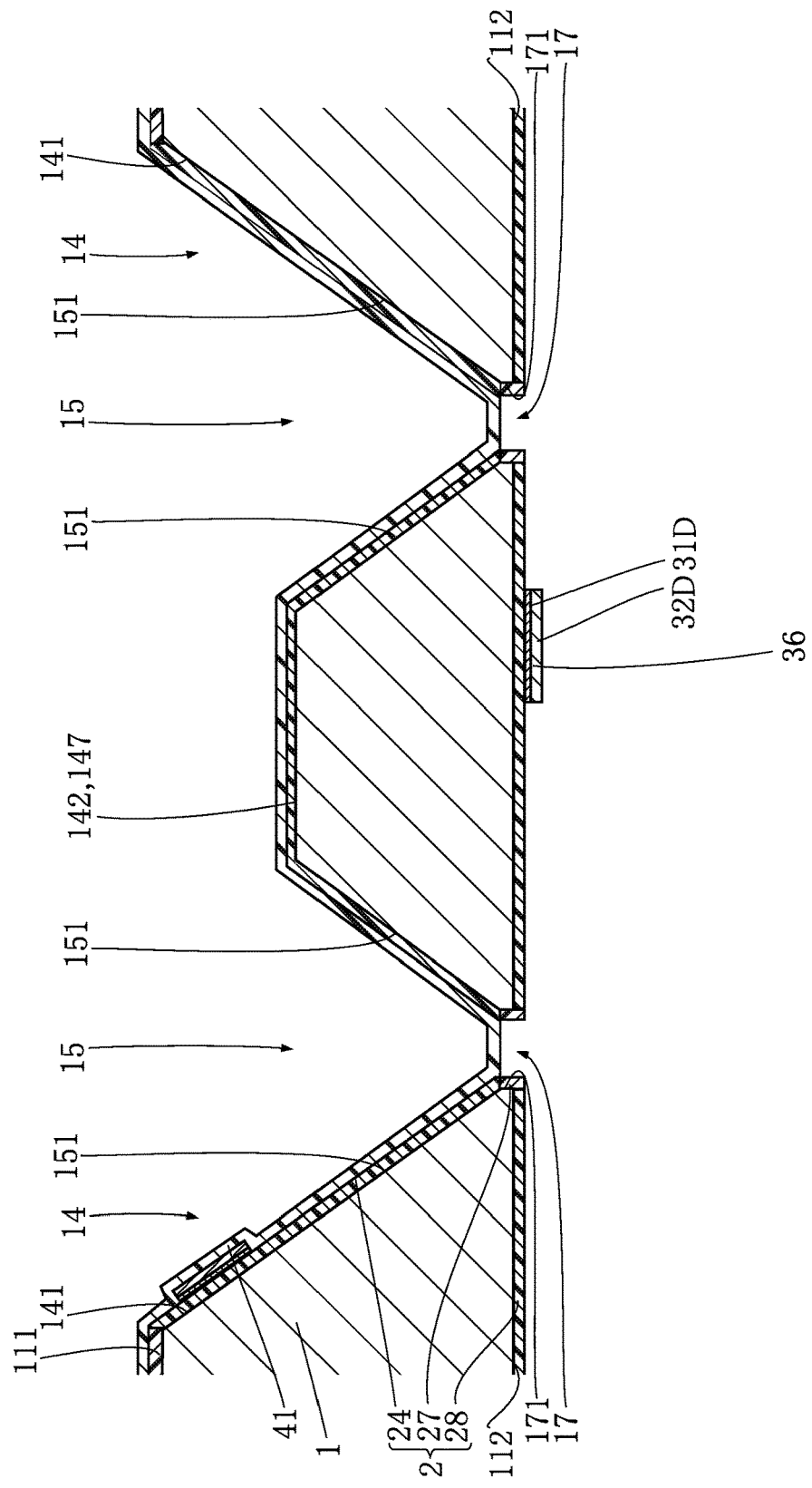
FIG. 30 is a diagram showing one process following on from FIG. 29.
Figure 31:
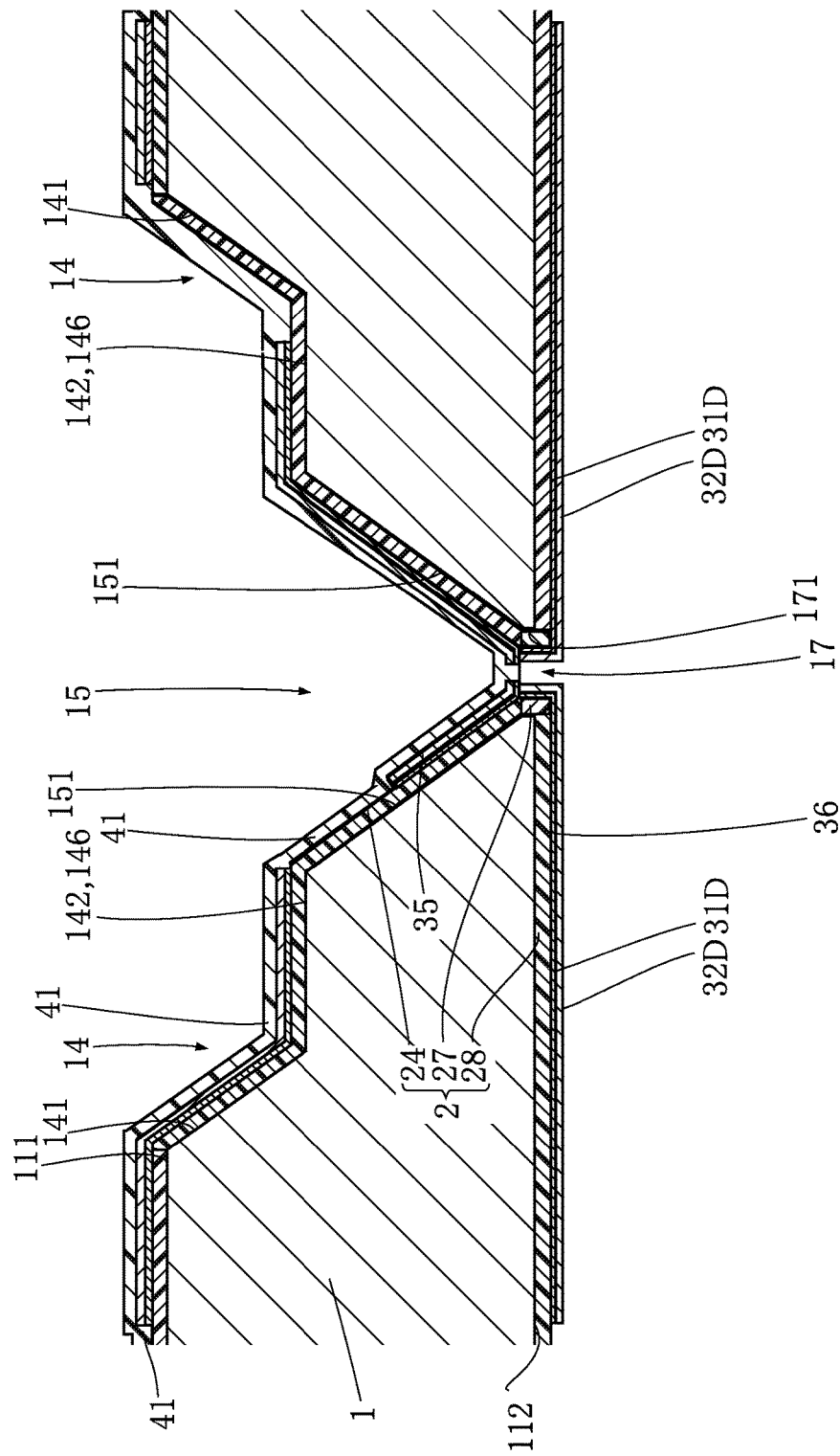
FIG. 31 is a cross-sectional view showing a cross-section corresponding to FIG. 10 in the case where the process shown in FIG. 30 has been performed.
Figure 32:
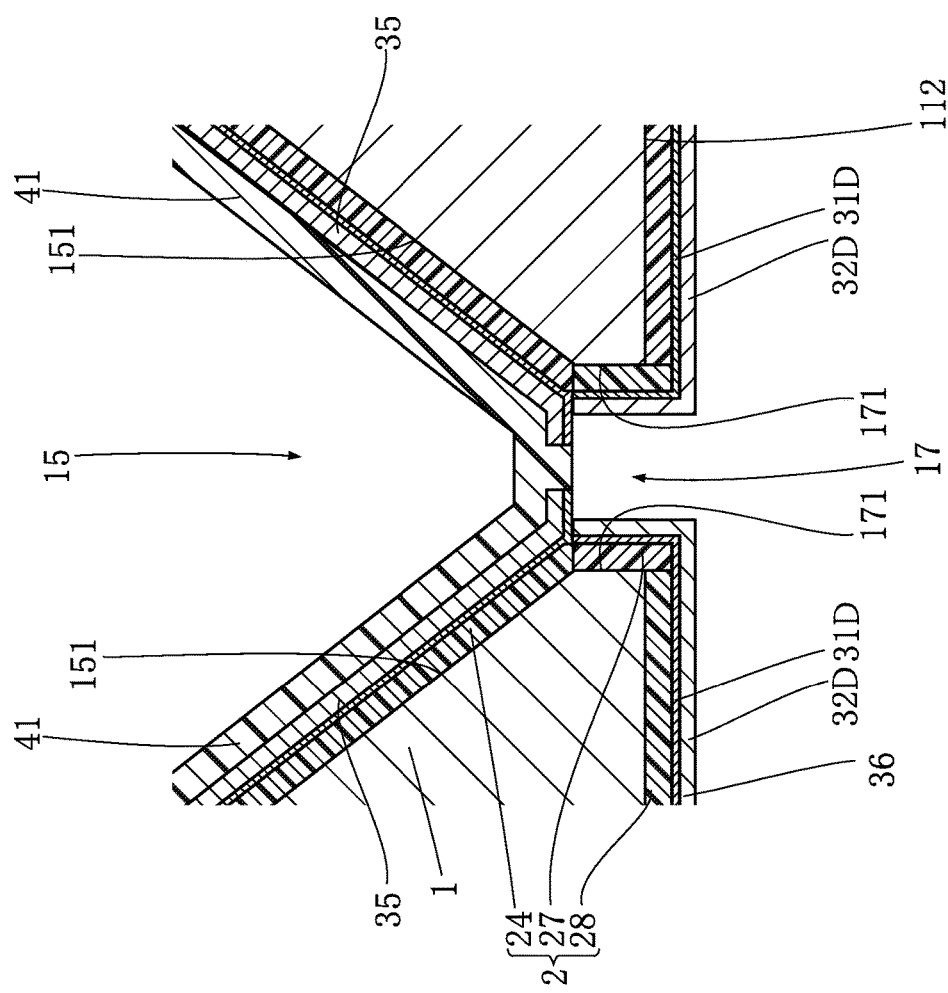
FIG. 32 is a partially enlarged view of FIG. 31.

Next, as shown in FIGS. 30 to 32, a plating layer 32D is formed. The plating layer 32D is formed by electrolytic plating using the seed layer 31D, for example. As a result, a plating layer 32D made of Cu, for example, is obtained. Back surface side interconnects 36 are thereby formed.

Figure 33:
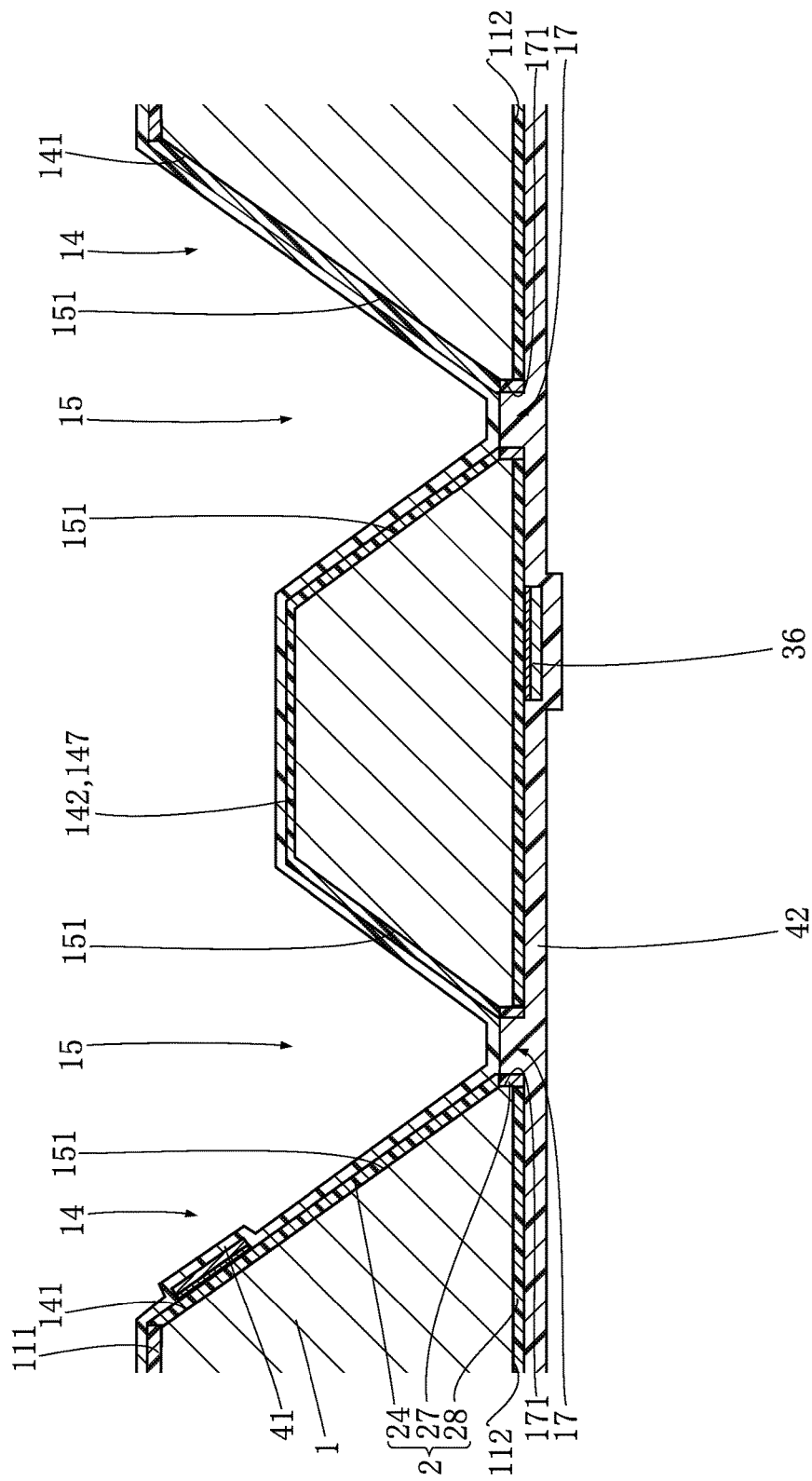
FIG. 33 is a diagram showing one process following on from FIGS. 30 to 32.
Figure 34:
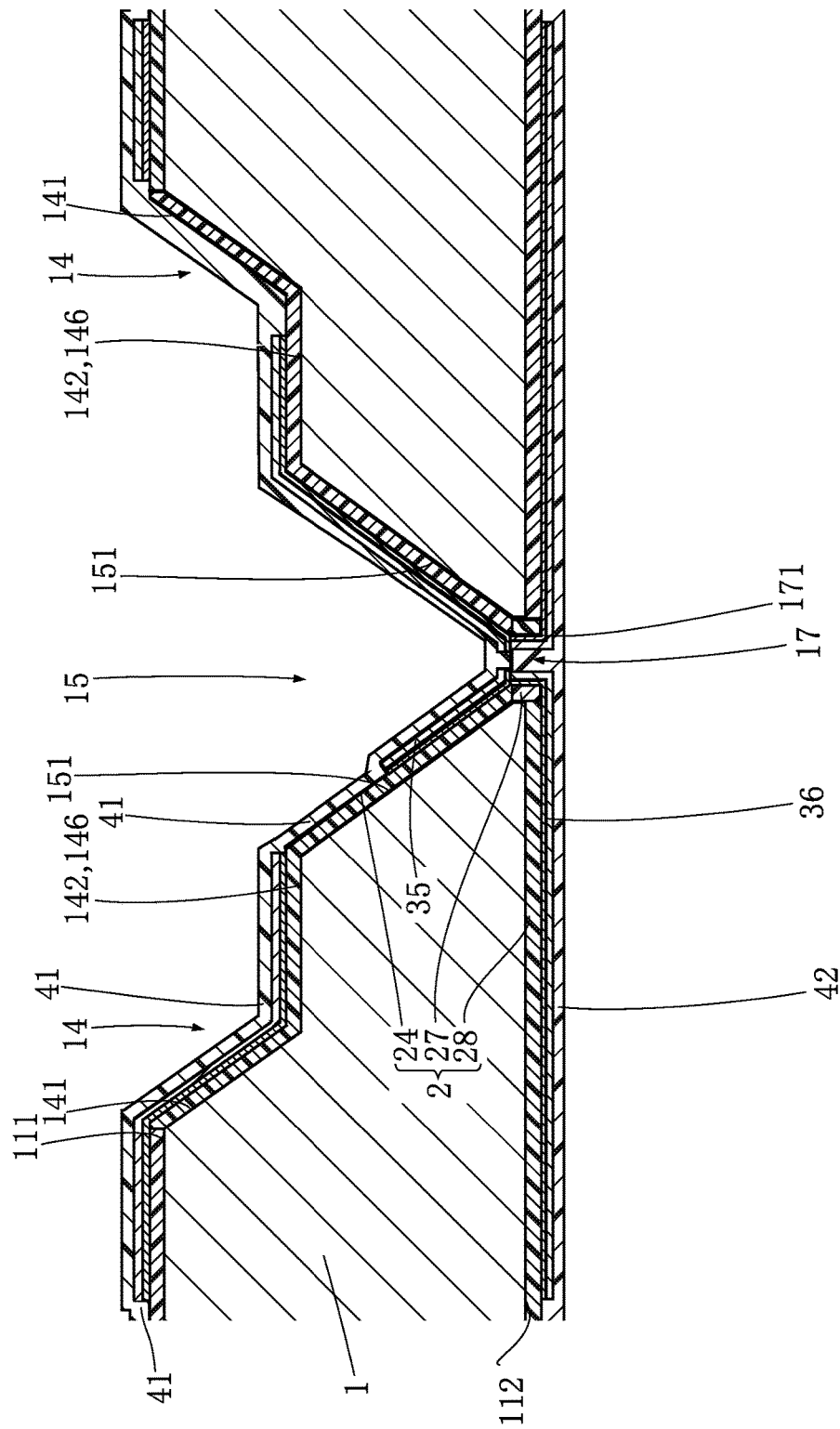
FIG. 34 is a cross-sectional view showing a cross-section corresponding to FIG. 10 in the case where the process shown in FIG. 33 has been performed.
Figure 35:
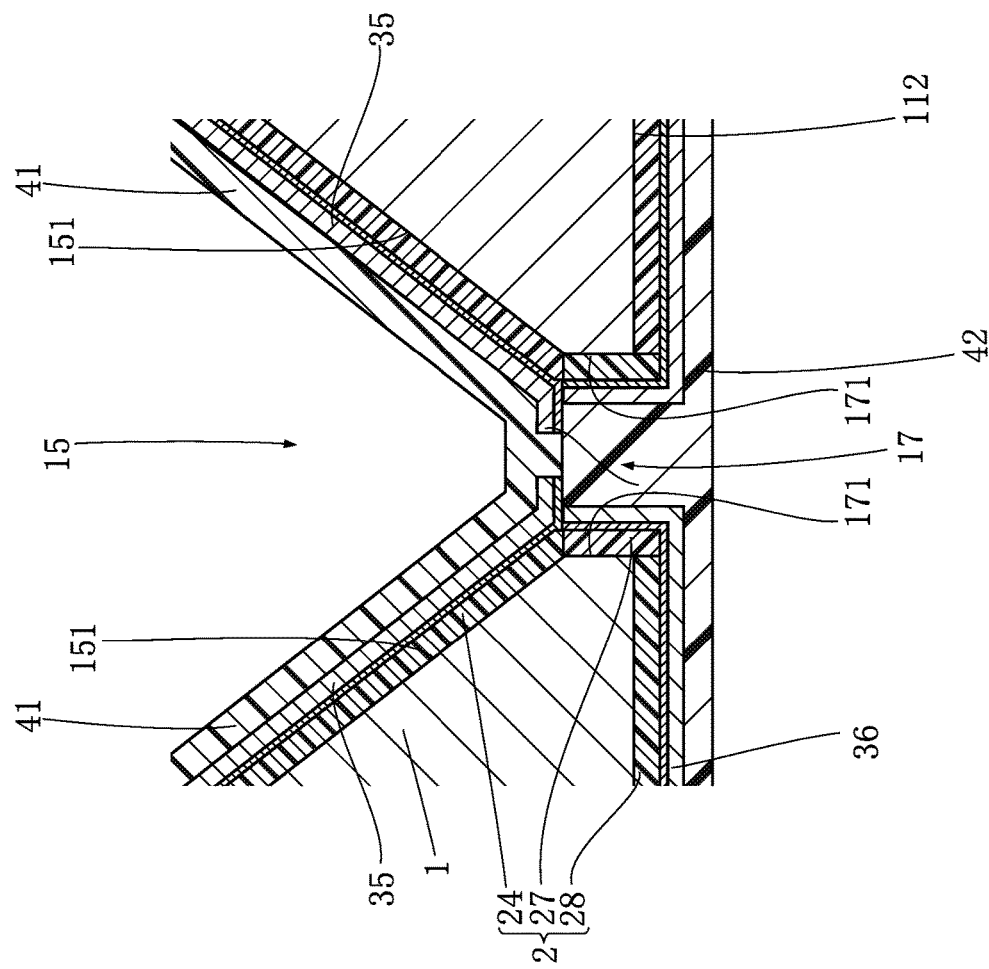
FIG. 35 is a partially enlarged view of FIG. 34.

Next, as shown in FIGS. 33 to 35, a back surface side insulating film 42 is formed on the back surface side interconnects 36. The back surface side insulating film 42 is formed by patterning after performing CVD.

Figure 36:
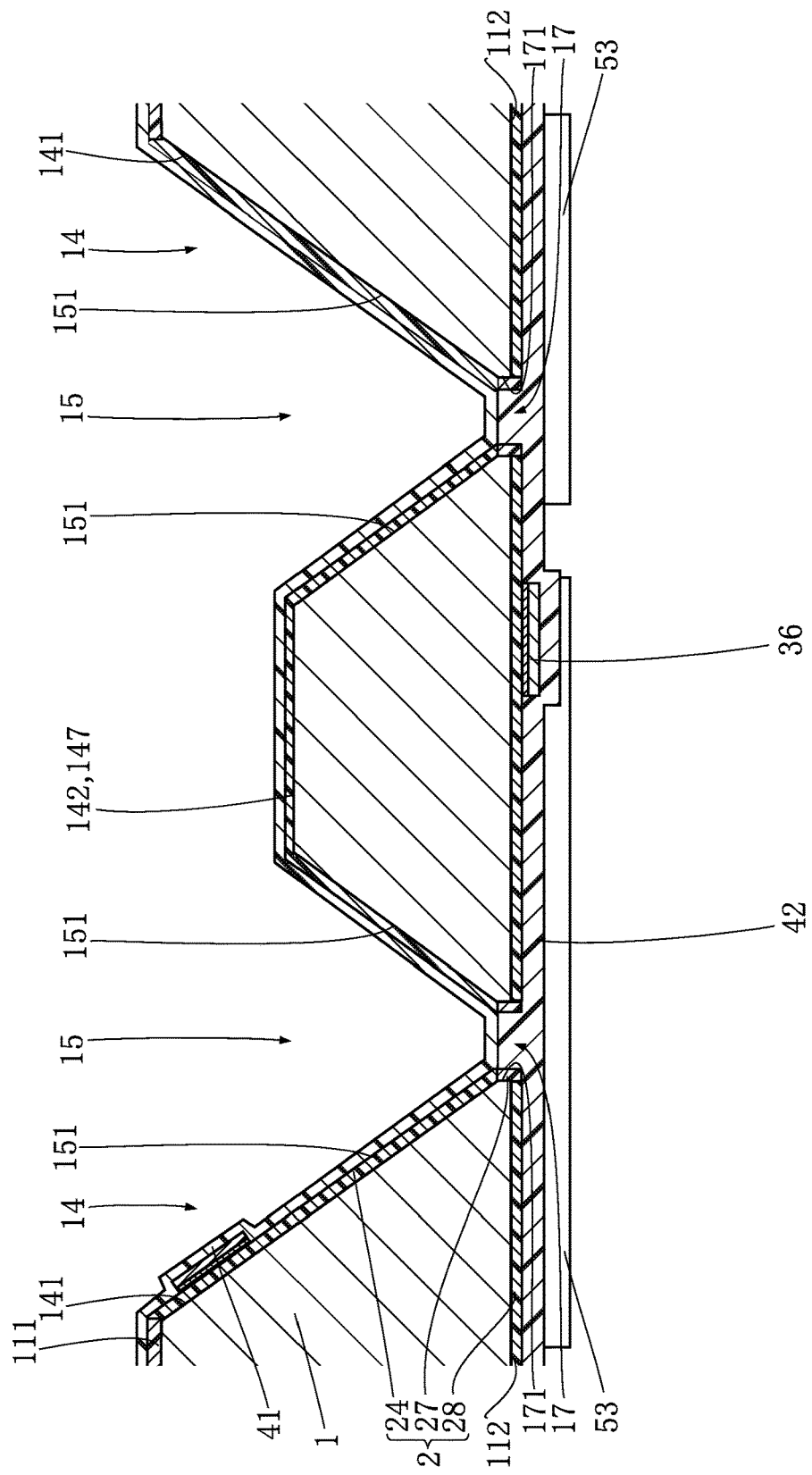
FIG. 36 is a diagram showing one process following on from FIGS. 33 to 35.
Figure 37:
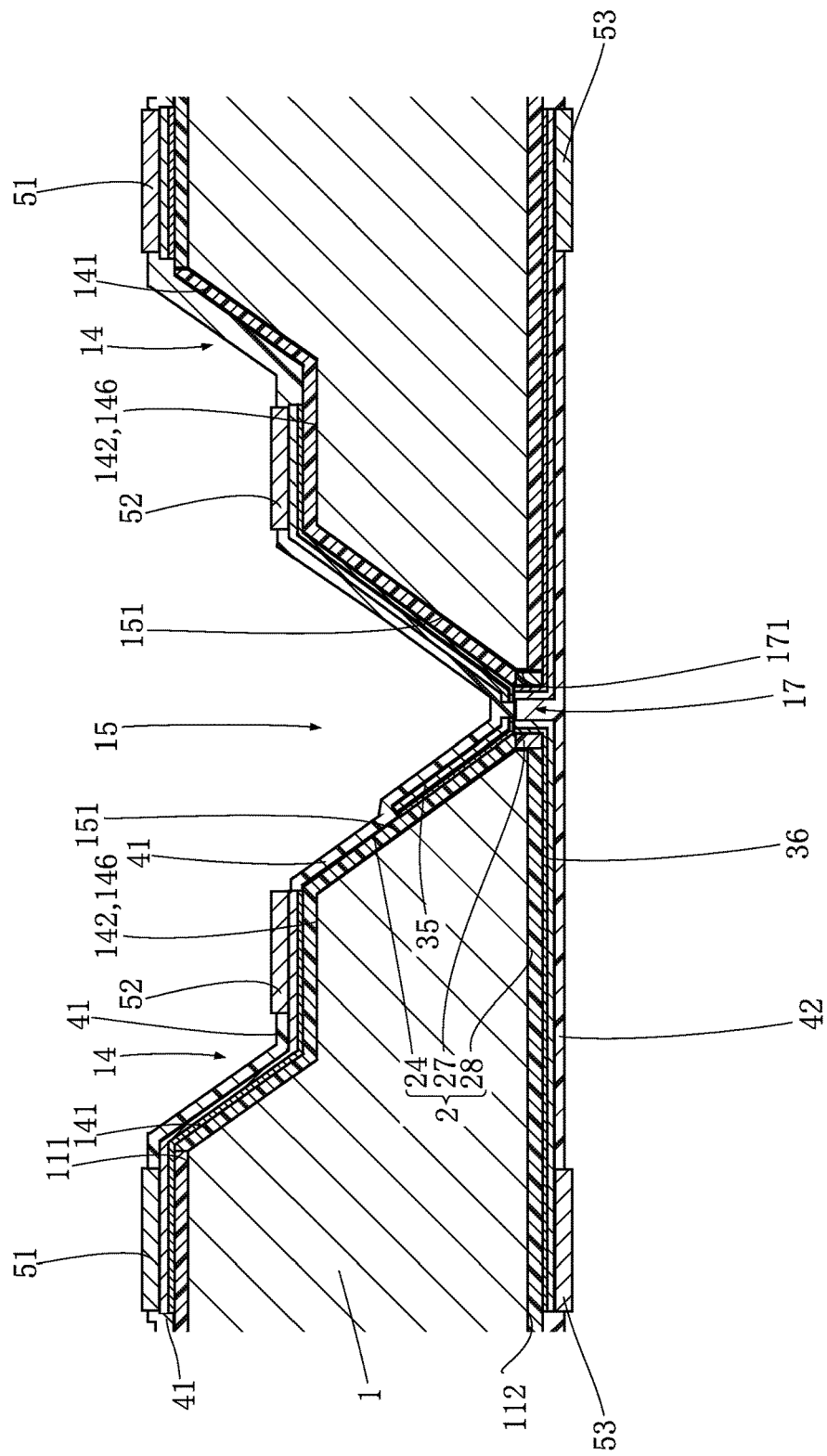
FIG. 37 is a cross-sectional view showing a cross-section corresponding to FIG. 10 in the case where the process shown in FIG. 36 has been performed.

Next, as shown in FIGS. 36 and 37, main surface electrode pads 51, bottom surface electrode pads 52, and back surface electrode pads 53 are formed. The main surface electrode pads 51, the bottom surface electrode pads 52, and the back surface electrode pads 53 are formed by electroless plating a metal such as Ni, Pd and Au, for example.

Figure 38:
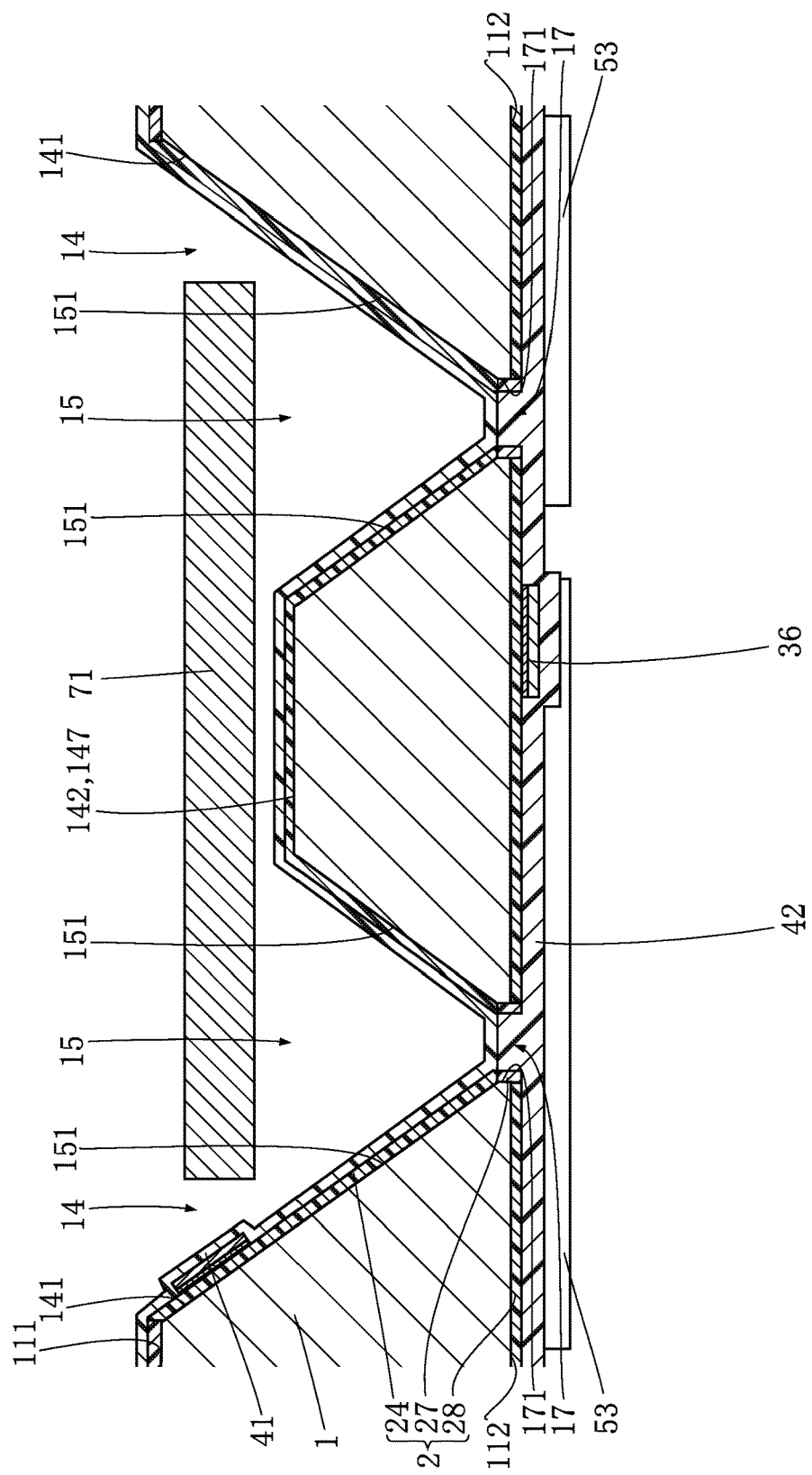
FIG. 38 is a diagram showing one process following on from FIGS. 36 and 37.
Figure 39:
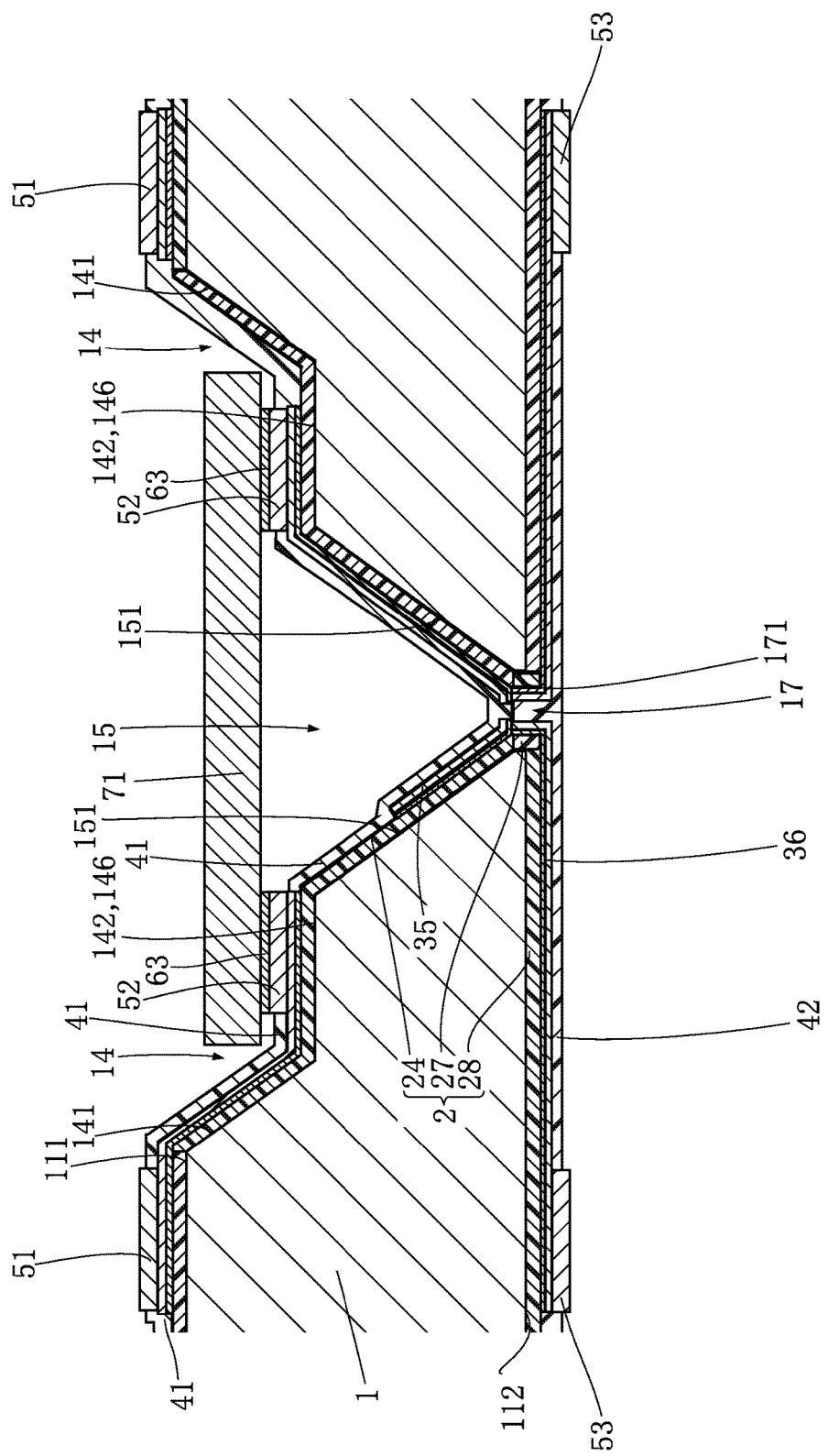
FIG. 39 is a cross-sectional view showing a cross-section corresponding to FIG. 10 in the case where the process shown in FIG. 38 has been performed.

Next, as shown in FIGS. 38 and 39, a first electronic element 71 is disposed in the recessed portion 14 for element disposition. A solder ball that will form a conductive junction 63 is formed on the first electronic element 71. Flux is applied to the solder ball. The first electronic element 71 is placed utilizing the adhesiveness of this flux. The disposition of the first electronic element 71 is completed by melting the solder ball using a reflow furnace and then setting the melted solder.

Figure 40:
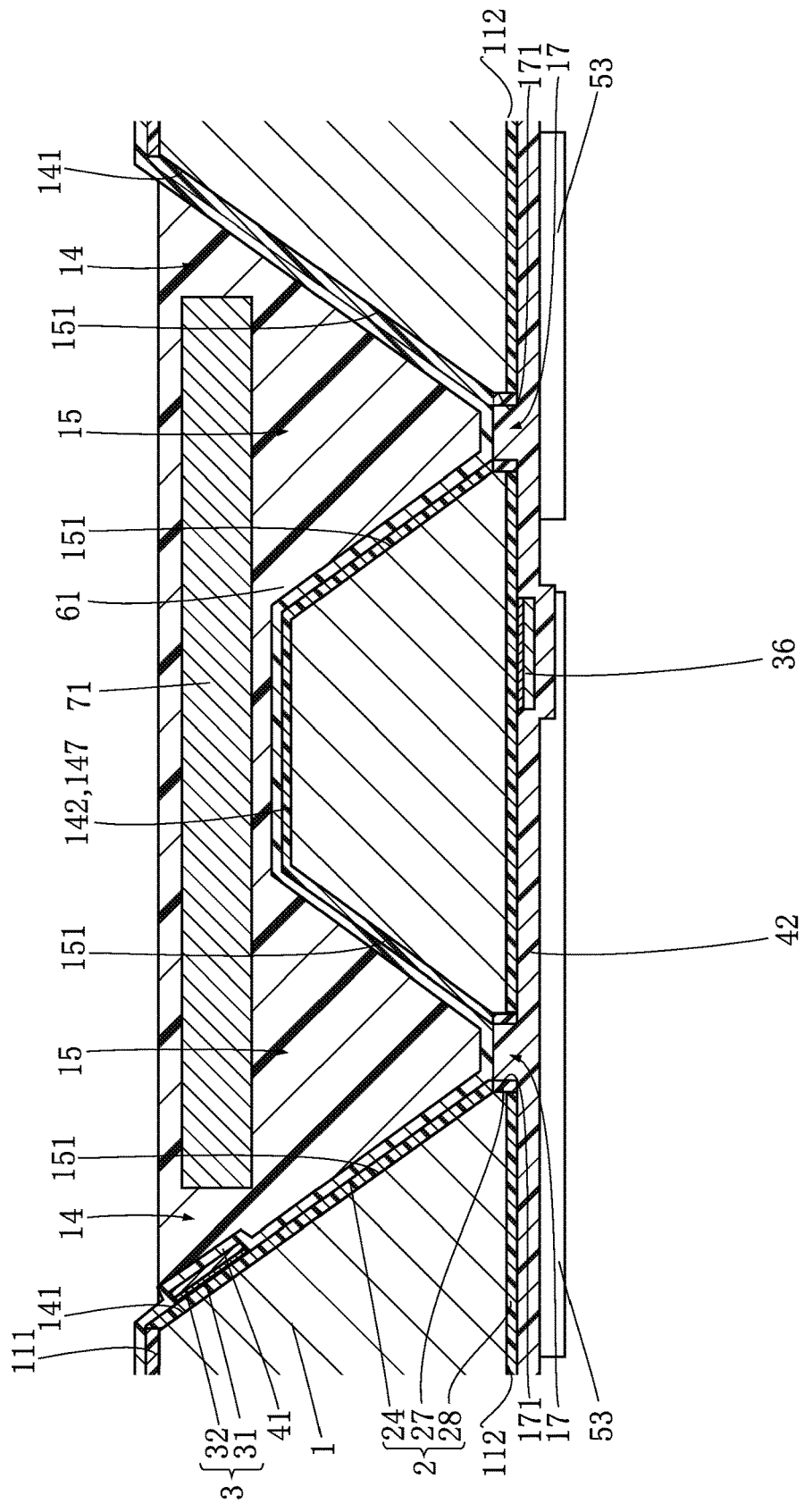
FIG. 40 is a diagram showing one process following on from FIGS. 38 and 39.
Figure 41:
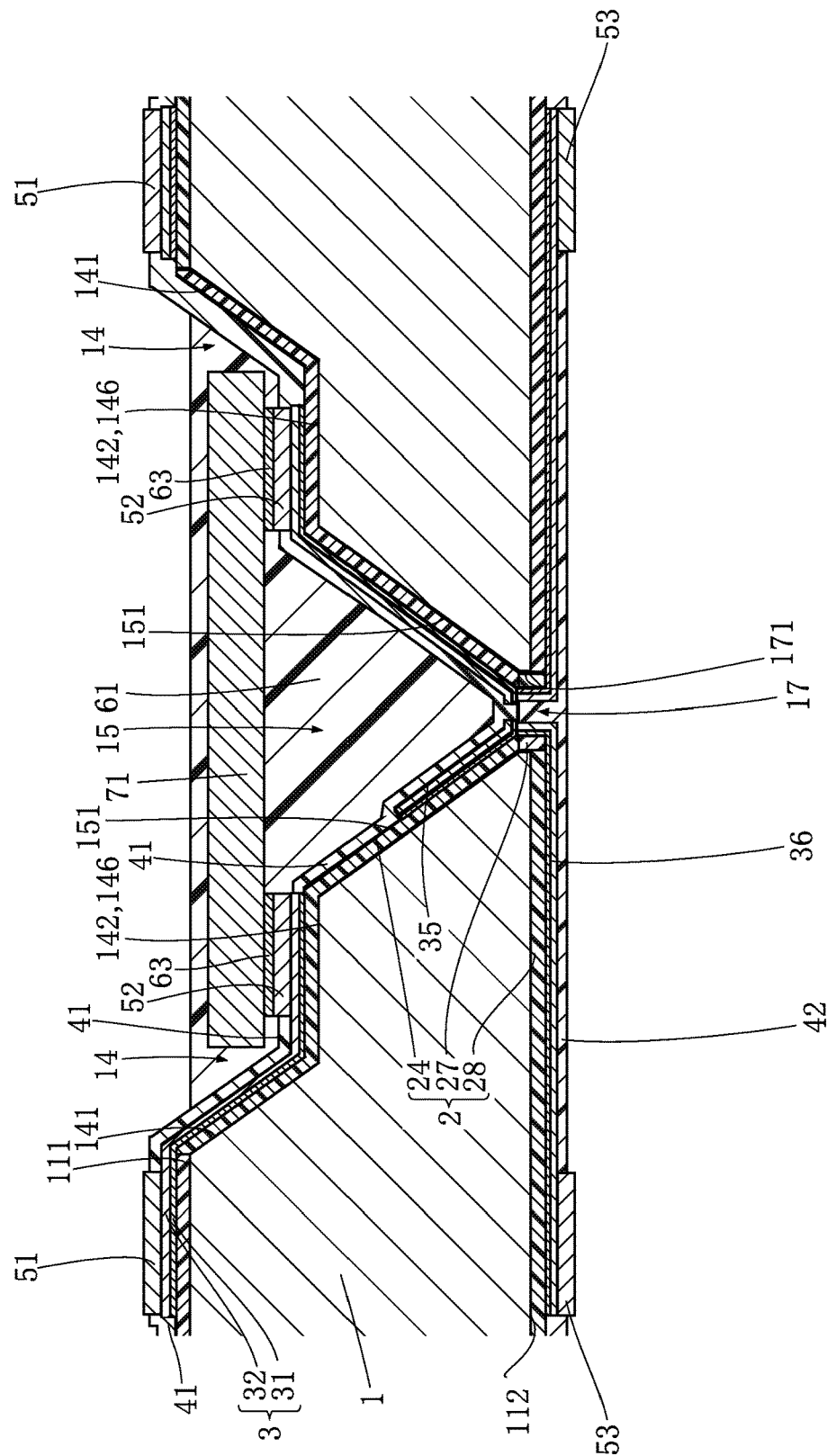
FIG. 41 is a cross-sectional view showing a cross-section corresponding to FIG. 10 in the case where the process shown in FIG. 40 has been performed.

Next, as shown in FIGS. 40 and 41, a sealing resin part 61 is formed. The sealing resin part 61 is formed by mainly filling the recessed portion 14 for element disposition with a photosetting resin material that has excellent permeability, for example, and setting the resin material.

Next, although not illustrated, a second electronic element 72 and a third electronic element 73 are disposed on the back surface 112 side, in a similar manner to disposition of the first electronic element 71. Thereafter, the substrate 1 is sectioned using a dicer. The electronic device A1 shown in FIGS. 1 to 11 is thereby obtained.

Next, the operations and effects of the present embodiment will be described.

In the present embodiment, a through hole 17 that passes through a portion of the substrate 1 is formed in the substrate 1. The through hole 17 has a through hole inner surface 171. A conductive layer 3 is formed from a region on the main surface 111 side of the through hole inner surface 171 to a region on the back surface 112 side of the through hole inner surface 171. Such a configuration enables a current path from the main surface 111 side of the substrate 1 to the back surface 112 side to be formed. Therefore, the through hole 17 can be formed without being restricted by the position of the first electronic element 71. This is suited to achieving miniaturization of the size of the electronic device A1 as viewed in the thickness direction Z.

In the present embodiment, the second electronic element 72 is an inductor and the third electronic element 73 is a capacitor. Thus, the second electronic element 72 and the third electronic element 73 are comparatively large elements. Accordingly, disposing the second electronic element 72 and the third electronic element 73 on the back surface 112 rather than in the recessed portion 14 for element disposition means that the hole of the recessed portion 14 for element disposition does not need to be formed very deeply. That is, the area of the recessed portion side surface 141 for element disposition as viewed in the thickness direction Z does not need to be greatly enlarged. Therefore, the configuration of the present embodiment is suited to achieving miniaturization of the size of the electronic device A1 as viewed in the thickness direction Z.

In the present embodiment, the recessed portion side surface 141 for element disposition slopes relative to the thickness direction Z. Such a configuration enables the recessed portion side surface 141 for element disposition to be formed comparatively flatly. Thus, the advantage of formation of the seed layer 31 (i.e., conductive layer 3) being facilitated can be enjoyed.

In the present embodiment, the recessed portion 15 for interconnects has a region that overlaps with the first electronic element 71 as viewed in the thickness direction Z of the substrate 1. Such a configuration is suited to miniaturization of the size of the electronic device A1 as viewed in the thickness direction Z.

In the present embodiment, the recessed portion side surface 151 for interconnects slopes relative to the thickness direction Z. Such a configuration enables the recessed portion side surface 151 for interconnects to be formed comparatively flatly. Thus, the advantage of formation of the seed layer 31 (i.e., conductive layer 3) being facilitated can be enjoyed.

In the present embodiment, the conductive layer 3 includes a plurality of main surface side interconnects 35. The plurality of main surface side interconnects 35 are insulated from each other, and are formed in the recessed portion side surface 151 for interconnects. With such a configuration, a plurality of current paths can be formed in a single recessed portion 15 for interconnects. Thus, the number of recessed portions 15 for interconnects to be formed in the electronic device A1 can be reduced. This is suited to miniaturization of the size of the electronic device A1 as viewed in the thickness direction Z.

In the present embodiment, the main surface side interconnects 35 have a region 35C that is located closer to the center of the through hole 17 than is a portion of the conductive layer 3 formed on the through hole inner surface 171, as viewed in the direction of the depth D13 of the through hole 17 (as viewed in the thickness direction Z). Such a configuration enables the back surface side interconnects 36 to be formed so as to reliably contact the main surface side interconnects 35.

In the present embodiment, the ratio of the depth D13 of the through hole 17 to the maximum opening size L11 of the through hole 17 as viewed in the thickness direction Z of the substrate 1 is 0.2 to 5. Such a configuration enables the seed layer 31 to be reliably formed on the through hole inner surface 171 by sputtering.

In the present embodiment, the conductive layer 3 includes a plurality of back surface side interconnects 36. The plurality of back surface side interconnects 36 are insulated from each other, and are formed on the through hole inner surface 171. With such a configuration, a plurality of current paths can be formed in a single through hole 17. Thus, the number of through holes 17 to be formed in the electronic device A1 can be reduced. This is suited to miniaturization of the size of the electronic device A1 as viewed in the thickness direction Z.

Second Embodiment

A second embodiment of the present invention will be described using FIGS. 42 and 43.

Note that, in the following description, configuration that is the same as or similar to that described above will be given same reference numeral, and description will be omitted as appropriate.

Figure 42:
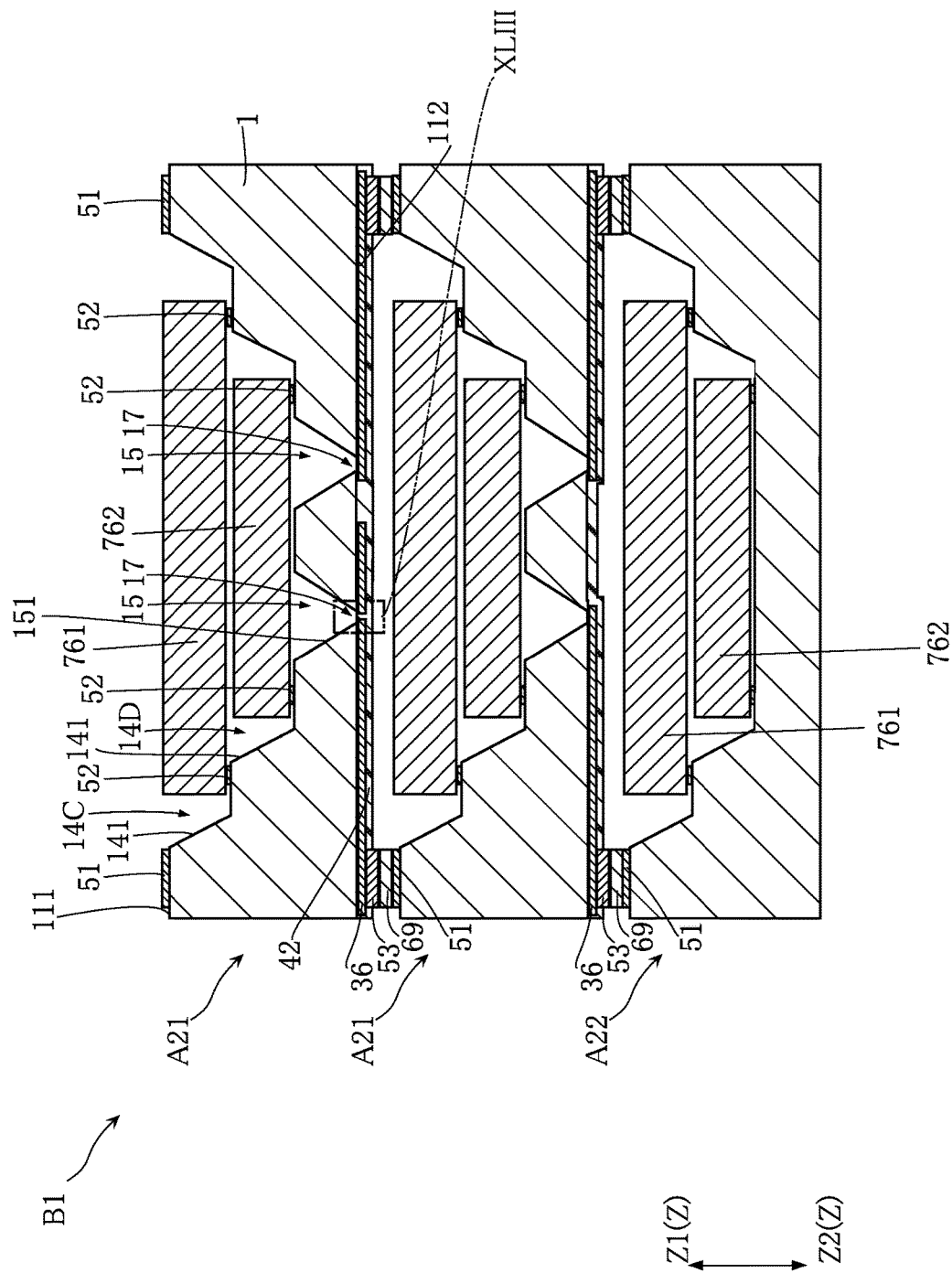
FIG. 42 is a cross-sectional view schematically showing an electronic device unit according to a second embodiment of the present invention.

FIG. 42 is a cross-sectional view schematically showing an electronic device unit according to the second embodiment of the present invention. FIG. 43 is a partially enlarged view showing an area XLIII of FIG. 42 in enlarged form.

An electronic device unit B1 shown in these diagrams is provided with a plurality of electronic devices A21 and A22 that are stacked one on another. In the present embodiment, the electronic device unit B1 has a structure in which a plurality (six) of memories (electronic elements) are stacked.

The electronic device A21 is provided with a substrate 1, an insulating layer 2, a conductive layer 3, a main surface electrode pad 51, a bottom surface electrode pad 52, a back surface electrode pad 53, a conductive junction 63, a first electronic element 761, and a additional first electronic element 762.

A main surface side recessed portion 14C for element disposition, an additional main surface side recessed portion 14D for element disposition, a recessed portion 15 for interconnects, and a through hole 17 are formed in the substrate 1. Because the main surface side recessed portion 14C for element disposition, the recessed portion 15 for interconnects and the through hole 17 are substantially similar to the recessed portion 14 for element disposition, the recessed portion 15 for interconnects and the through hole 17 in the first embodiment, description thereof will be omitted.

The additional main surface side recessed portion 14D for element disposition is recessed from the recessed portion bottom surface 142 for element disposition in the main surface side recessed portion 14C for element disposition. The additional main surface side recessed portion 14D for element disposition communicates with the through hole 17.

Because the substrate 1 is substantially similar to the first embodiment except for these points, description thereof is omitted.

In the present embodiment, the first electronic element 761 and the additional first electronic element 762 are both memories. The first electronic element 761 is disposed in the main surface side recessed portion 14C for element disposition. The additional first electronic element 762 is disposed in the additional main surface side recessed portion 14D for element disposition.

Because the electronic device A21 is otherwise substantially similar to the electronic device A1, description thereof will be omitted.

Because the electronic device A22 is substantially similar to the electronic device A21, except for the fact that the through hole 17 and the back surface electrode pad 53 are not provided, description thereof will be omitted.

A conductive junction element 69 is interposed between the back surface electrode pad 53 in the top electronic device A21 in FIG. 42 and the main surface electrode pad 51 of the middle electronic device A21. The two electronic devices A21 are thereby joined to each other via the conductive junction element 69. Also, electrodes of the first electronic element 761 and the additional first electronic element 762 in the top electronic device A21 are electrically connected to electrodes of the first electronic element 761 and the additional first electronic element 762 in the middle electronic device A21 via the conductive junction element 69. The conductive junction element 69 is derived from solder, for example.

A conductive junction element 69 is interposed between the back surface electrode pad 53 of the middle electronic device A21 of FIG. 42 and the main surface electrode pad 51 of the electronic device A22. The two electronic devices A21 and A22 are thereby joined to each other via the conductive junction element 69. Also, electrodes of the first electronic element 761 and the additional first electronic element 762 in the middle electronic device A21 are electrically connected to electrodes of the first electronic element 761 and the additional first electronic element 762 in the electronic device A22 via the conductive junction element 69. The conductive junction element 69 is derived from solder, for example.

Next, the operations and effects of the present embodiment will be described.

In the present embodiment, a through hole 17 that passes through a portion of the substrate 1 is formed in the substrate 1. The through hole 17 has a through hole inner surface 171. The conductive layer 3 is formed from a region on the main surface 111 side of the through hole inner surface 171 to a region on the back surface 112 side of the through hole inner surface 171. Such a configuration enables a current path from the main surface 111 side of the substrate 1 to the back surface 112 side to be formed. Therefore, the through hole 17 can be formed without being restricted by the position of the first electronic element 761 and the additional first electronic element 762. This is suited to achieving miniaturization of the size of the electronic device A21 as viewed in the thickness direction Z.

In the present embodiment, the recessed portion side surface 141 for element disposition slopes relative to the thickness direction Z. Such a configuration enables the recessed portion side surface 141 for element disposition to be formed comparatively flatly. Thus, the advantage of formation of the seed layer 31 (i.e., conductive layer 3) being facilitated can be enjoyed.

In the present embodiment, the recessed portion 15 for interconnects has a region that overlaps with the first electronic element 761 and the additional first electronic element 762 as viewed in the thickness direction Z of the substrate 1. Such a configuration is suited to achieving miniaturization of the size of the electronic device A21 as viewed in the thickness direction Z.

In the present embodiment, the recessed portion side surface 151 for interconnects slopes relative to the thickness direction Z. Such a configuration enables the recessed portion side surface 151 for interconnects to be formed comparatively flatly. Thus, the advantage of formation of the seed layer 31 (i.e., conductive layer 3) being facilitated can be enjoyed.

Figure 43:
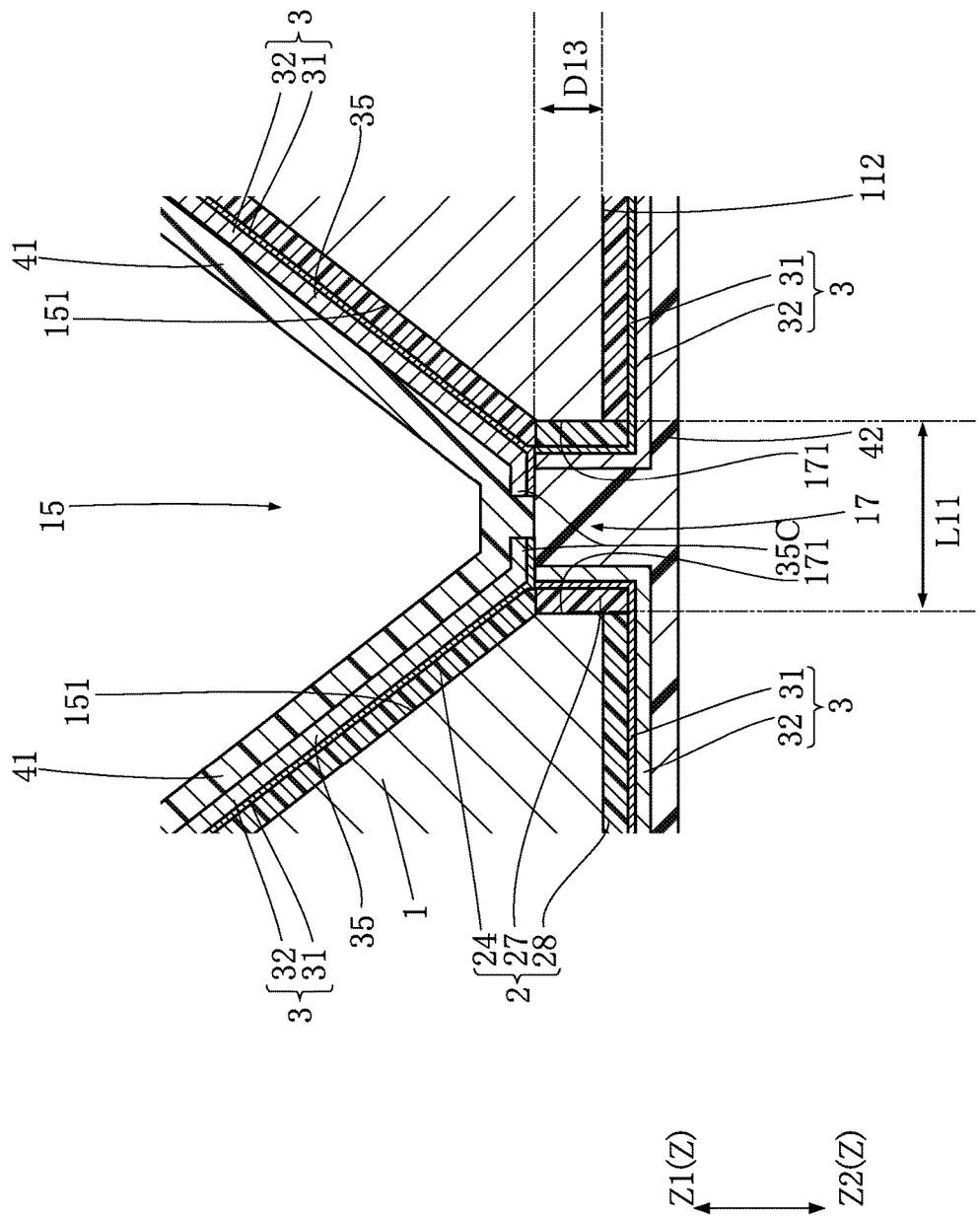
FIG. 43 is a partially enlarged view showing an area XLIII of FIG. 42 in enlarged form.

In the present embodiment, as shown in FIG. 43, the conductive layer 3 includes a plurality of main surface side interconnects 35. The plurality of main surface side interconnects 35 are insulated from each other, and are formed in the recessed portion side surface 151 for interconnects.

With such a configuration, a plurality of current paths can be formed in a single recessed portion 15 for interconnects. Thus, the number of recessed portions 15 for interconnects to be formed in the electronic device A21 can be reduced. This is suited to achieving miniaturization of the size of the electronic device A21 as viewed in the thickness direction Z.

In the present embodiment, the main surface side interconnects 35 have a region 35C that is located closer to the center of the through hole 17 than is a portion of the conductive layer 3 formed on the through hole inner surface 171, as viewed in the direction of the depth D13 of the through hole 17 (as viewed in the thickness direction Z). Such a configuration enables the back surface side interconnects 36 to be formed so as to reliably contact the main surface side interconnects 35.

In the present embodiment, the ratio of the depth D13 of the through hole 17 to the maximum opening size L11 of the through hole 17 as viewed in the thickness direction Z of the substrate 1 is 0.2 to 5. Such a configuration enables the seed layer 31 to be reliably formed on the through hole inner surface 171 by sputtering.

In the present embodiment, the conductive layer 3 includes a plurality of back surface side interconnects 36. The plurality of back surface side interconnects 36 are insulated from each other, and are formed on the through hole inner surface 171. With such a configuration, a plurality of current paths can be formed in a single through hole 17. Thus, the number of through holes 17 to be formed in the electronic device A21 can be reduced. This is suited to achieving miniaturization of the size of the electronic device A21 as viewed in the thickness direction Z.

First Modification of Second Embodiment

A first modification of the second embodiment of the present invention will be described using FIGS. 44 to 45.

Figure 44:
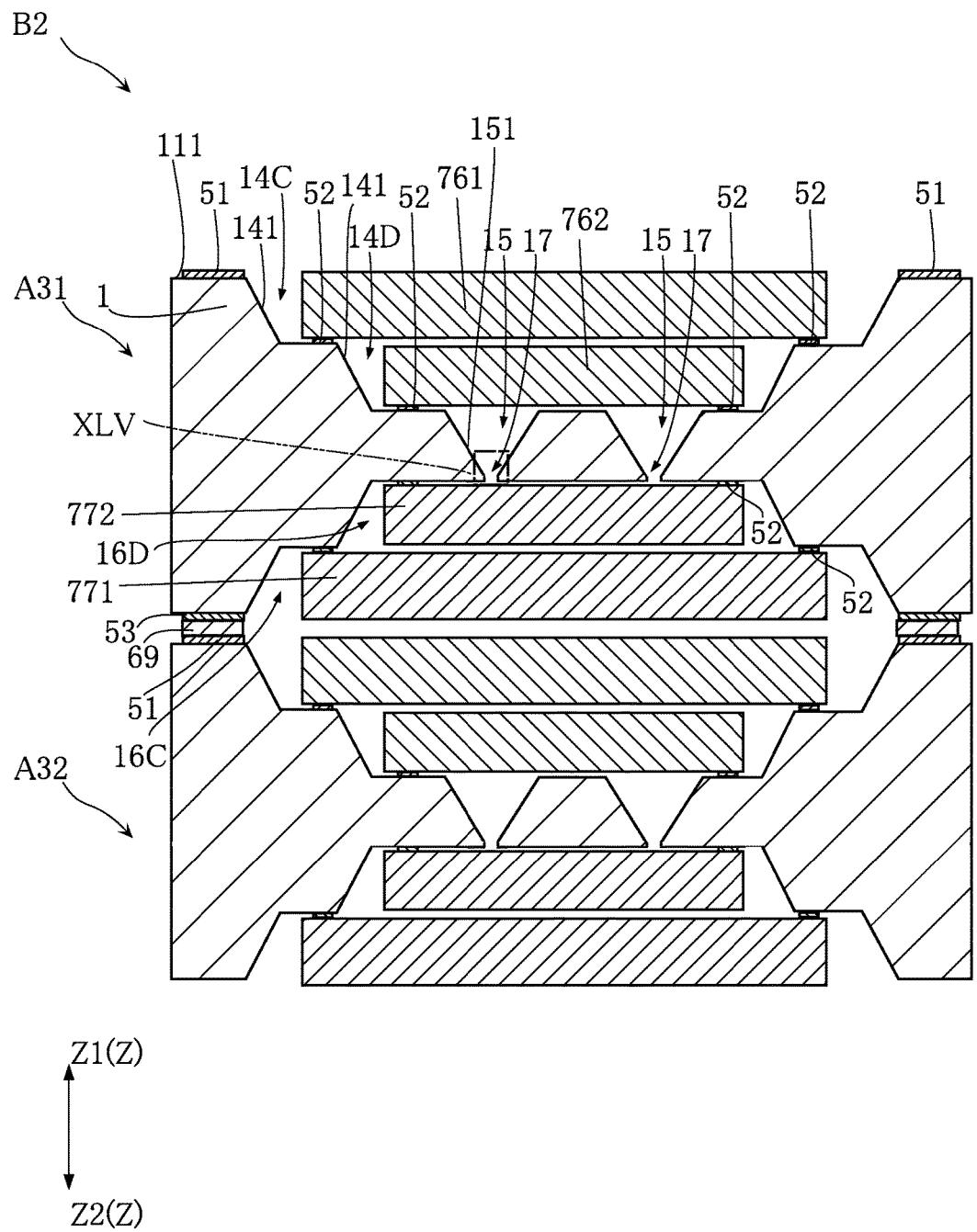
FIG. 44 is a cross-sectional view schematically showing an electronic device unit according to a first modification of the second embodiment of the present invention.
Figure 45:
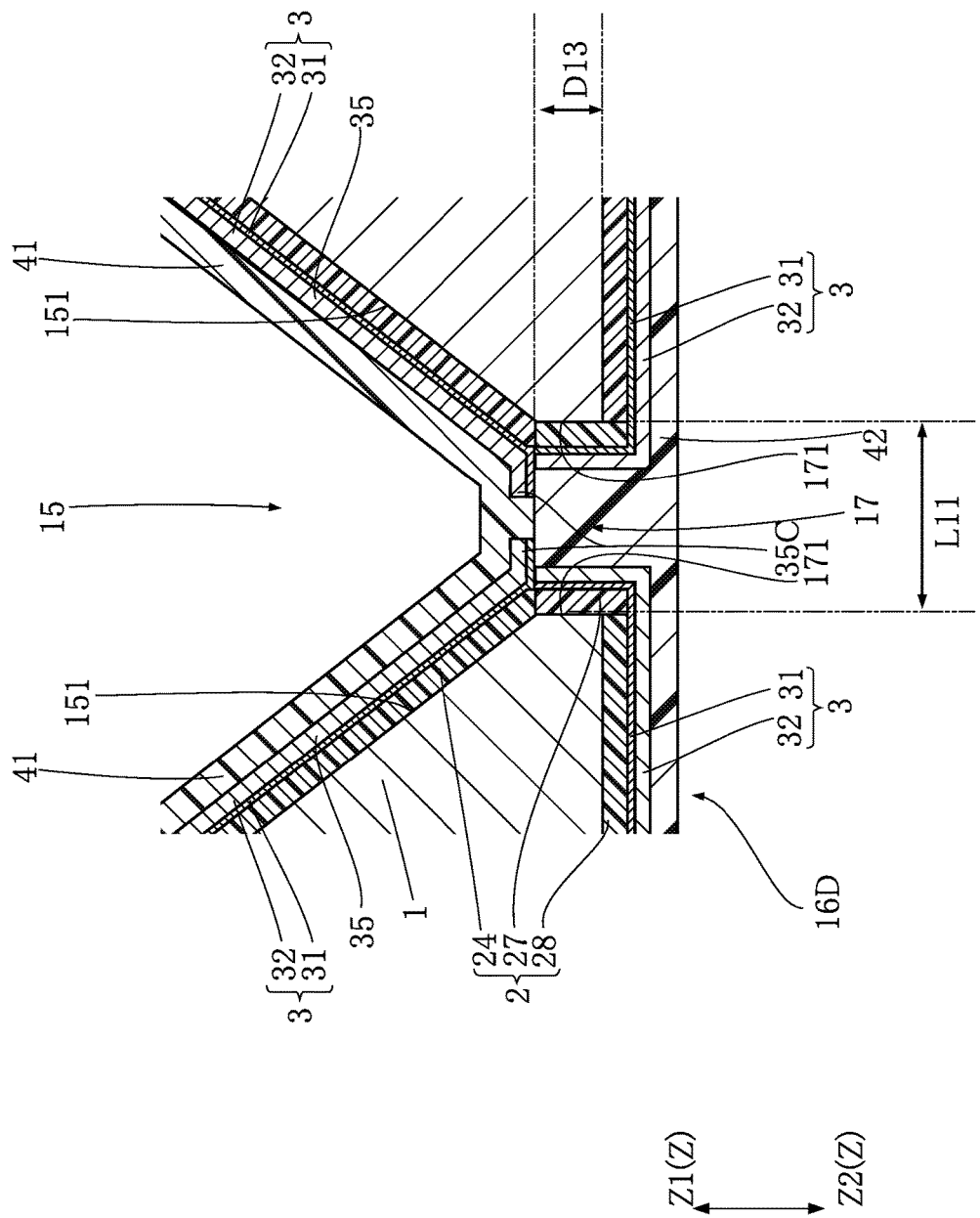
FIG. 45 is a partially enlarged view showing an area XLV of FIG. 44 in enlarged form.
Figure 46:
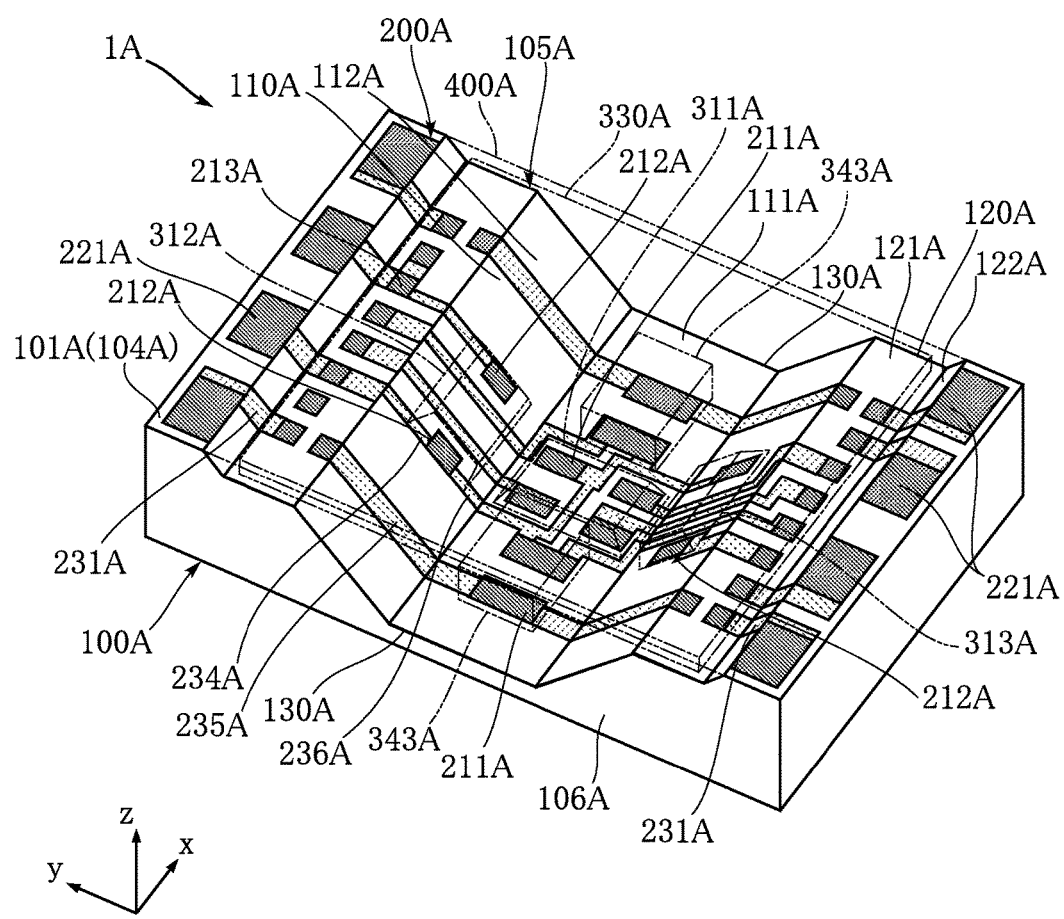
FIG. 46 is a perspective diagram showing a semiconductor device based on a third embodiment of the present invention.

FIG. 44 is a cross-sectional view schematically showing the electronic device unit according to the first modification of the second embodiment of the present invention. FIG. 45 is a partially enlarged view showing an area XLV of FIG. 44 in enlarged form.

An electronic device unit B2 shown in these diagrams is provided with a plurality of electronic devices A31 and A32 that are stacked one on another. In the present modification, the electronic device unit B2 has a structure in which a plurality (eight) of memories (electronic elements) are stacked.

The electronic device A31 differs from the electronic device A21 in that a back surface side recessed portion 16C for element disposition and an additional back surface side recessed portion 16D for element disposition are formed in addition to the main surface side recessed portion 14C for element disposition and the additional main surface side recessed portion 14D for element disposition, and a second electronic element 771 and an additional second electronic device 772 are further provided.

The back surface side recessed portion 16C for element disposition is recessed from the back surface 112. The back surface side recessed portion 16C for element disposition is equivalent to the main surface side recessed portion 14C for element disposition turned upside down. Also, the additional back surface side recessed portion 16D for element disposition is recessed from the back surface side recessed portion 16C for element disposition. The additional back surface side recessed portion 16D for element disposition is equivalent to the additional main surface side recessed portion 14D for element disposition turned upside down. The additional back surface side recessed portion 16D for element disposition communicates with the through hole 17.

Because the substrate 1 is substantially similar to the electronic device A21 except for these points, description thereof will be omitted.

The second electronic element 771 and the additional second electronic device 772 are both memories. The second electronic element 771 is disposed in the back surface side recessed portion 16C for element disposition. The additional second electronic device 772 is disposed in the additional back surface side recessed portion 16D for element disposition.

Also, a bottom surface electrode pad 52 similar to the bottom surface electrode pad 52 is formed in the back surface side recessed portion 16C for element disposition and the additional back surface side recessed portion 16D for element disposition.

Because the electronic device A31 is otherwise substantially similar to the electronic device A21, description thereof will be omitted.

Because the electronic device A32 is substantially similar to the electronic device A31 except for the fact that the back surface electrode pad 53 is not provided, description thereof will be omitted.

A conductive junction element 69 is interposed between the back surface electrode pad 53 of the electronic device A31 of FIG. 44 and the main surface electrode pad 51 of the electronic device A32. The two electronic devices A31 and A32 are thereby joined to each other via the conductive junction element 69. Also, electrodes of the first electronic element 761 and the additional first electronic element 762 and electrodes of the second electronic element 771 and the additional second electronic device 772 in the electronic device A31 are electrically connected to electrodes of the first electronic element 761 and the additional first electronic element 762 and electrodes of the second electronic element 771 and the additional second electronic device 772 in the electronic device A32 via the conductive junction element 69. The conductive junction element 69 is derived from solder, for example.

Next, the operations and effects of the present modification will be described.

In the present modification, a through hole 17 that passes through a portion of the substrate 1 is formed in the substrate 1. The through hole 17 has a through hole inner surface 171. The conductive layer 3 is formed from a region on the main surface 111 side of the through hole inner surface 171 to a region on the back surface 112 side of the through hole inner surface 171. Such a configuration enables a current path from the main surface 111 side of the substrate 1 to the back surface 112 side to be formed. Therefore, the through hole 17 can be formed without being restricted by the position of the first electronic element 761 and the additional first electronic element 762. This is suited to achieving miniaturization of the size of the electronic device A31 and of A32 as viewed in the thickness direction Z.

In the present modification, the recessed portion side surface 141 for element disposition slopes relative to the thickness direction Z. Such a configuration enables the recessed portion side surface 141 for element disposition to be formed comparatively flatly. Thus, the advantage of formation of the seed layer 31 (i.e., conductive layer 3) being facilitated can be enjoyed.

In the present modification, the recessed portion 15 for interconnects has a region that overlaps with the first electronic element 761 and the additional first electronic element 762 as viewed in the thickness direction Z of the substrate 1. Such a configuration is suited to miniaturization of the size of the electronic devices A31 and A32 as viewed in the thickness direction Z.

In the present modification, the recessed portion side surface 151 for interconnects slopes relative to the thickness direction Z. Such a configuration enables the recessed portion side surface 151 for interconnects to be formed comparatively flatly. Thus, the advantage of formation of the seed layer 31 (i.e., conductive layer 3) being facilitated can be enjoyed.

In the present modification, the conductive layer 3 includes a plurality of main surface side interconnects 35. The plurality of main surface side interconnects 35 are insulated from each other, and are formed in the recessed portion side surface 151 for interconnects. With such a configuration, a plurality of current paths can be formed in a single recessed portion 15 for interconnects. Thus, the number of recessed portions 15 for interconnects to be formed in the electronic devices A31 and A32 can be reduced. This is suited to miniaturization of the size of the electronic devices A31 and A32 as viewed in the thickness direction Z.

In the present modification, the main surface side interconnects 35 have a region 35C that is located closer to the center of the through hole 17 than is a portion of the conductive layer 3 formed on the through hole inner surface 171, as viewed in the direction of the depth D13 of the through hole 17 (as viewed in the thickness direction Z). Such a configuration enables the back surface side interconnects 36 to be formed so as to reliably contact the main surface side interconnects 35.

In the present modification, the ratio of the depth D13 of the through hole 17 to the maximum opening size L11 of the through hole 17 as viewed in the thickness direction Z of the substrate 1 is 0.2 to 5. Such a configuration enables the seed layer 31 to be reliably formed on the through hole inner surface 171 by sputtering.

In the present modification, the conductive layer 3 includes a plurality of back surface side interconnects 36. The plurality of back surface side interconnects 36 are insulated from each other, and are formed on the through hole inner surface 171. With such a configuration, a plurality of current paths can be formed in a single through hole 17. Thus, the number of through holes 17 to be formed in the electronic devices A31 and A32 can be reduced. This is suited to miniaturization of the size of the electronic devices A31 and A32 as viewed in the thickness direction Z.

The present invention is not limited to the abovementioned embodiments. Design changes can be freely made to the specific configurations of the various parts of the present invention.

Figure 47:
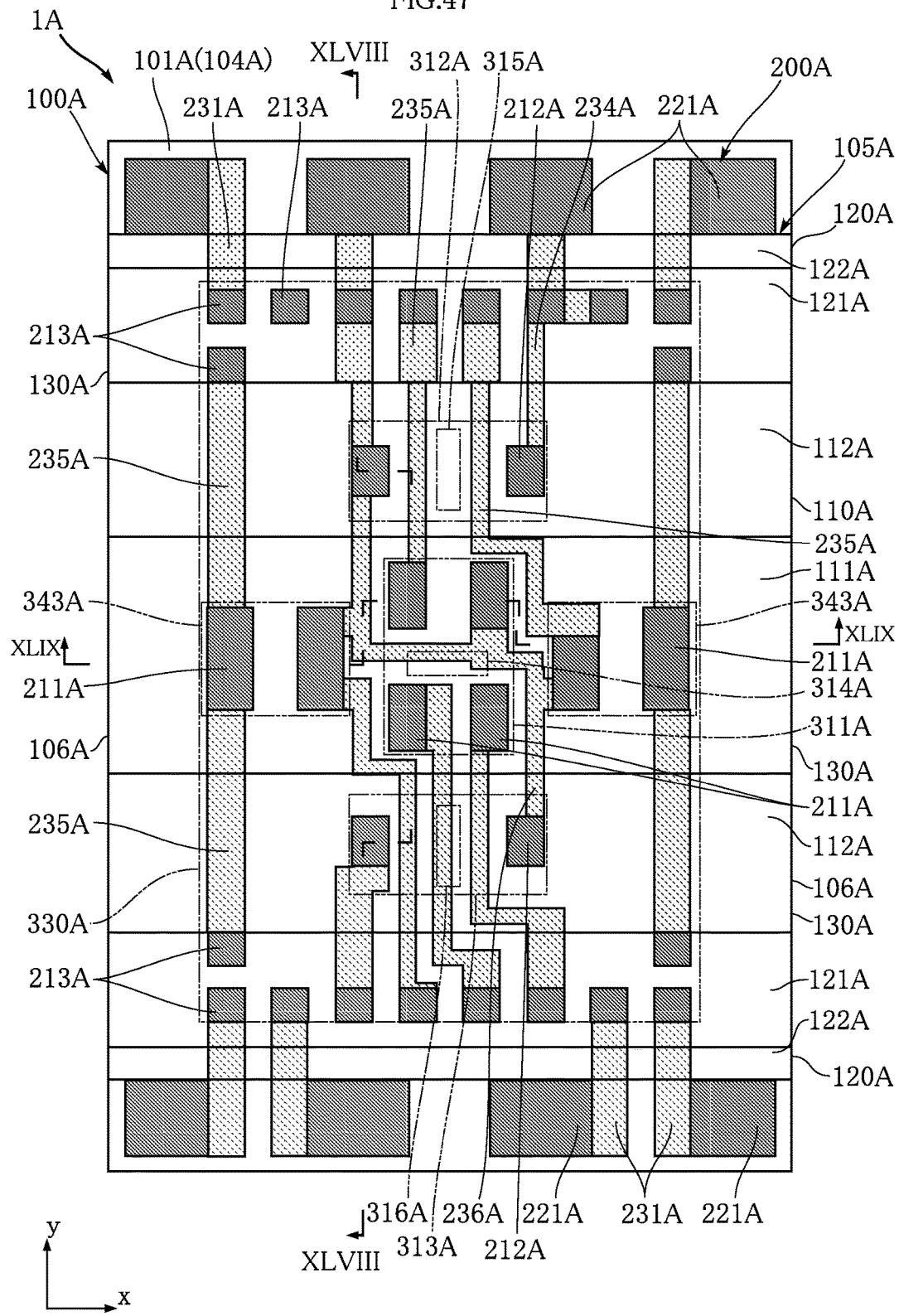
FIG. 47 is a plan view showing a main section of the semiconductor device of FIG. 46.
Figure 48:
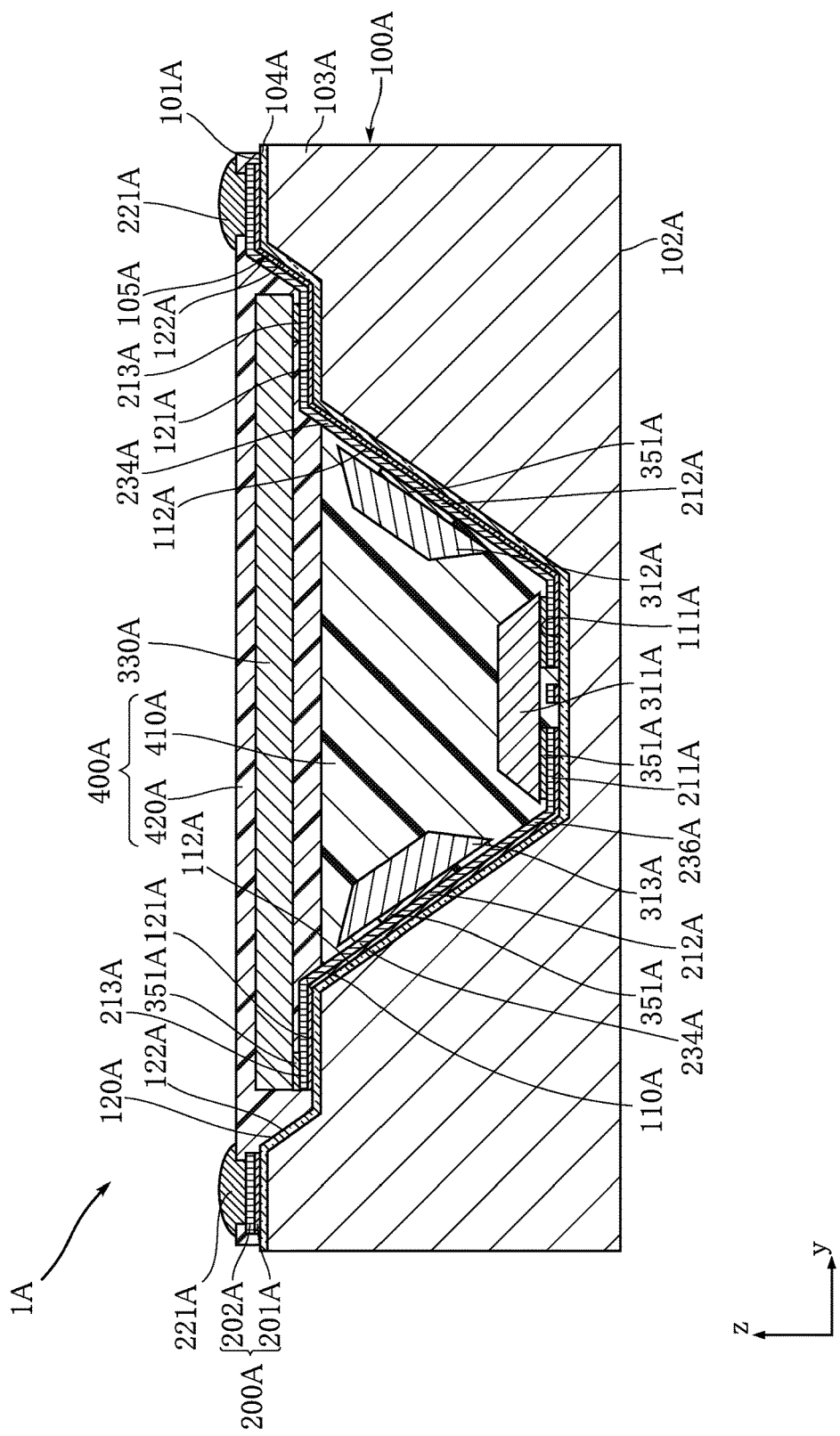
FIG. 48 is a cross-sectional view along a line XLVIII-XLVIII in FIG. 47.
Figure 49:
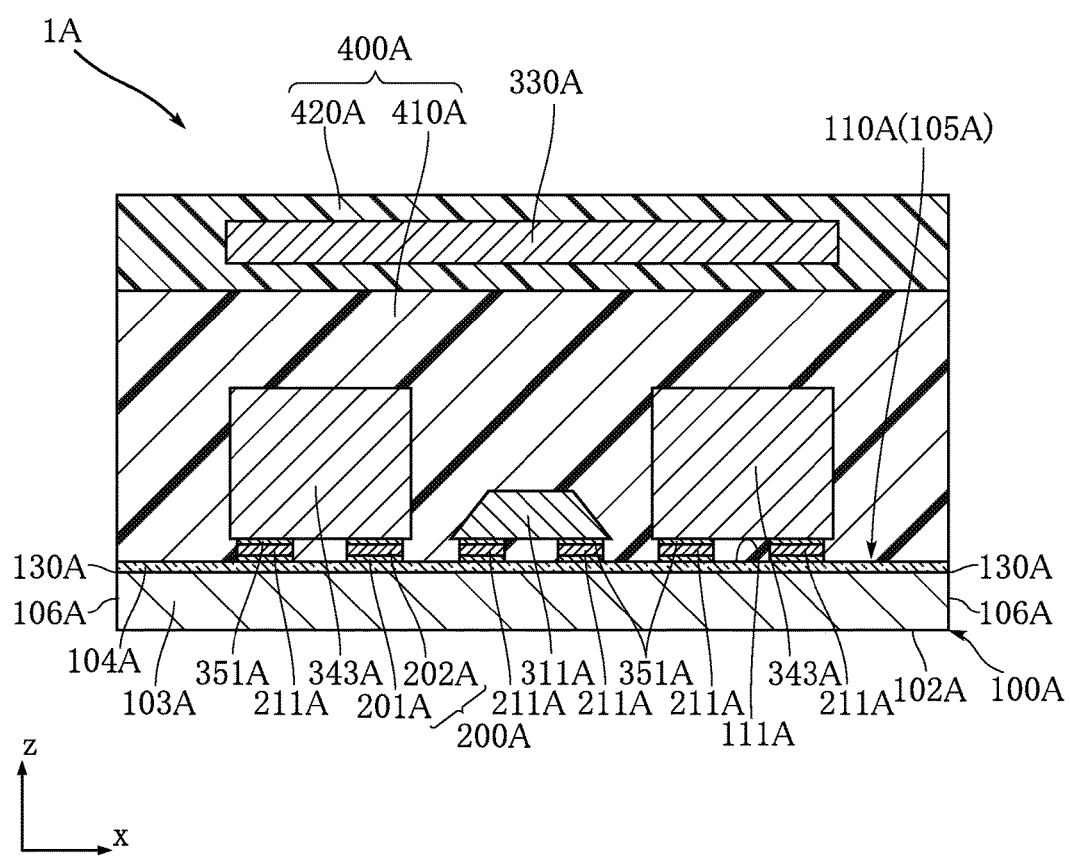
FIG. 49 is a cross-sectional view along a line XLIX-XLIX in FIG. 47.

FIGS. 46 to 49 show the semiconductor device based on a third embodiment of the present invention. A semiconductor device 1A of the present embodiment is provided with a substrate 100A, an interconnect layer 200A, three orientation sensor elements 311A, 312A and 313A, an integrated circuit element 330A, two capacitors 343A, and a sealing resin 400A. Note that, in FIG. 46, the three orientation sensor elements 311A, 312A and 313A, the integrated circuit element 330A, the two capacitors 343A and the sealing resin 400A are indicated by imaginary outlines. Also, in FIG. 47, the sealing resin 400A is omitted, and the three orientation sensor elements 311A, 312A and 313A, the integrated circuit element 330A, and the two capacitors 343A are indicated with imaginary outlines. FIG. 48 is a cross-sectional view in a yz plane along a line III-III in FIG. 47, and FIG. 49 is a cross-sectional view in a zx plane along a line IV-IV in FIG. 47.

The semiconductor device 1A is constituted as a surface-mounted orientation detection module that is capable of detecting orientation in three directions using a configuration that will be described below. To give an example of the size of the semiconductor device 1A, the semiconductor device 1A has a size of about 1.5 mm×2.5 mm in plan view and a thickness of about 0.6 mm.

A substrate 100A forms a base of the semiconductor device 1A, and consists of a base 103A and an insulating layer 104A. The substrate 100A has a main surface 101A, a back surface 102A, a pair of lateral surfaces 106A, and a recessed portion 105A. The substrate 100A has a thickness of about 600 μm, for example. Note that, in the present embodiment, the main surface 101A and the back surface 102A face in opposite directions to each other in the z direction, and the z direction corresponds to the thickness direction of the semiconductor device 1A. Also, the x direction and the y direction are both at a right angle to the z direction. The pair of lateral surfaces 106A are both connected to the main surface 101A, and face in opposite directions to each other in the x direction.

The base 103A is made of a single-crystal semiconductor material, and in the present embodiment is made of single-crystal Si. Also, the insulating layer 104A, in the present embodiment, is made of $SiO_2$. Note that the material of the base 103A is not limited to Si, and need only be a material that enables a recessed portion 105A that meets intentions discussed later to be formed. The insulating layer 104A partially covers the base 103A that faces out from the opposite side to the back surface 102A. The insulating layer 104A has a thickness of about 0.1 to 1.0 μm, for example.

Figure 50:
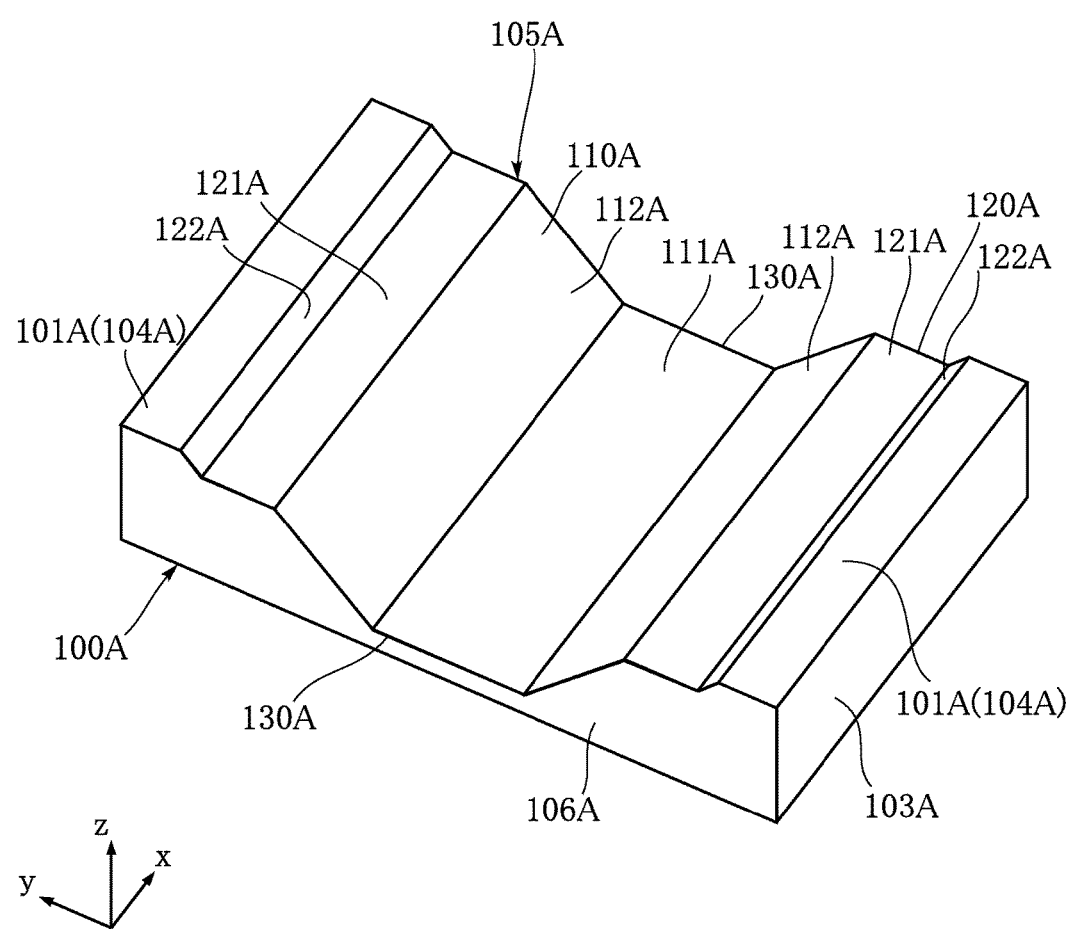
FIG. 50 is a perspective diagram showing a substrate of the semiconductor device of FIG. 46.

FIG. 50 is a perspective diagram showing the substrate 100A. In the present embodiment, a (100) surface of the base 103A is adopted as the main surface 101A. The recessed portion 105A is recessed toward the back surface 102A from the main surface 101A. The recessed portion 105A has a pair of opening portions 130A that open on the pair of lateral surfaces 106A. Note that to favorably achieve the effects intended by the present application which will be discussed later, the recessed portion 105A preferably has a pair of opening portions 130A, but the present application it not limited thereto and may be configured to have only one of the opening portions 130A. Also, the cross-sectional shape of the recessed portion 105A in the yx plane is constant. In the present embodiment, the recessed portion 105A consists of a first recessed portion 110A and a second recessed portion 120A. The first recessed portion 110A is located on the back surface 102A side, and has a first bottom surface 111A and two first sloping surfaces 112A. The second recessed portion 120A is located closer to the main surface 101A than is the first recessed portion 110A, and has two second bottom surfaces 121A and two second sloping surfaces 122A. The first recessed portion 110A and the second recessed portion 120A have shapes that are dependent on having adopted the (100) surface as the main surface 101A.

As a result on the recessed portion 105A being formed, the main surface 101A consists of two regions that are spaced in the y direction.

The first recessed portion 110A has a rectangular shape in plan view. The first recessed portion 110A has a depth of about 400 μm, for example. The first bottom surface 111A has a rectangular shape in plan view. The two first sloping surfaces 112A sandwich the first bottom surface 111A in plan view, and have rectangular shapes that are substantially congruent with each other. Each first sloping surface 112A slopes relative to the first bottom surface 111A. In the present embodiment, the first sloping surfaces 112A are at an angle of about 55 degrees relative to the xy plane. Note that the fact that the first sloping surfaces 112A have substantially trapezoidal shapes that are substantially congruent with each other and the angle is 55 degrees are dependent on having adopted the (100) surface as the main surface 101A.

The second recessed portion 120A has a rectangular shape in plan view. The second recessed portion 120A has a depth of about 120 μm, for example. The two second bottom surfaces 121A have rectangular shapes in plan view, and sandwich the first recessed portion 110A. Also, each second bottom surface 121A is connected to a first sloping surface 112A. The two second sloping surfaces 122A surround the two second bottom surfaces 121A and the first recessed portion 110A in plan view, and have substantially rectangular shapes. The second sloping surfaces 122A slope relative to the second bottom surfaces 121A. In the present embodiment, the second sloping surfaces 122A are at an angle of about 55 degrees relative to the xy plane. Note that the fact that the second sloping surfaces 122A have a substantially trapezoidal shape and the angle is 55 degrees is dependent on having adopted the (100) surface as the main surface 101A.

The interconnect layer 200A is for mounting the three orientation sensor elements 311A, 312A and 313A, the integrated circuit element 330A and the two capacitors 343A, and is for constituting a current path between these parts. The interconnect layer 200A is formed on the insulating layer 104A, and, in the present embodiment, has a structure in which a barrier/seed layer 201A and a plating layer 202A are stacked.

The barrier/seed layer 201A is a base layer for forming a desired plating layer 202A, and is formed on the insulating layer 104A. The barrier/seed layer 201A consists of, for example, a Ti layer serving as a barrier layer and a Cu layer serving as a seed layer stacked on the barrier layer that are formed on the insulating layer 104A. The barrier/seed layer 201A is formed by sputtering, for example.

The plating layer 202A is made of Cu, for example, and is formed by electrolytic plating that utilizes the barrier/seed layer 201A. The plating layer 202A has a thickness of about 5 μm, for example.

In the present embodiment, the interconnect layer 200A has a first bottom surface pad 211A, a first sloping surface pad 212A, a second bottom surface pad 213A, an external terminal 221A, and connection paths 231A, 234A, 235A and 236A.

The first bottom surface pad 211A is formed on the first bottom surface 111A of the first recessed portion 110A, and has a rectangular shape, for example. In the present embodiment, six first bottom surface pads 211A are formed. In the present embodiment, the first bottom surface pads 211A are used in order to mount the orientation sensor element 311A and the two capacitors 343A.

The first sloping surface pad 212A is formed on two first sloping surfaces 112A of the first recessed portion 110A, and has a rectangular shape, for example. In the present embodiment, two first sloping surfaces pads 212A are formed on each of the two first sloping surfaces 112A disposed sandwiching the first bottom surface 111A with a space therebetween in the y direction. The two first sloping surfaces pads 212A of each first sloping surface 112A are disposed side-by-side in the x direction. In the present embodiment, the first sloping surface pads 212A are used in order to mount the orientation sensor elements 312A and 313A.

The second bottom surface pad 213A is formed on the two second bottom surfaces 121A of the second recessed portion 120A, and has a rectangular shape, for example. In the present embodiment, on each second bottom surface 121A, eight second bottom surface pads 213A are arrayed in the x direction, and the two second bottom surface pads 213A are disposed with a space therebetween in the x direction. In the present embodiment, the second bottom surface pads 213A are used in order to mount the integrated circuit element 330A.

The external terminal 221A is formed on the main surface 101A, and is used in order to surface mount the semiconductor device 1A to the circuit board of an electronic apparatus, for example. In the present embodiment, four external terminals 221A are formed in each of two regions of the main surfaces 101A that are disposed sandwiching the recessed portion 105A with a space therebetween in the y direction. Also, one side of each external terminal 221A is in contact with the outer edge of the recessed portion 105A. The external terminal 221A are configured to have a structure in which a bump obtained by further electroless plating a metal such as Ni, Pd or Au, for example, is formed on the abovementioned barrier/seed layer 201A and plating layer 202A. As shown in FIGS. 48 and 49, the external terminal 221A is thereby formed to budge in the z direction.

The connection paths 231A, 234A, 235A and 236A are for constituting paths that electrically connect the first bottom surface pads 211A, the first sloping surface pads 212A, the second bottom surface pads 213A and the external terminals 221A to each other.

The connection paths 231A constitute paths from the main surface 101A to the second bottom surfaces 121A, and mainly electrically connect the external terminals 221A to the second bottom surface pads 213A. As shown in FIG. 47, each connection paths 231A reaches the second bottom surface 121A via the second sloping surface 122A of the second recessed portion 120A. The portion of each connection path 231A formed on the second sloping surface 122A extends in the y direction in plan view, and does not slope relative to the y direction.

The connection paths 234A constitute paths from the second bottom surfaces 121A to the first sloping surfaces 112A, and electrically connect the second bottom surface pads 213A to the first sloping surface pads 212A. In the present embodiment, some of the connection paths 234A extend linearly in the y direction in plan view. Also, other connection paths 234A are in a bent state on the first sloping surfaces 112A.

The connection paths 235A constitute paths that reach to the first bottom surface 111A from the second bottom surfaces 121A via the first sloping surfaces 112A, and electrically connect the second bottom surface pads 213A to the first bottom surface pads 211A. In the present embodiment, some of the connection paths 235A extend linearly in the y direction in plan view. Also, other connection paths 235A are in a bent state on one of the second bottom surfaces 121A, the first sloping surfaces 112A and the first bottom surface 111A.

The connection paths 236A constitute the paths from the first sloping surfaces 112A to the first bottom surface 111A, and electrically connect the first sloping surface pads 212A to the first bottom surface pads 211A. In the present embodiment, the connection paths 236A extend from one first sloping surface pad 212A to a plurality of first bottom surface pads 211A. Also, the connection paths 236A are in a bent state on the first bottom surface 111A.

Note that, in the present embodiment, the external terminal 221A that is located second from the left in the upper portion of FIG. 47 is a ground terminal. Also, the connection paths 231A, the second bottom surface pads 213A, the connection paths 234A, the first sloping surface pads 212A, the connection paths 236A, and the first bottom surface pads 211A that are electrically connected to this external terminal 221A are connected to ground.

The three orientation sensor elements 311A, 312A and 313A have detection reference axes that extend in different directions to each other, and are used in order to detect the attitude of the semiconductor device 1A relative to geomagnetism, for example. In the present embodiment, the orientation sensor elements 311A, 312A and 313A have magnetic cores 314A, 315A and 316A, as shown in FIG. 47. The magnetic cores 314A, 315A and 316A are metal rod-like members that extend in predetermined directions, and the longitudinal directions thereof correspond to the detection reference axes of the orientation sensor elements 311A, 312A and 313A. The orientation sensor elements 311A, 312A and 313A further have coils (not shown) formed so as to surround the magnetic cores 314A, 315A and 316A. The orientation sensor elements 311A, 312A and 313A have a thickness of about 80 μm, for example.

In the present embodiment, the orientation sensor element 311A is supported by the first bottom surface 111A, and is mounted via solder 351A using three first bottom surface pads 211A. As a result of this form of mounting, the magnetic core 314A of the orientation sensor element 311A extends in the x direction.

The orientation sensor element 312A is supported by the first sloping surface 112A in the upper portion of FIG. 47, and is mounted via solder 351A using three first sloping surface pads 212A. As a result of this form of mounting, the magnetic core 315A of the orientation sensor element 312A is at a right angle to the x direction, and extends in a direction that is included in an yz plane. This direction is parallel to the first sloping surface 112A that supports the orientation sensor element 312A.

The orientation sensor element 313A is supported by the first sloping surface 112A in the lower portion of FIG. 47, and is mounted via solder 351A using three first sloping surface pads 212A. As a result of this form of mounting, the magnetic core 316A of the orientation sensor element 313A is at a right angle to the x direction, and extends in a direction that is included in an yz plane. This direction is parallel to the first sloping surface 112A that supports the orientation sensor element 313A.

Also, in the present embodiment, the orientation sensors 311A, 312A and 313A have a top surface located on an opposite side to a bottom surface on the substrate 100A side that is smaller than the bottom surface. Also, the lateral surfaces connecting the bottom surface and the top surface slope relative to a direction in which the bottom surface and the top surface are spaced from each other.

The integrated circuit element 330A is for controlling orientation detection processing that uses the three orientation sensor elements 311A, 312A and 313A. In the present embodiment, the integrated circuit element 330A is constituted as an ASIC (application-specific integrated circuit) element and has a thickness of about 80 to 100 μm.

The integrated circuit element 330A is supported by the second bottom surfaces 121A, and is mounted via solder 351A utilizing the second bottom surface pads 213A. As shown in FIG. 47, the integrated circuit element 330A is in a state of being supported on two sides, as a result of being mounted using a plurality of second bottom surface pads 213A disposed with a space therebetween in the y direction. Also, the integrated circuit element 330A covers most of the first recessed portion 110A except for a portion thereof in plan view. Also, the integrated circuit element 330A, in plan view, entirely overlaps with the orientation sensor elements 311A and 312A, and partially overlaps with the orientation sensor element 313A. Also, the integrated circuit element 330A also overlaps with the two capacitors 343A. As shown in FIGS. 48 and 49, the integrated circuit element 330A is contained within the second recessed portion 120A in the z direction.

Direction detection processing by the integrated circuit element 330A using the orientation sensor elements 311A, 312A and 313A is performed as follows, for example.

As described above, the orientation sensor elements 311A, 312A and 313A have magnetic cores 314A, 315A and 316A that are each surrounded by a coil. As a result of the orientation sensor elements 311A, 312A and 313A being mounted in the abovementioned form, the orientation sensor elements 311A, 312A and 313A, that is, the magnetic cores 314A, 315A and 316A, extend in different directions to each other. The directions in which these magnetic cores 314A, 315A and 316A extend are stored as known information in the integrated circuit element 330A.

The two capacitors 343A are disposed on the first bottom surface 111A, and are disposed sandwiching the orientation sensor element 311A with a space therebetween in the x direction. The two capacitors 343A and the orientation sensor element 311A are thereby disposed side-by-side in the x direction.

The semiconductor device 1A is able to three dimensionally detect the attitude of the semiconductor device 1A relative to geomagnetism, by using the orientation sensor elements 311A, 312A and 313A based on a technique disclosed in JP-A-2006-47267, for example (3-axis detection). The integrated circuit element 330A outputs the orientation detection result of the semiconductor device 1A as a signal, in response to an external instruction from the external terminals 221A or autonomously.

The sealing resin 400A covers the orientation sensor elements 311A, 312A and 313A, the integrated circuit element 330A and the two capacitors 343A, and fills the recessed portion 105A. In the present embodiment, the sealing resin 400A consists of a first sealing resin 410A and a second sealing resin 420A. Both end faces of the sealing resin 400A in the x direction are exposed from the substrate 100A. Also, both end faces of the sealing resin 400A in the x direction are flush with the two lateral surfaces 106A of the substrate 100A.

The first sealing resin 410A largely fills the first recessed portion 110A, and completely covers the orientation sensor elements 311A, 312A and 313A and the two capacitors 343A. On the other hand, the first sealing resin 410A does not cover the second bottom surface pads 213A or the integrated circuit element 330A.

The second sealing resin 420A largely fills the second recessed portion 120A, and completely covers the integrated circuit element 330A. On the other hand, the second sealing resin 420A leaves the external terminals 221A exposed. Also, the second sealing resin 420A is provided in a position slightly removed inwardly from the outer edge of the substrate 100A in the y direction in plan view.

Exemplary materials of the first sealing resin 410A and the second sealing resin 420A include epoxy resin, phenol resin, polyimide resin, polybenzoxazole (PBO) resin, and silicone resin. The first sealing resin 410A and the second sealing resin 420A may be either translucent resins or opaque resins, but in the present embodiment are preferably opaque resins.

Next, a method for making the semiconductor device 1A will be described below, with reference to FIGS. 51 to 71. Note that in these diagrams, a cross-section in an yz plane along a line XLVIII-XLVIII in FIG. 47 is shown.

Figure 51:
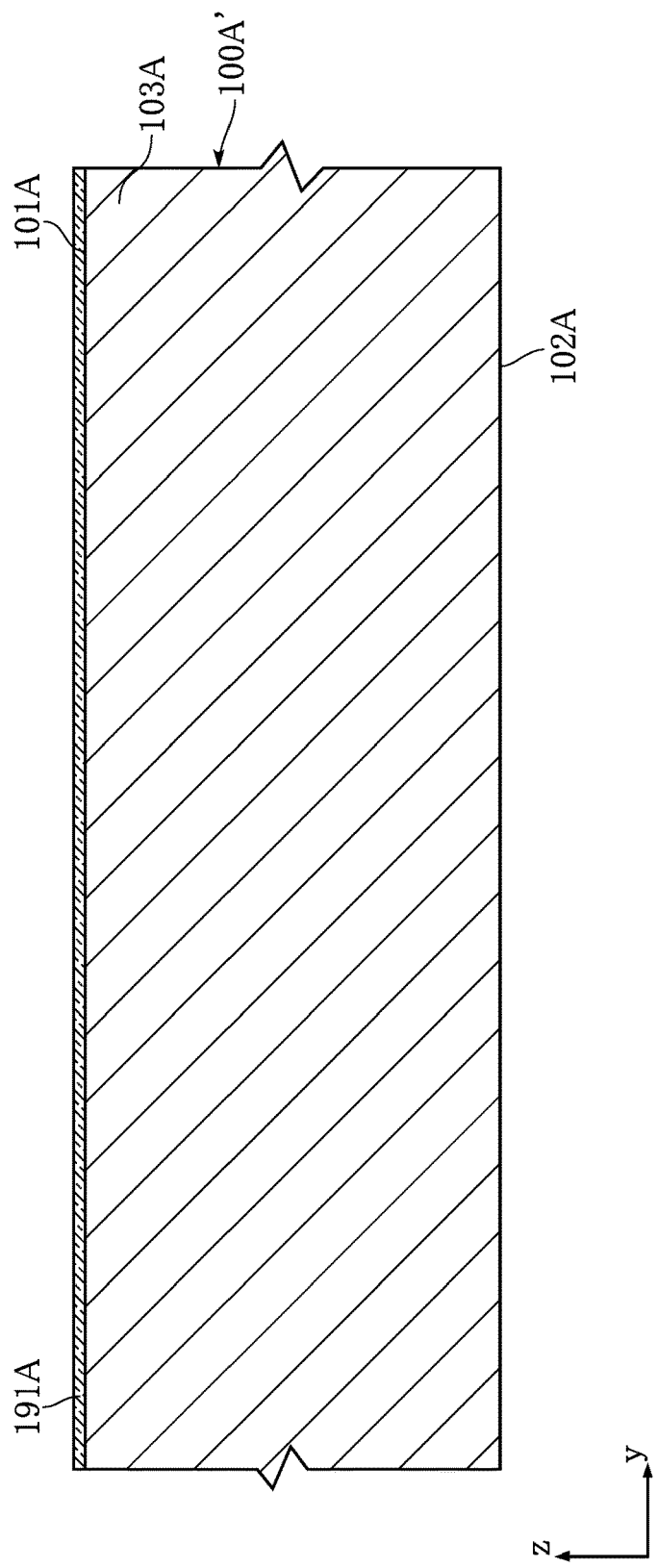
FIG. 51 is a cross-sectional view showing a main section of an exemplary method for making the semiconductor device of FIG. 46.

First, a substrate material 100A' is prepared as shown in FIG. 51. The substrate material 100A' is made of a single-crystal semiconductor material, and, in the present embodiment, is made of single-crystal Si. The substrate material 100A' has a thickness of about 600 μm, for example. The substrate material 100A' is of a size that enables a plurality of substrates 100A of the abovementioned semiconductor device 1A to be obtained. That is, the following manufacturing process is premised on batch manufacturing a plurality of electronic devices A1. Although a method for making one electronic device A1 is possible, a technique for batch manufacturing a plurality of electronic devices A1 is more realistic when industrial efficiency is taken into consideration.

The substrate material 100A' has a main surface 101A and a back surface 102A that face in opposite directions to each other in the z direction. In the present embodiment, a surface having a crystal orientation of (100), that is, a (100) surface, is adopted as the main surface 101A. Next, a mask layer 191A made of $SiO_2$ is formed by oxidizing the main surface 101A. The mask layer 191A has a thickness of about 0.7 to 1.0 μm, for example.

Figure 52:
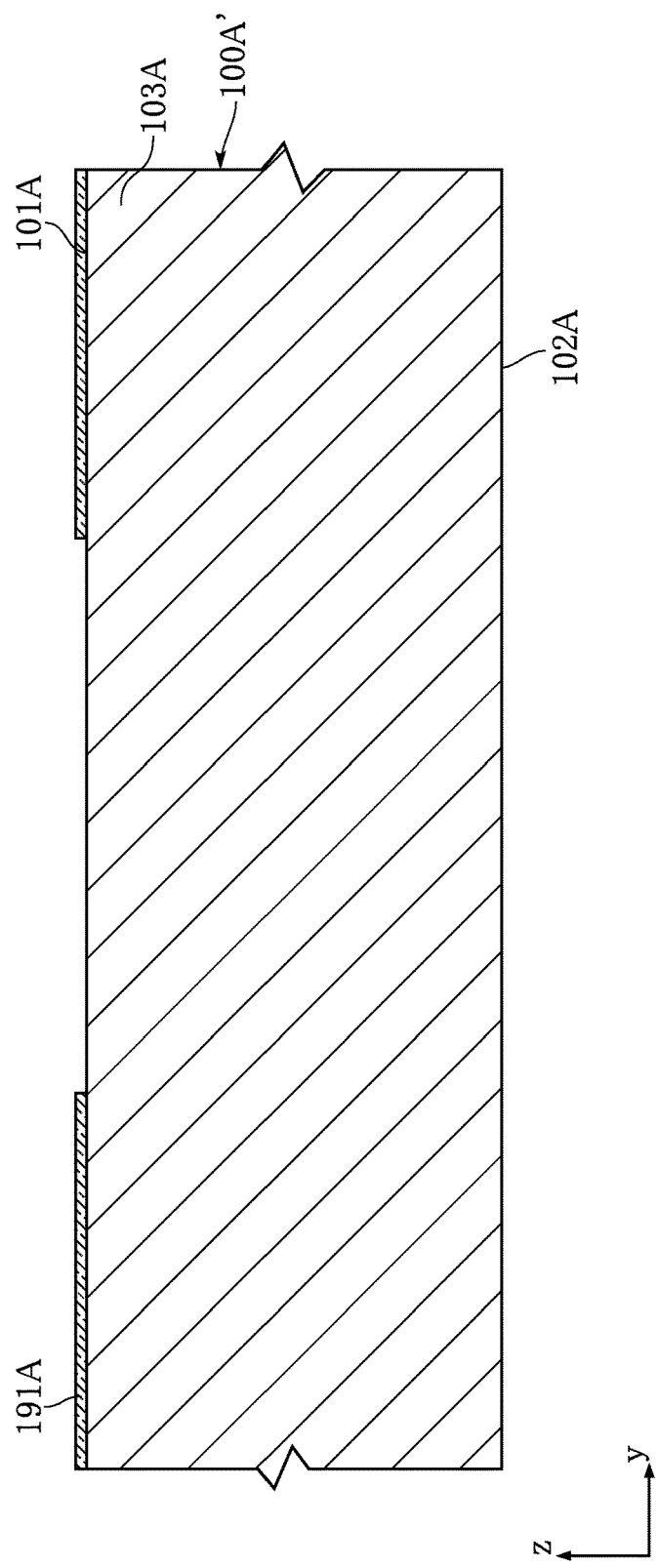
FIG. 52 is a cross-sectional view showing a main section of an exemplary method for making the semiconductor device of FIG. 46.

Next, as shown in FIG. 52, patterning is performed by etching, for example, on the mask layer 191A. Stripe-shaped openings that each extend the x direction and are spaced from each other in the y direction are thereby formed in the mask layer 191A. The shape and size of these openings are set according to the shape and size of the first recessed portion 110A that is to ultimately be obtained. Note that, in the diagram, a single cross-section of a plurality of stripe-shaped openings is shown.

Figure 53:
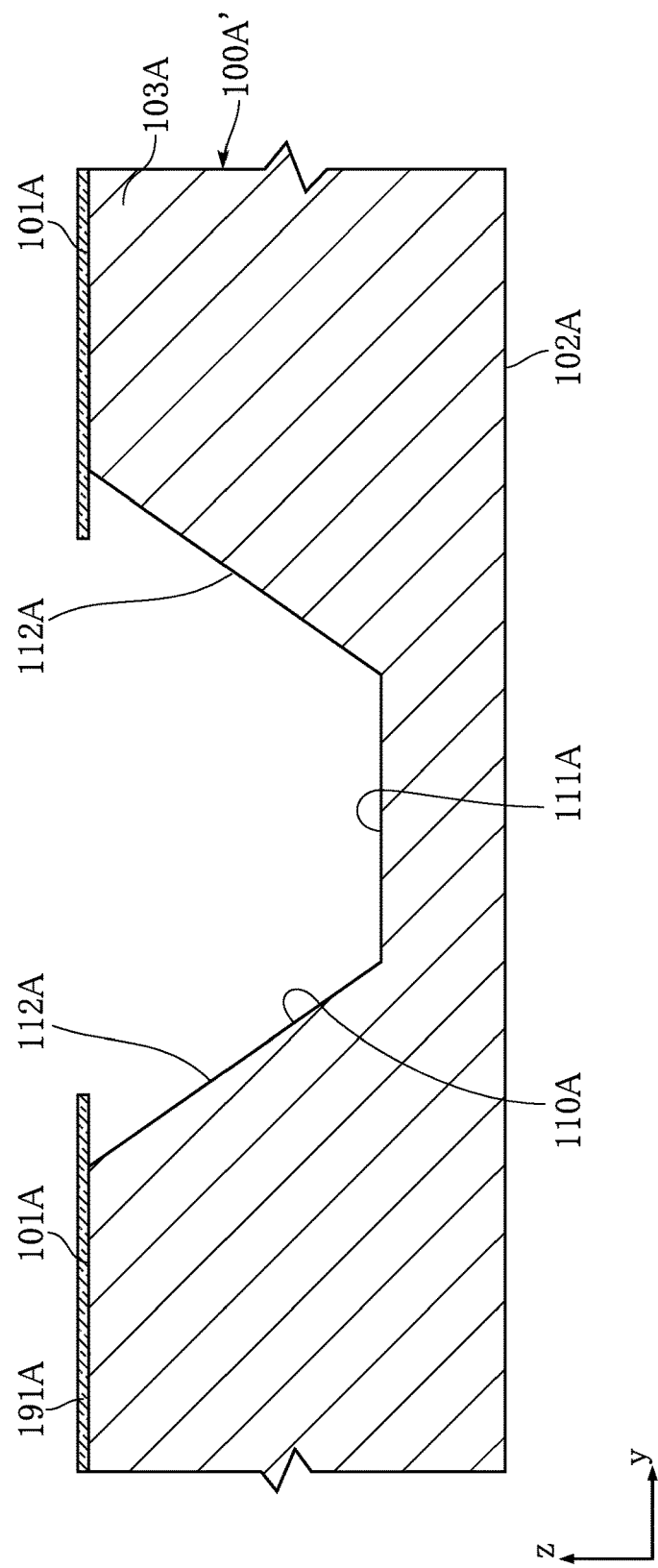
FIG. 53 is a cross-sectional view showing a main section of an exemplary method for making the semiconductor device of FIG. 46.

Next, as shown in FIG. 53, the first recessed portion 110A is formed. The first recessed portion 110A is formed by anisotropic etching using KOH, for example. KOH is an example of alkali etching solution that can realize favorable anisotropic etching on single-crystal Si. By performing this anisotropic etching, a first recessed portion 110A having a first bottom surface 111A, two first sloping surfaces 112A, and two sloping surfaces (not shown) that connect end portions of the two first sloping surfaces 112A is formed.

Alternatively, note that the two sloping surfaces need not be formed in the case where both ends of the mask layer 191A in the x direction reach to both ends of substrate material 100A' in the x direction. The two first sloping surfaces 112A corresponds to the long sides of the stripe-shaped openings that extend in the x direction, and are elongated in the x direction. The first bottom surface 111A is also elongated in the x direction. The first sloping surfaces 112A are at an angle of about 55 degrees relative to the xy plane.

Figure 54:
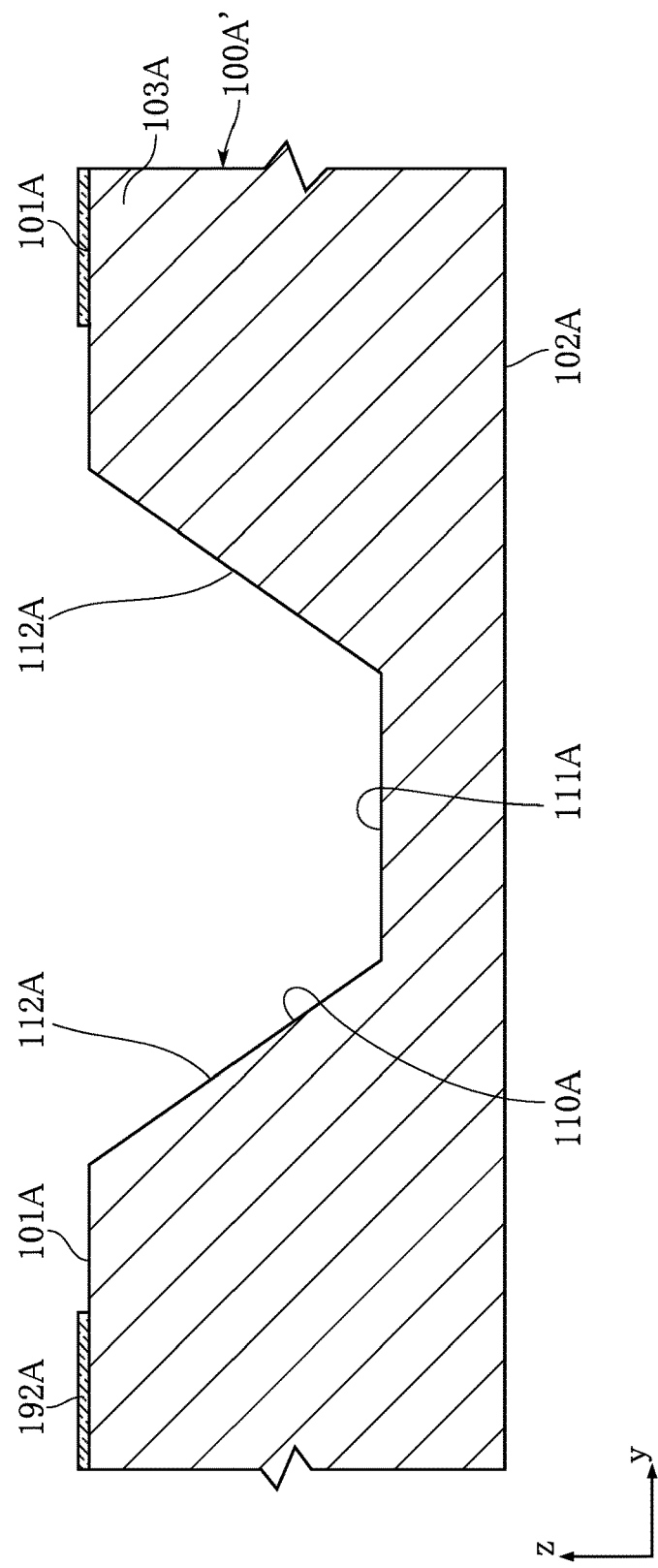
FIG. 54 is a cross-sectional view showing a main section of an exemplary method for making the semiconductor device of FIG. 46.

Next, as shown in FIG. 54, a mask layer 192A is formed by further patterning performed on the mask layer 191A. The mask layer 192A has a plurality of stripe-shaped openings whose width in the y direction is greater than the mask layer 191A, and the area of the openings is greater than the mask layer 191A. The shape and size of these openings are set according to the shape and size of the second recessed portion 120A that is to ultimately be obtained.

Figure 55:
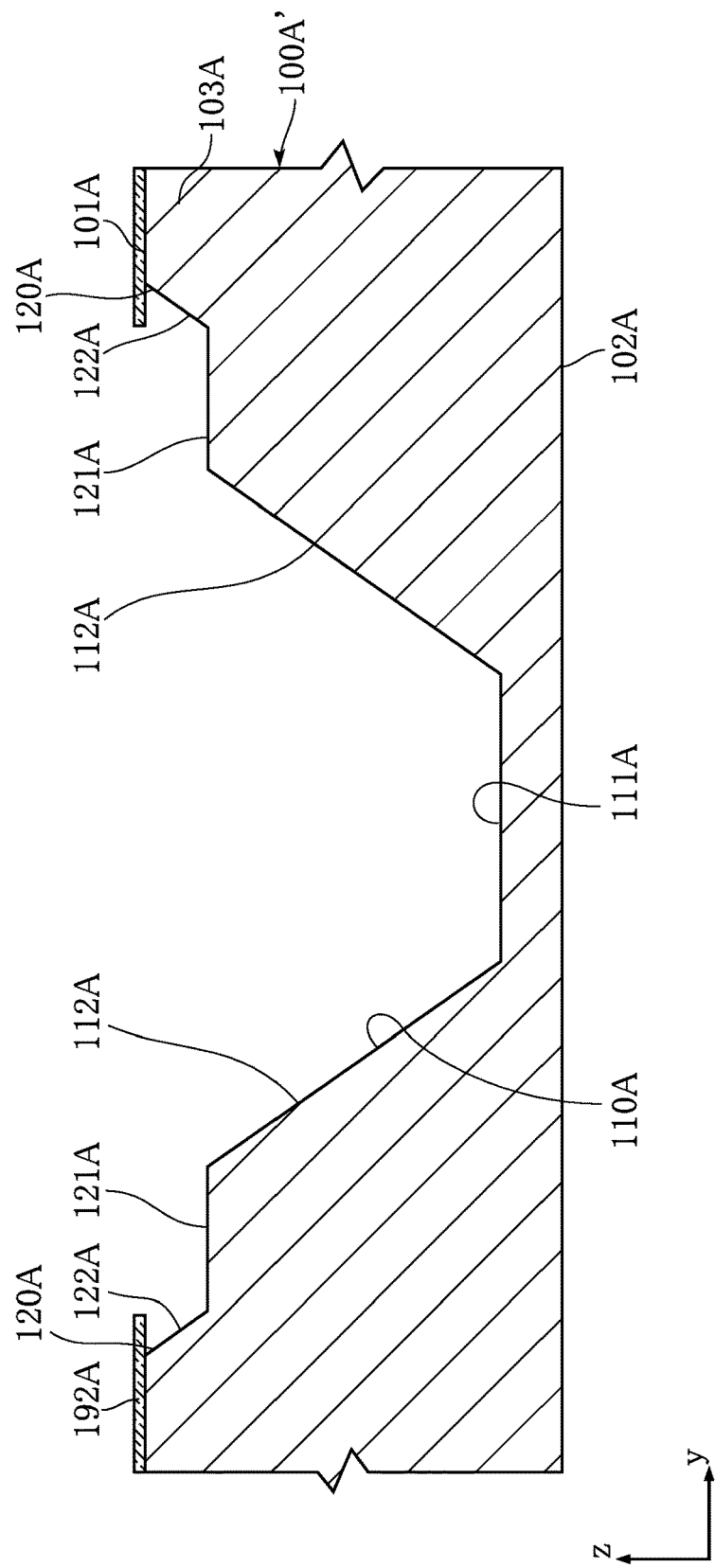
FIG. 55 is a cross-sectional view showing a main section of an exemplary method for making the semiconductor device of FIG. 46.

Next, as shown in FIG. 55, a recessed portion 105A is formed. To form the recessed portion 105A, abovementioned anisotropic etching using KOH, for example, is performed. As a result of this anisotropic etching, the first recessed portion 110A larger and deeper, and the second recessed portion 120A is newly formed. The second recessed portion 120A has a second bottom surface 121A and two second sloping surfaces 122A. Note that the second bottom surface 121A at this stage can take a configuration in which two second bottom surfaces 121A sandwich the first recessed portion 110A in the y direction. Alternatively, the second bottom surface 121A can be an elongated rectangular ring shape that surrounds the first recessed portion 110A. The second sloping surfaces 122A are at an angle of about 55 degrees with the xy plane, similarly to the first sloping surfaces 112A. Through undergoing anisotropic etching twice as described above, a two-stepped recessed portion 105A having a first recessed portion 110A and a second recessed portion 120A is formed. In the present embodiment, the first recessed portion 110A has a depth of about 400 µm, and the second recessed portion 120A has a depth of about 120 µm.

Figure 56:
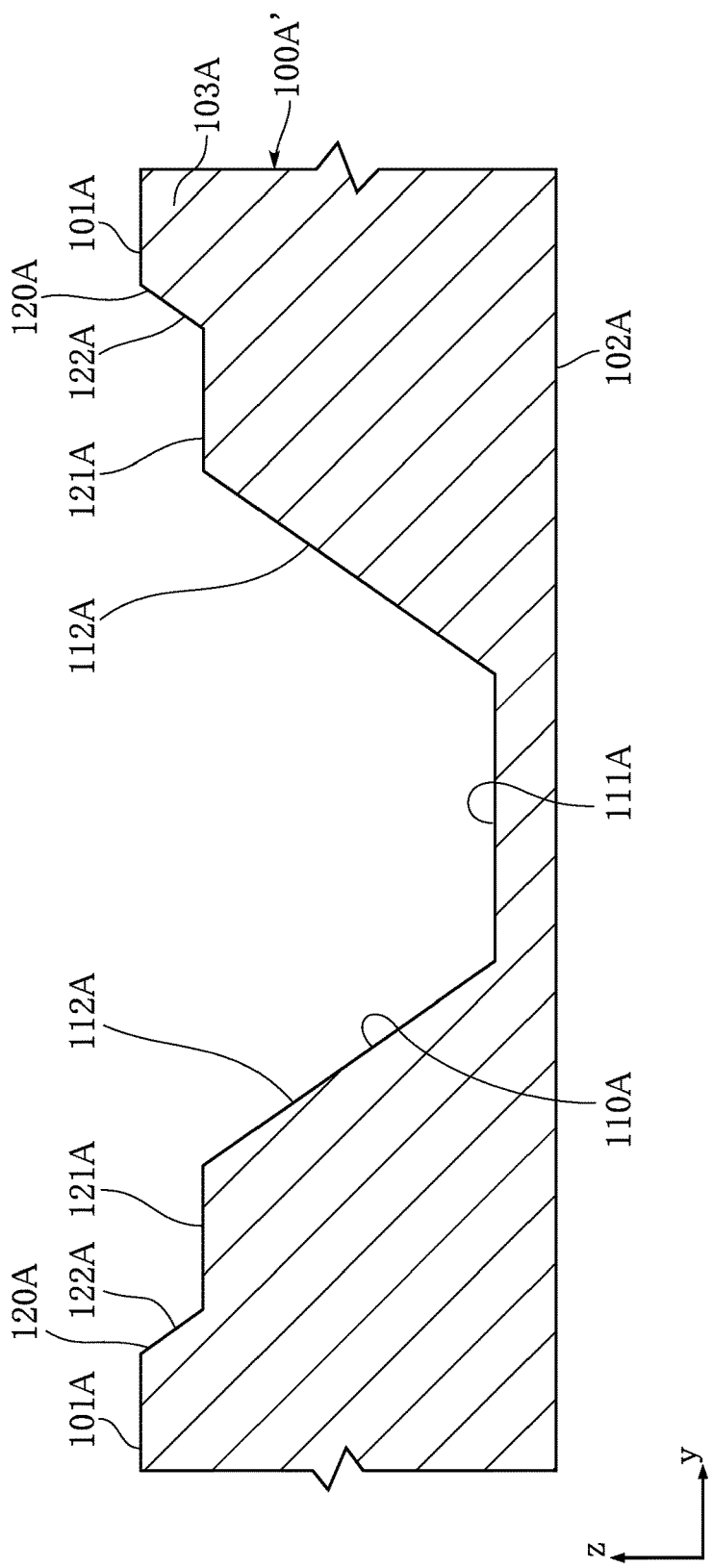
FIG. 56 is a cross-sectional view showing a main section of an exemplary method for making the semiconductor device of FIG. 46.
Figure 57:
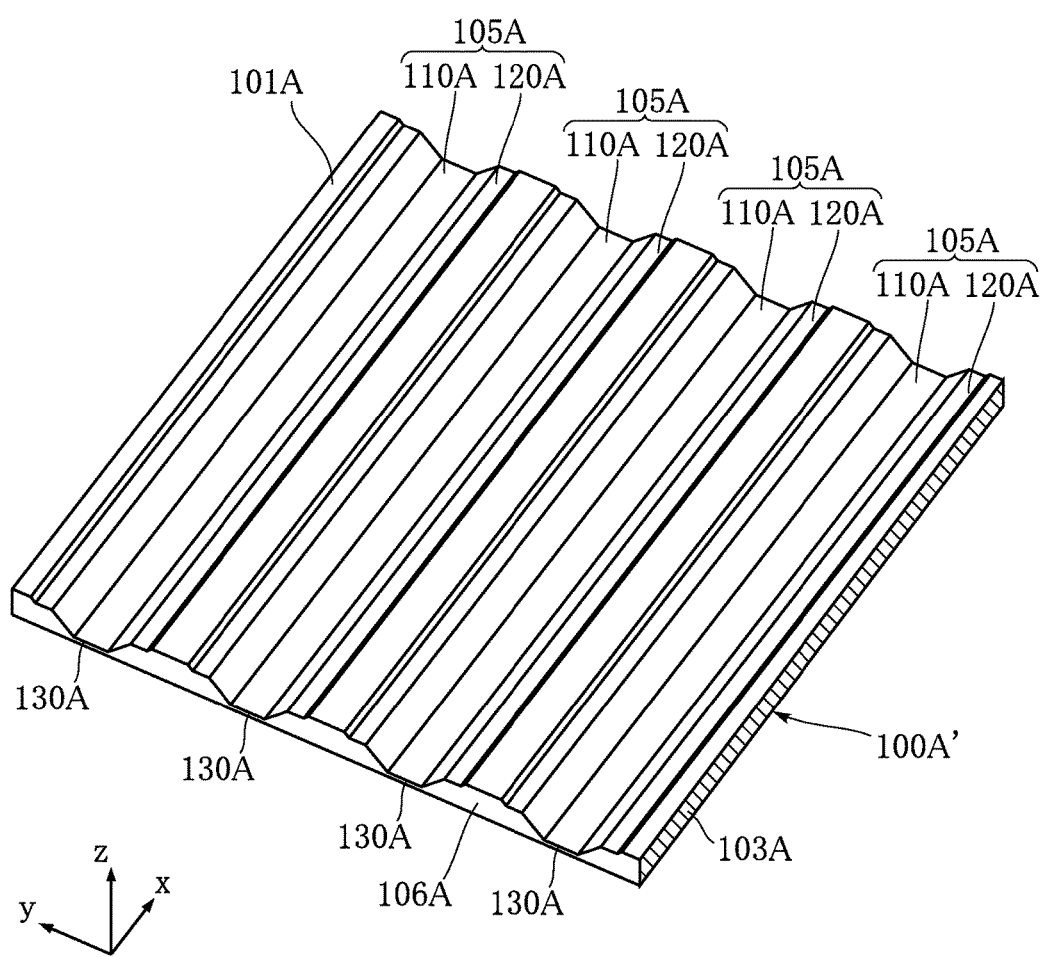
FIG. 57 is a perspective diagram showing a main section of an exemplary method for making the semiconductor device of FIG. 46.

Next, as shown in FIG. 56, the mask layer 192A is removed. This removal is performed by etching using HF, for example. At this time, the substrate material 100A' will be configured with a plurality of recessed portions 105A disposed in parallel to each other, as shown in FIG. 57. Note that, in this diagram, a portion of the substrate material 100A' in the x direction and the y direction is shown.

Figure 58:
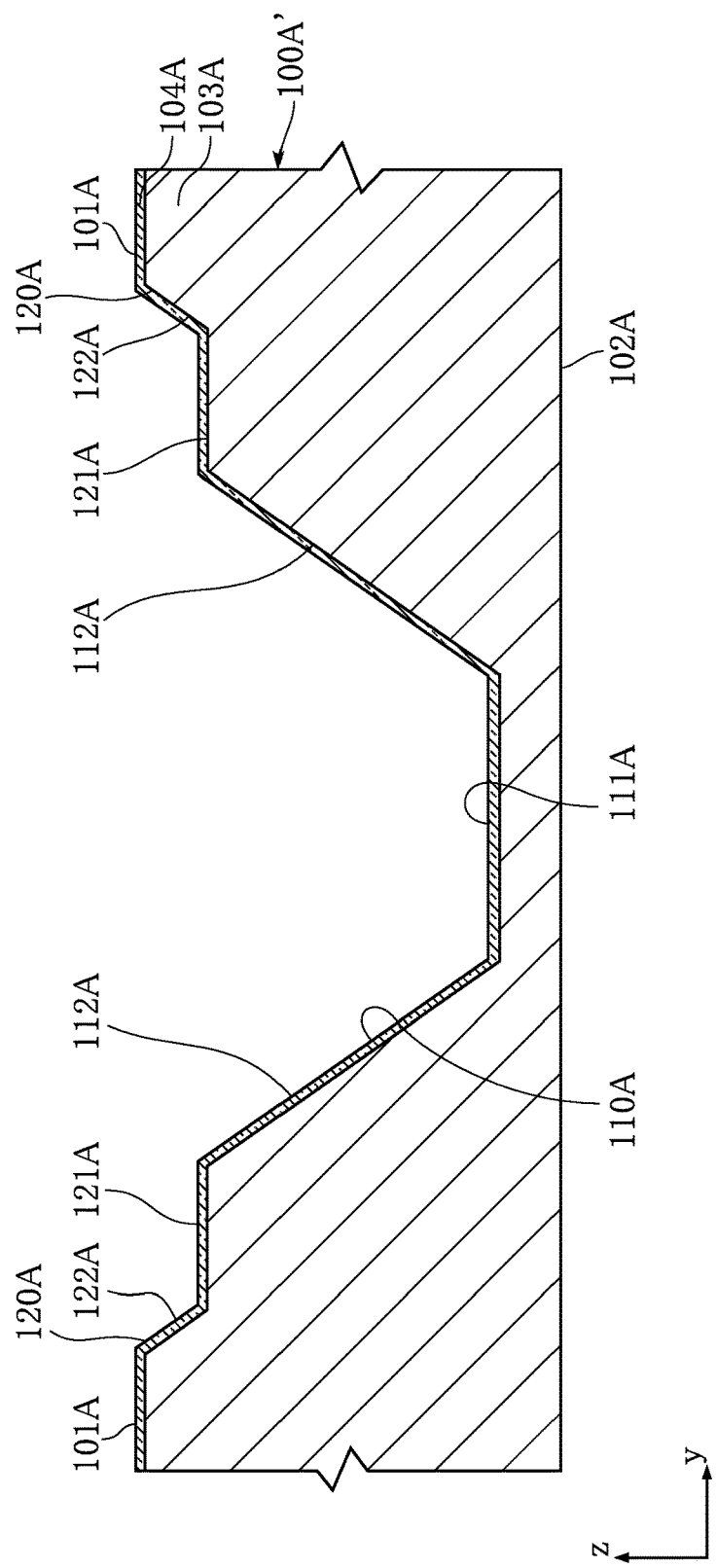
FIG. 58 is a cross-sectional view showing a main section of an exemplary method for making the semiconductor device of FIG. 46.

Next, as shown in FIG. 58, an insulating layer 104A made of SiO$_2$, for example, is formed. The insulating layer 104A is formed by oxidizing the entire substrate material 100A' on the opposite side to the back surface 102A. An insulating layer 104A having a thickness of about 0.7 to 1.0 µm is thereby obtained.

Figure 59:
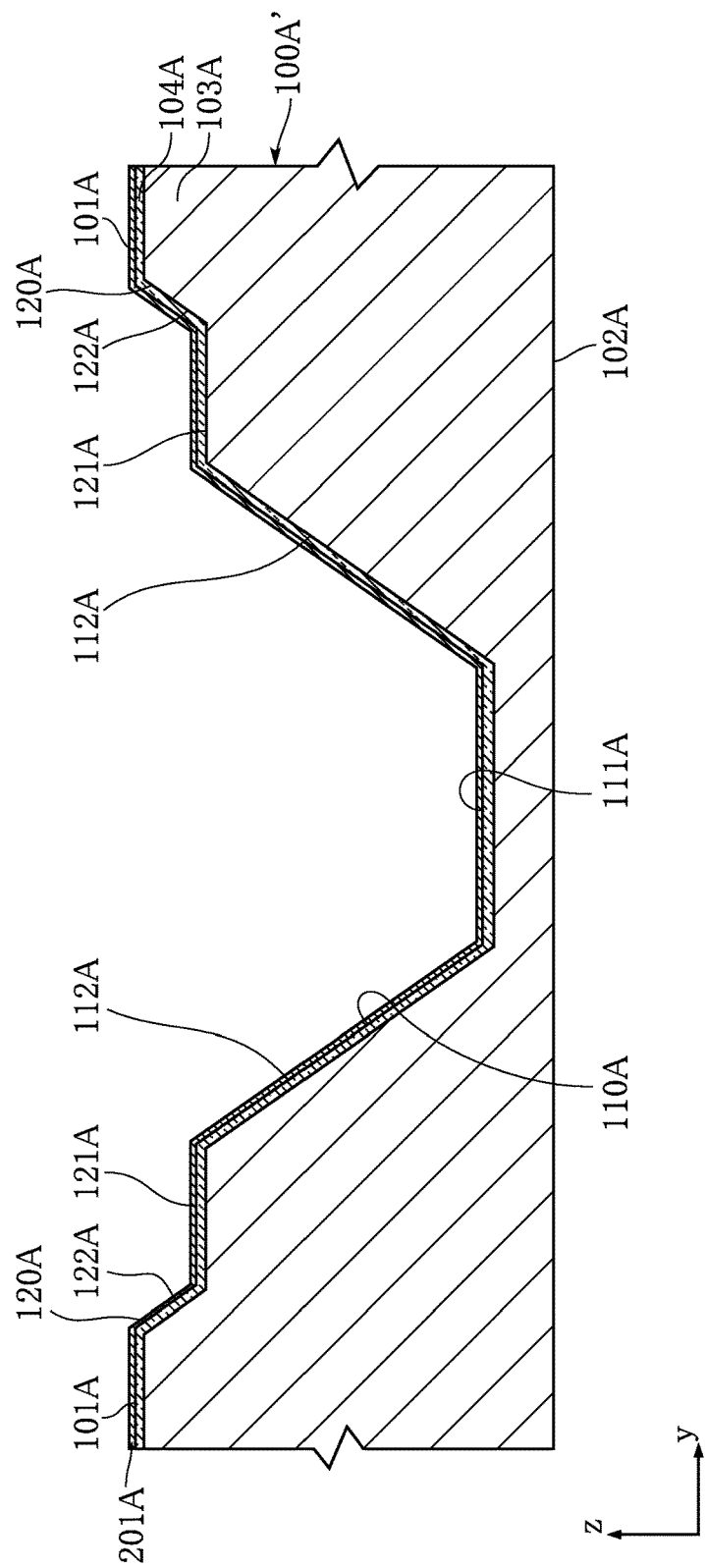
FIG. 59 is a cross-sectional view showing a main section of an exemplary method for making the semiconductor device of FIG. 46.

Next, as shown in FIG. 59, a barrier/seed layer 201A is formed. The barrier/seed layer 201A is formed by sputtering, for example. Specifically, a layer made of Ti is formed by sputtering on the insulating layer 104A. This layer made of Ti functions as a barrier layer. Next, a layer made of Cu is formed by sputtering on the barrier layer. This layer made of Cu functions as a seed layer. The barrier/seed layer 201A is obtained by such sputtering.

Figure 60:
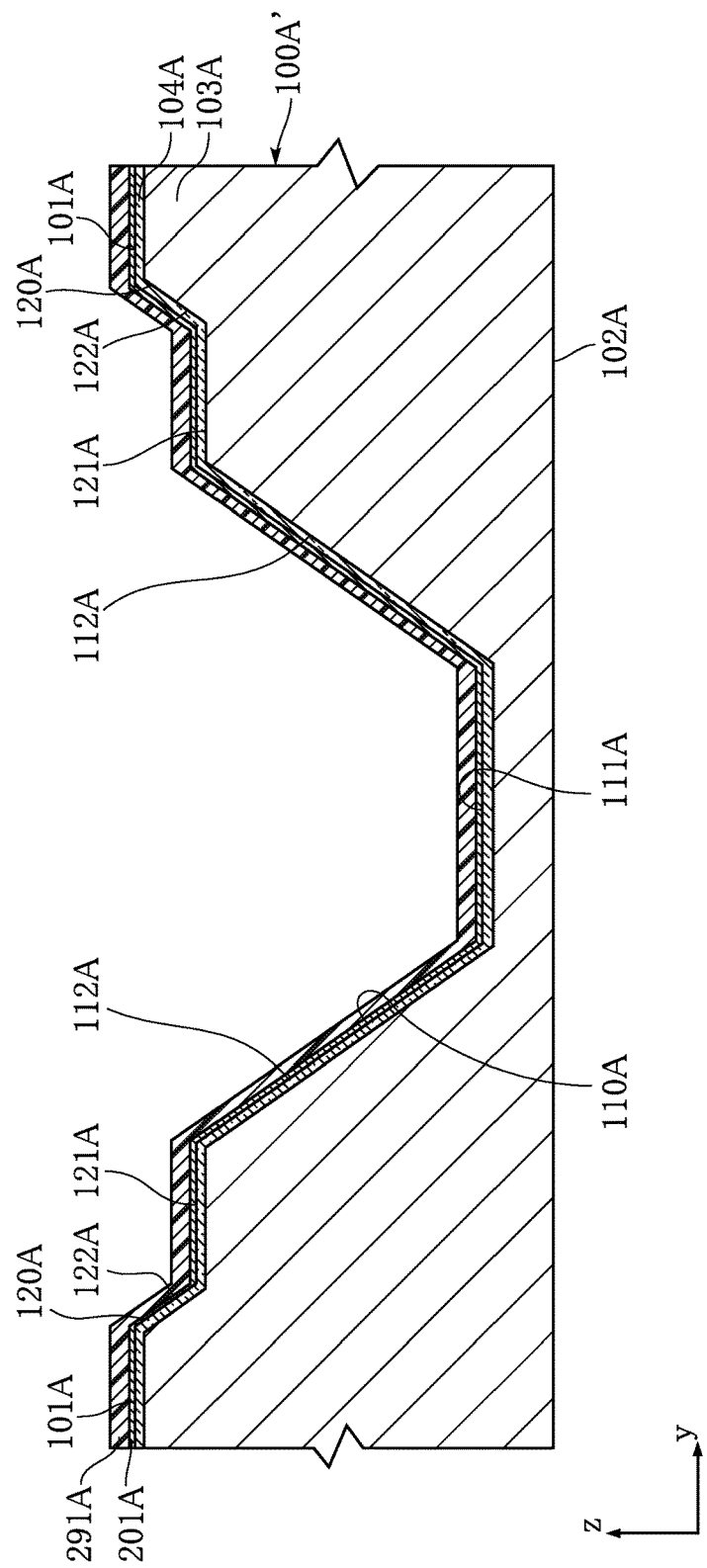
FIG. 60 is a cross-sectional view showing a main section of an exemplary method for making the semiconductor device of FIG. 46.

Next, as shown in FIG. 60, a mask layer 291A is formed. The mask layer 291A is formed by spray application of a photosensitive resist resin, for example.

Figure 61:
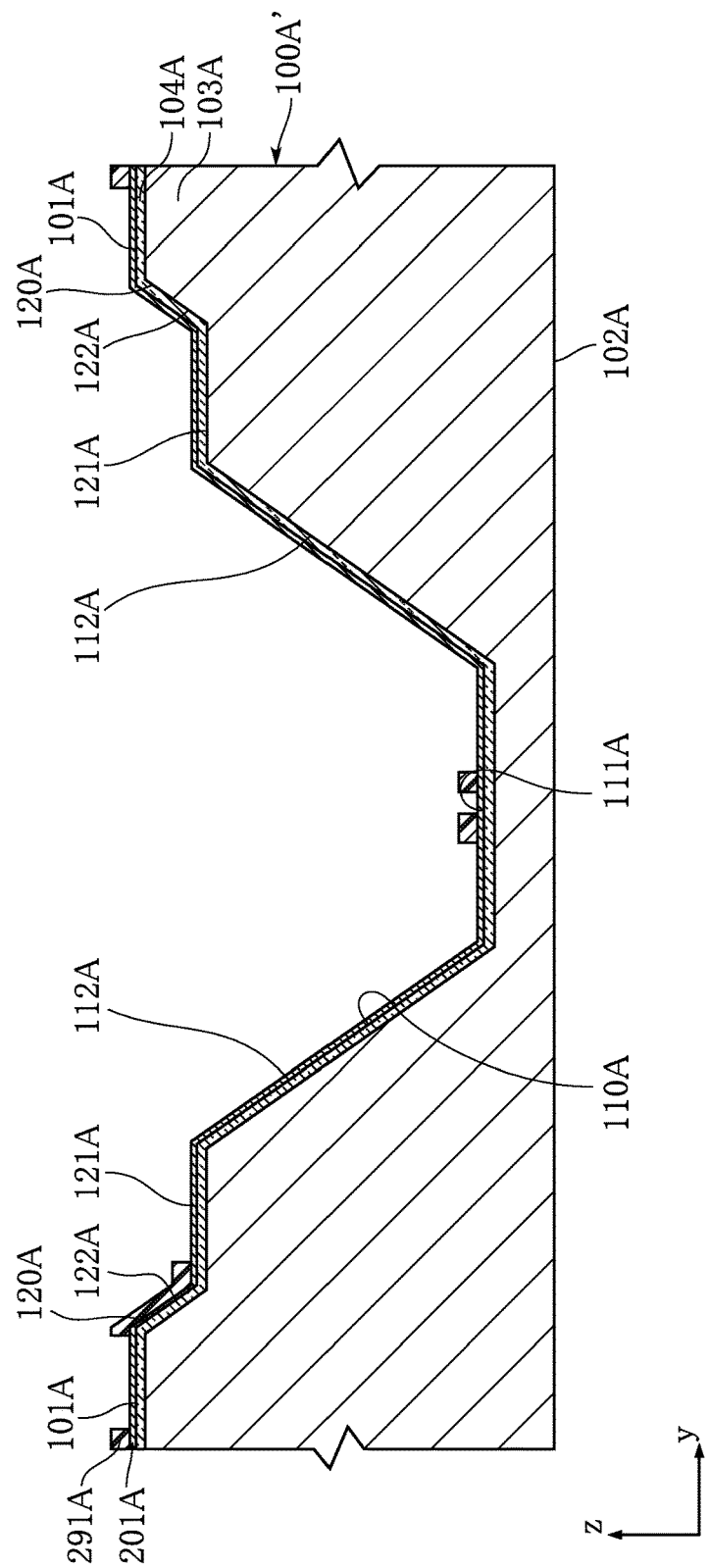
FIG. 61 is a cross-sectional view showing a main section of an exemplary method for making the semiconductor device of FIG. 46.

Next, as shown in FIG. 61, the mask layer 291A is patterned. This patterning is performed by removing a desired portion through performing exposure and development using a photolithography technique, for example, on the mask layer 291A. The shape of the mask layer 291A obtained by this patterning corresponds to the shape of the abovementioned interconnect layer 200A. Note that a plurality of exposures may be performed, while changing the focal depth of the exposure, in correspondence with the recessed portion 105A having a given depth.

Figure 62:
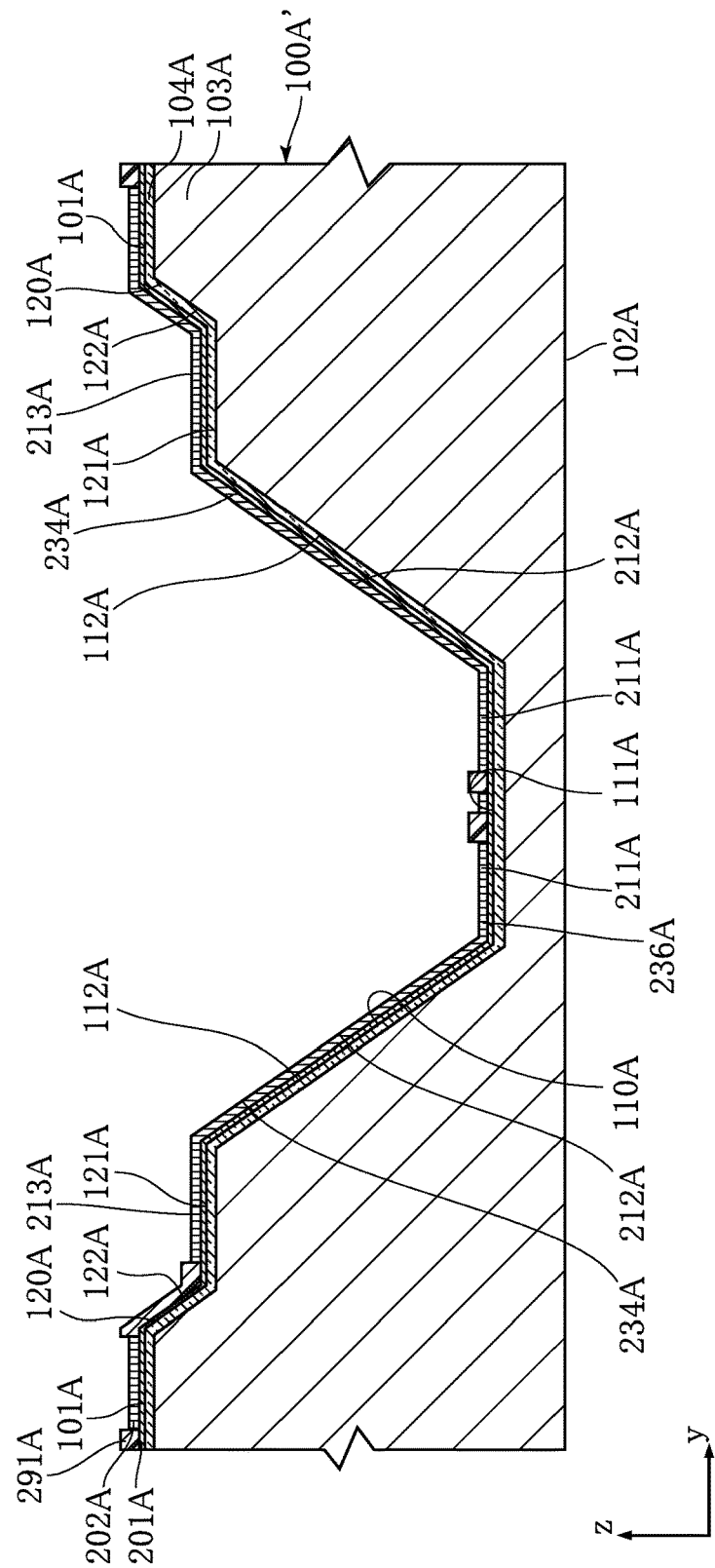
FIG. 62 is a cross-sectional view showing a main section of an exemplary method for making the semiconductor device of FIG. 46.

Next, as shown in FIG. 62, a plating layer 202A is formed. The plating layer 202A is formed by electrolytic plating using the seed layer of the barrier/seed layer 201A, for example. As a result, a plating layer 202A made of Cu, for example, is obtained. The plating layer 202A has a thickness of about 5 µm, for example. The plating layer 202A has the shape of the abovementioned interconnect layer 200A.

Figure 63:
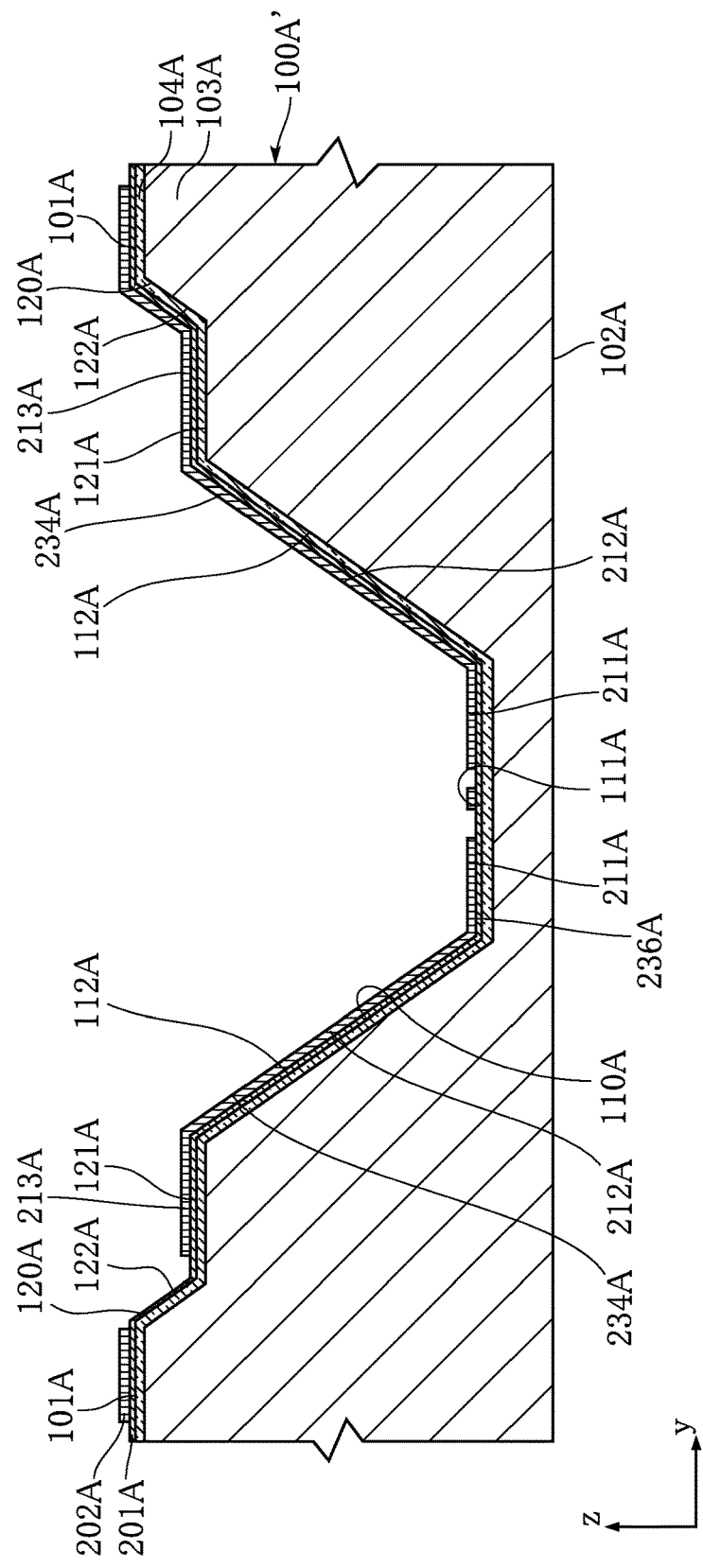
FIG. 63 is a cross-sectional view showing a main section of an exemplary method for making the semiconductor device of FIG. 46.

Next, as shown in FIG. 63, the mask layer 291A is removed.

Figure 64:
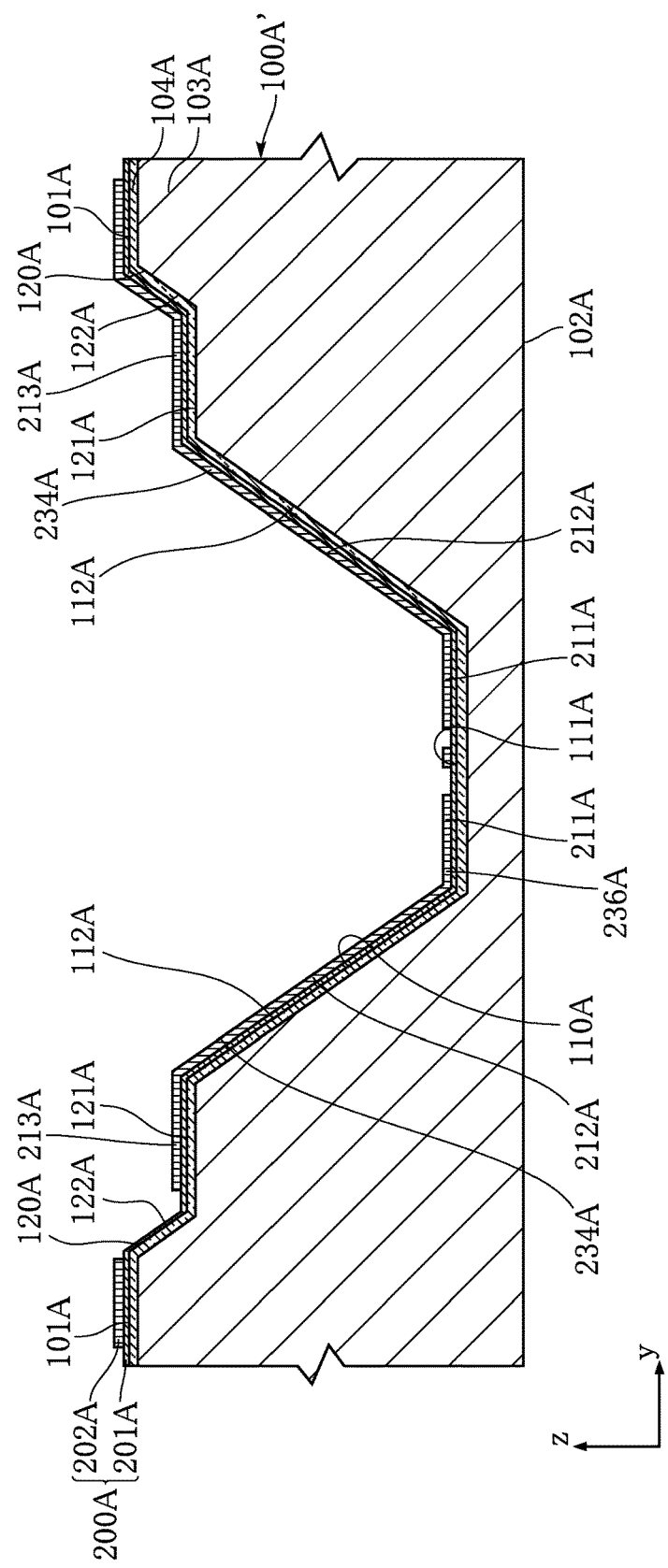
FIG. 64 is a cross-sectional view showing a main section of an exemplary method for making the semiconductor device of FIG. 46.

Next, as shown in FIG. 64, the portion of the barrier/seed layers 201A exposed from the plating layer 202A is removed. Removal of the barrier/seed layer 201A is performed by wet etching, for example. An interconnect layer 200A consisting of the barrier/seed layer 201A and the plating layer 202A that have both been patterned is thereby obtained.

Figure 65:
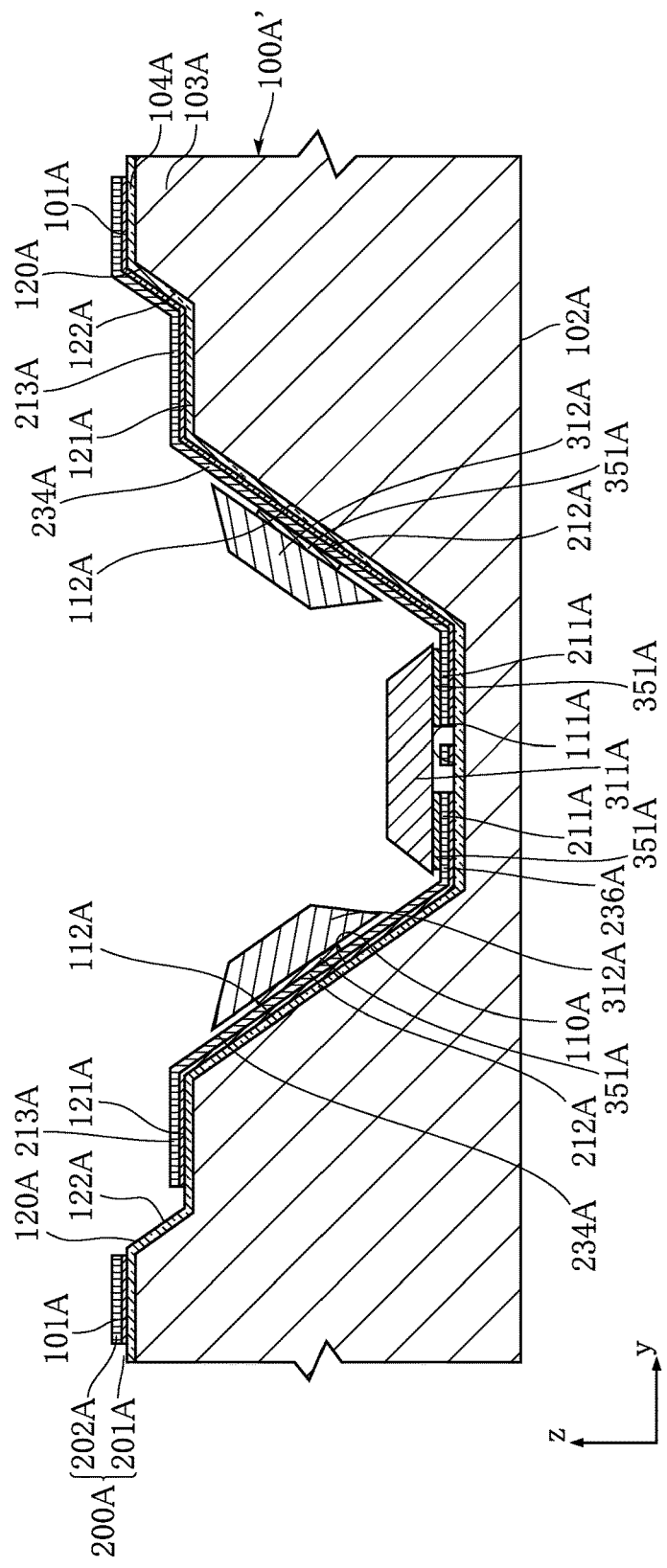
FIG. 65 is a cross-sectional view showing a main section of an exemplary method for making the semiconductor device of FIG. 46.

Next, as shown in FIG. 65, the orientation sensor elements 311A, 312A and 313A are mounted. Solder balls that will form the solder 351A are formed on the orientation sensor elements 311A, 312A and 313A. Also, flux is applied to these solder balls. The orientation sensor element 311A is placed on the first bottom surface 111A, and the orientation sensor elements 312A and 313A are placed on the first sloping surfaces 112A, utilizing the adhesiveness of this flux. Mounting of the orientation sensor elements 311A, 312A and 313A is completed by melting the solder balls in a reflow furnace and then setting the melted solder. Also, two capacitors 343A are mounted on the first bottom surface 111A. A plurality of sets of elements are similarly mounted in each recessed portion 105A at a uniform pitch in the x direction, with each set of elements consisting of the orientation sensor elements 311A, 312A and 313A and two capacitors 343A. Mounting of a plurality of sets of elements for constituting a plurality of semiconductor devices 1A is thereby completed.

Figure 66:
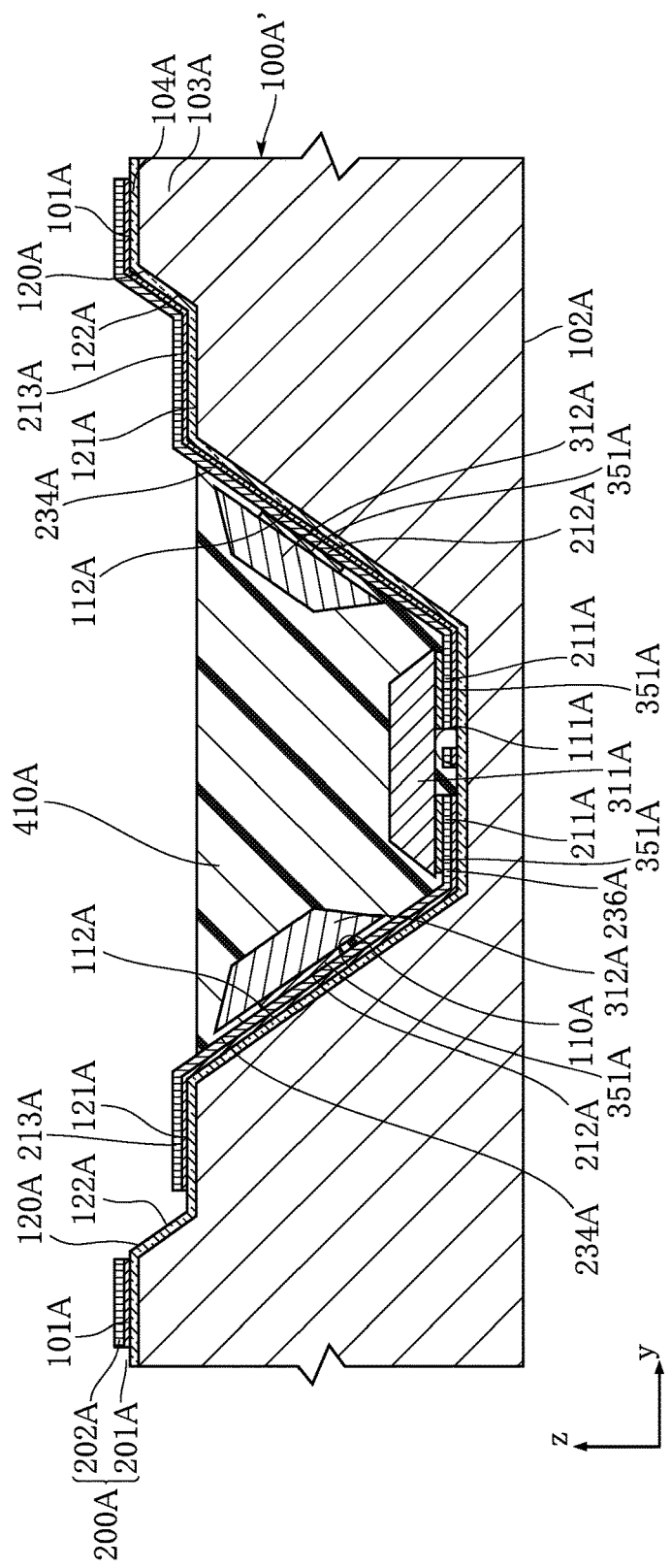
FIG. 66 is a cross-sectional view showing a main section of an exemplary method for making the semiconductor device of FIG. 46.

Next, as shown in FIG. 66, a first sealing resin 410A is formed. The first sealing resin 410A is formed by mainly filling the first recessed portion 110A with a photosetting resin material that has excellent permeability, for example, and setting the resin material. At this time, the orientation sensor elements 311A, 312A and 313A and the two capacitors 343A are completely covered by this resin material. On the other hand, the second bottom surface pads 213A of the second bottom surface 121A are reliably exposed. Note that exemplary materials for forming the first sealing resin 410A include epoxy resin, phenol resin, polyimide resin, polybenzoxazole (PBO) resin, and silicone resin. The first sealing resin 410A may be either a translucent resin or an opaque resin, but in the present embodiment is preferably an opaque resin.

Figure 67:
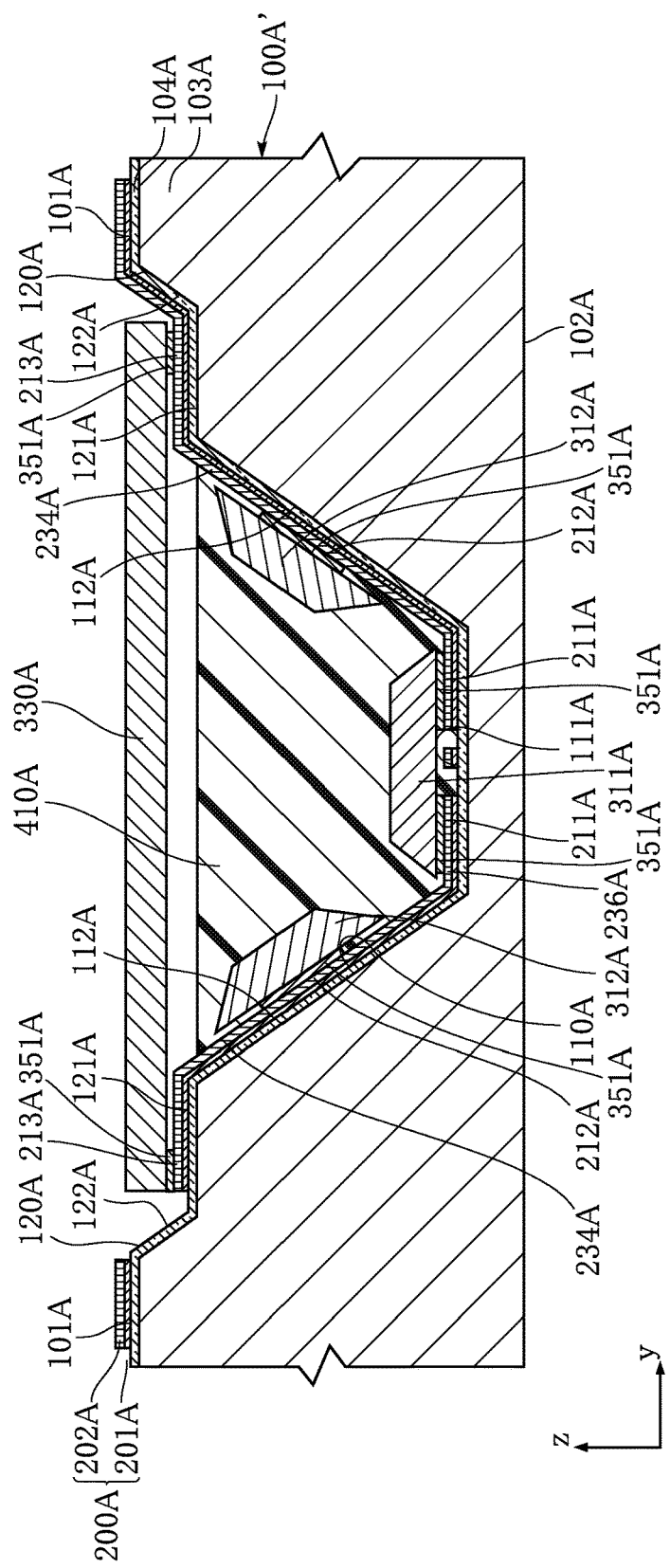
FIG. 67 is a cross-sectional view showing a main section of an exemplary method for making the semiconductor device of FIG. 46.

Next, as shown in FIG. 67, an integrated circuit element 330A is mounted. Solder ball that will form the solder 351A are formed on the integrated circuit element 330A. Also, flux is applied to these solder balls. The integrated circuit element 330A is placed on the second bottom surface 121A utilizing the adhesiveness of this flux. Mounting of the integrated circuit element 330A is completed by melting the solder balls in a reflow furnace and then setting the melted solder.

Figure 68:
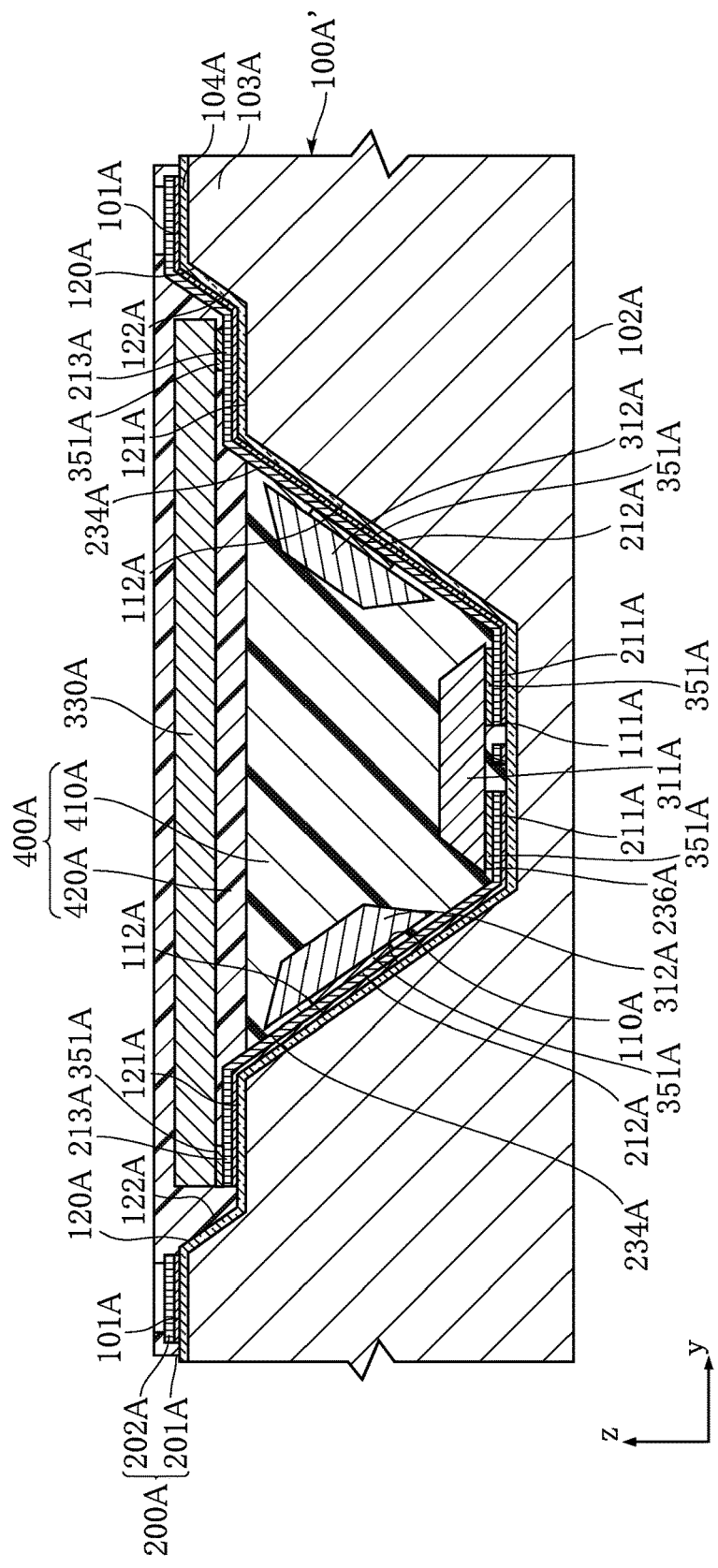
FIG. 68 is a cross-sectional view showing a main section of an exemplary method for making the semiconductor device of FIG. 46.

Next, as shown in FIG. 68, a second sealing resin 420A is formed. The second sealing resin 420A is formed by mainly filling the second recessed portion 120A with a photosetting resin material that has excellent permeability, for example, and setting the resin material. At this time, the integrated circuit element 330A is completely covered by this resin material. On the other hand, a portion of plating layer 202A on the main surface 101A is reliably exposed. Also, the second sealing resin 420A is formed so as to not overlap with a cutting area which will be discussed later. Note that exemplary materials for forming the second sealing resin 420A include epoxy resin, phenol resin, polyimide resin, polybenzoxazole (PBO) resin, and silicone resin. The second sealing resin 420A may be either a translucent resin or an opaque resin, but in the present embodiment is preferably an opaque resin.

Figure 69:
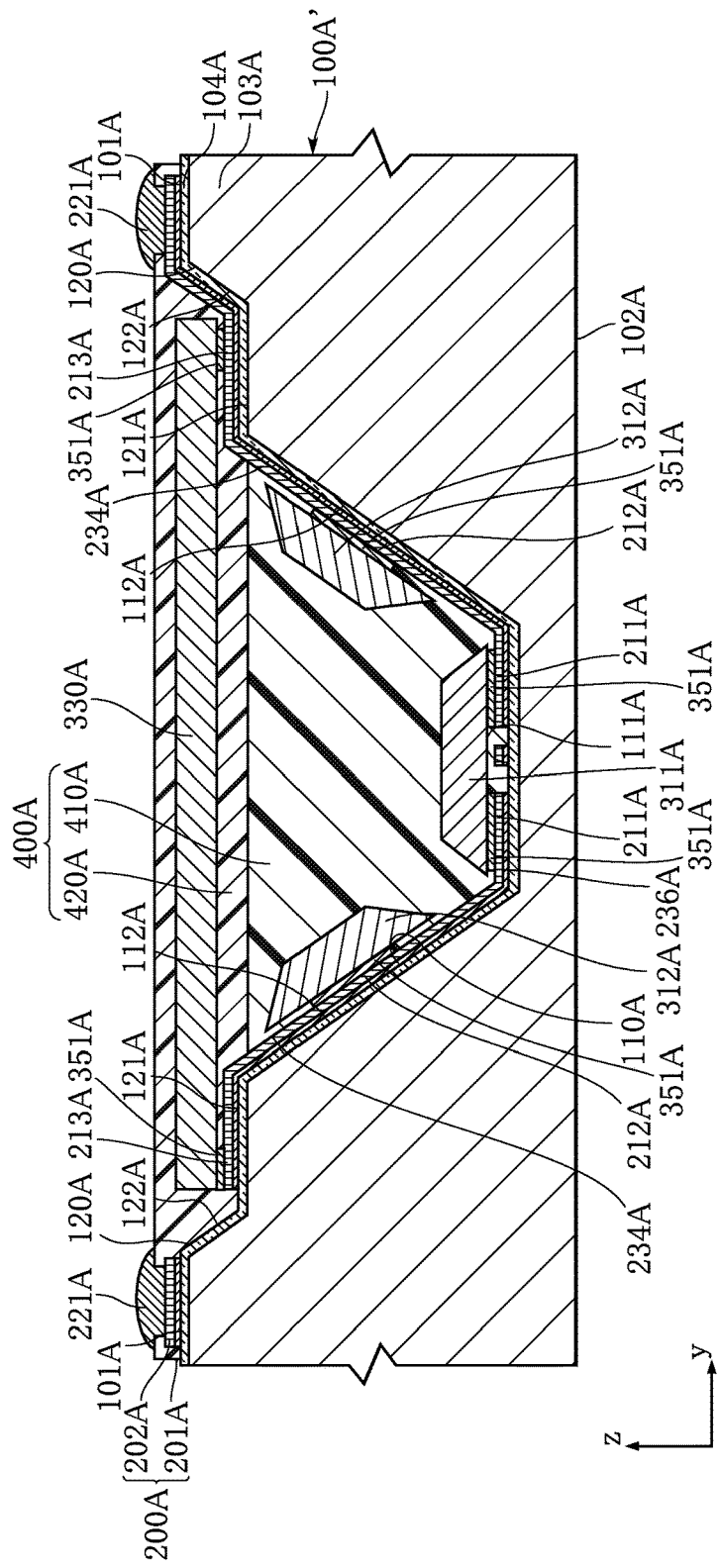
FIG. 69 is a cross-sectional view showing a main section of an exemplary method for making the semiconductor device of FIG. 46.

Next, as shown in FIG. 69, bumps that bulge in the z direction are formed on the external terminals 221A by electroless plating a metal such as Ni, Pd, and Au, for example.

Figure 70:
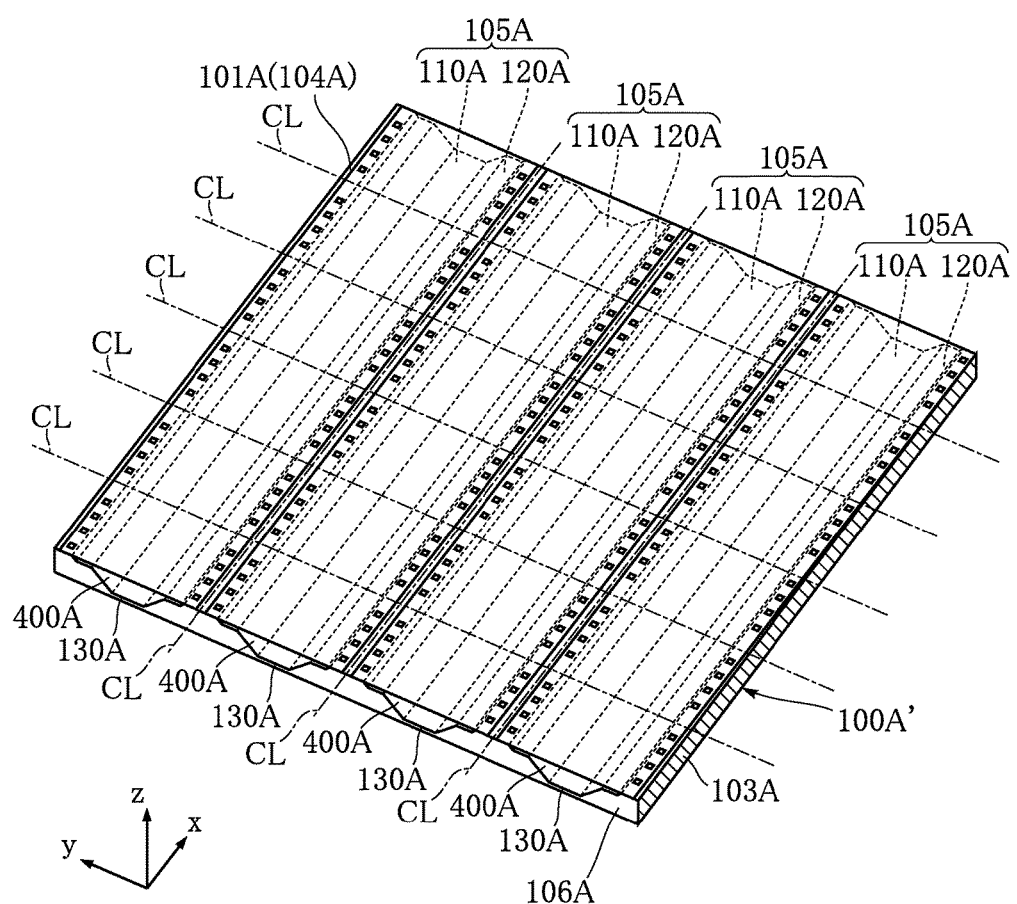
FIG. 70 is a perspective diagram showing a main section of an exemplary method for making the semiconductor device of FIG. 46.

Next, as shown in FIG. 70, the substrate material 100A' is cut along a plurality of cutting lines CL, and the substrate material 100A' is separated into individual pieces. This cutting is performed such that one of the abovementioned sets of elements is included in each piece. Also, the cutting lines CL extending in the x direction are preferably located within the main surface 101A exposed in stripes from the sealing resin 400A (second sealing resin 420A).

Figure 71:
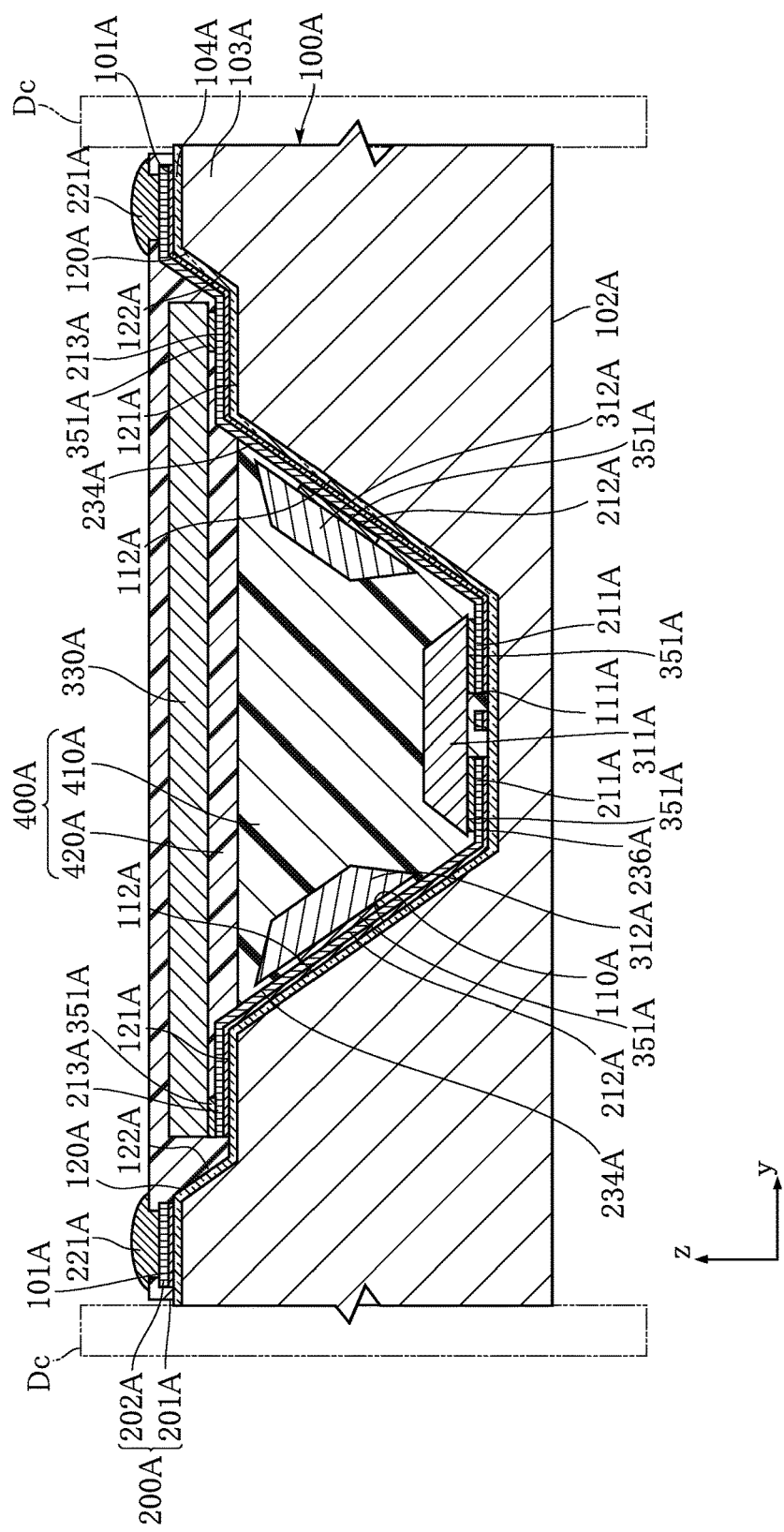
FIG. 71 is a cross-sectional view showing a main section of an exemplary method for making the semiconductor device of FIG. 46.

Cutting along the cutting lines CL is performed using a dicer Dc, as shown in FIG. 71. Note that when cutting along the cutting lines CL extending in the x direction, the dicer Dc cuts only the substrate material 100A' and the second sealing resin 420A is not cut. Through undergoing this cutting, the semiconductor device 1A shown in FIGS. 46 to 49 is obtained.

Next, the effects of the semiconductor device 1A and the method for making the semiconductor device 1A will be described.

According to the present embodiment, the three orientation sensor elements 311A, 312A and 313A are accommodated in the first recessed portion 110A of the recessed portion 105A of the substrate 100A made of a semiconductor material. For this reason, leads for supporting the three orientation sensor elements 311A, 312A and 313A do not need to be provided. Little cost is involved in reshaping the substrate 100A made of a semiconductor material, as compared with the case where leads are molded. Accordingly, the cost of the semiconductor device 1A can be reduced. In particular, in the case of producing the semiconductor device 1B in small batches, the cost reduction effect is marked. As a result of the recessed portion 105A having the opening portions 130A, the area of the first bottom surface 111A can be enlarged in the x direction. This is suited to achieving the miniaturization of the semiconductor device 1A, while disposing the orientation sensor element 311A and the two capacitors 343A on the first bottom surface 111A. In particular, as a result of the recessed portion 105A having the two opening portions 130A, the first bottom surface 111A reaches to both ends of the semiconductor device 1A in the x direction. This configuration is suited to miniaturization of the semiconductor device 1A.

By forming the recessed portion 105A in a two-stepped shape with the first recessed portion 110A and the second recessed portion 120A, the first recessed portion 110A can be used as a space exclusively for accommodating the orientation sensor elements 311A, 312A and 313A and the two capacitors 343A.

As a result of the orientation sensor elements 312A and 313A being supported by the first sloping surfaces 112A, the magnetic cores 315A and 316A defining the orientation detection axes of the orientation sensor elements 312A and 313A can be accurately set to a known angle. This is suited to performing 3-axis detection by the semiconductor device 1A more accurately. As a result of the orientation sensor element 311A being supported by the first bottom surface 111A, the magnetic core 314A of the orientation sensor element 311A can be accurately installed at a different angle to the magnetic cores 315A and 316A of the orientation sensor elements 312A and 313A. Also, a positional relationship can be established in which the magnetic core 314A and the magnetic cores 315A and 316A are installed to form a comparatively large angle. This is advantageous in improving the detection accuracy of the semiconductor device 1A.

As a result of the orientation sensors 311A, 312A and 313A having the abovementioned sloping lateral surfaces, interference between the orientation sensors 311A, 312A and 313A that are adjacent to each other can be avoided. Miniaturization of the semiconductor device 1A can thereby be attained.

As a result of the substrate 100A being made of a single-crystal semiconductor material typified by Si, the first sloping surfaces 112A and the second sloping surfaces 122A can be produced as surfaces that slope accurately at a known predetermined angle relative to the first bottom surface 111A and the second bottom surface 121A. In particular, as a result of the substrate 100A being made of Si and a (100) surface being adopted as the main surface 101A, the angle of the four first sloping surfaces 112A and the four second sloping surfaces 122A relative to the first bottom surface 111A and the second bottom surface 121A can be set to about 55 degrees. The semiconductor device 1A can thereby be configured to have a balanced shape.

As a result of the integrated circuit element 330A being supported by the second bottom surface 121A and partially overlapping with the first recessed portion 110A in plan view, the orientation sensor elements 311A, 312A and 313A and the integrated circuit element 330A can be disposed three-dimensionally in the z direction. Miniaturization of the semiconductor device 1A can thereby be balanced with higher functionality.

As a result of the integrated circuit element 330A being supported by at least two regions of the second bottom surface 121A that sandwich the first recessed portion 110A, the integrated circuit element 330A can be stably supported.

As a result of the external terminals 221A being formed on the main surface 101A, the semiconductor device 1A can be surface mounted, with the external terminal 221A side (main surface 101A side) as the mounting side.

As a result of the second bottom surface pads 213A being formed on the second bottom surface 121A, the integrated circuit element 330A can be appropriately mounted on the second bottom surface 121A.

As a result of the first bottom surface pads 211A being formed on the first bottom surface 111A, the orientation sensor element 311A can be reliably mounted at an attitude along the first bottom surface 111A. As a result of the first sloping surface pads 212A being formed on the first sloping surfaces 112A, the orientation sensor elements 312A and 313A can be reliably mounted at an attitude along the first sloping surfaces 112A.

As a result of the interconnect layer 200A having the connection paths 231A, 234A, 235A and 236A, the external terminals 221A, the second bottom surface pads 213A, the first bottom surface pads 211A and the first sloping surface pads 212A can be reliably electrically connected to each other as desired. As a result of the connection path 231A passing via the second sloping surfaces 122A, the external terminals 221A and the second bottom surface pads 213A formed on the three-dimensionally shaped substrate 100A can be appropriately electrically connected, with little possibility of disconnection or the like. Also, as a result of the connection paths 234A, 235A and 236A passing via the first sloping surfaces 112A, there is little possibility of disconnection or the like.

As a result of the three orientation sensor elements 311A, 312A and 313A and the two capacitors 343A being covered with the sealing resin 400A, these orientation sensor elements 311A, 312A and 313A and the two capacitors 343A can be appropriately protected. As a result of configuring the sealing resin 400A from the first sealing resin 410A and the second sealing resin 420A, the two-stepped recessed portion 105A consisting of the first recessed portion 110A and the second recessed portion 120A can be appropriately filled.

As a result of the first sealing resin 410A being configured to mainly fill the first recessed portion 110A, the three orientation sensor elements 311A, 312A and 313A and the two capacitors 343A can be appropriately covered before the integrated circuit element 330A is mounted. Also, as a result of the integrated circuit element 330A being covered by the second sealing resin 420A, the sealing resin 400A can be formed so that unintended gaps between the integrated circuit element 330A and the three orientation sensor elements 311A, 312A and 313A and the two capacitors 343A do not occur. As a result of the second sealing resin 420A leaving the external terminals 221A exposed, the semiconductor device 1A can be easily surface mounted, and the integrated circuit element 330A, the three orientation sensor elements 311A, 312A and 313A or the two capacitors 343A being wrongly electrically connected to a circuit board, for example, on which the semiconductor device 1A is mounted can be avoided.

Figure 72:
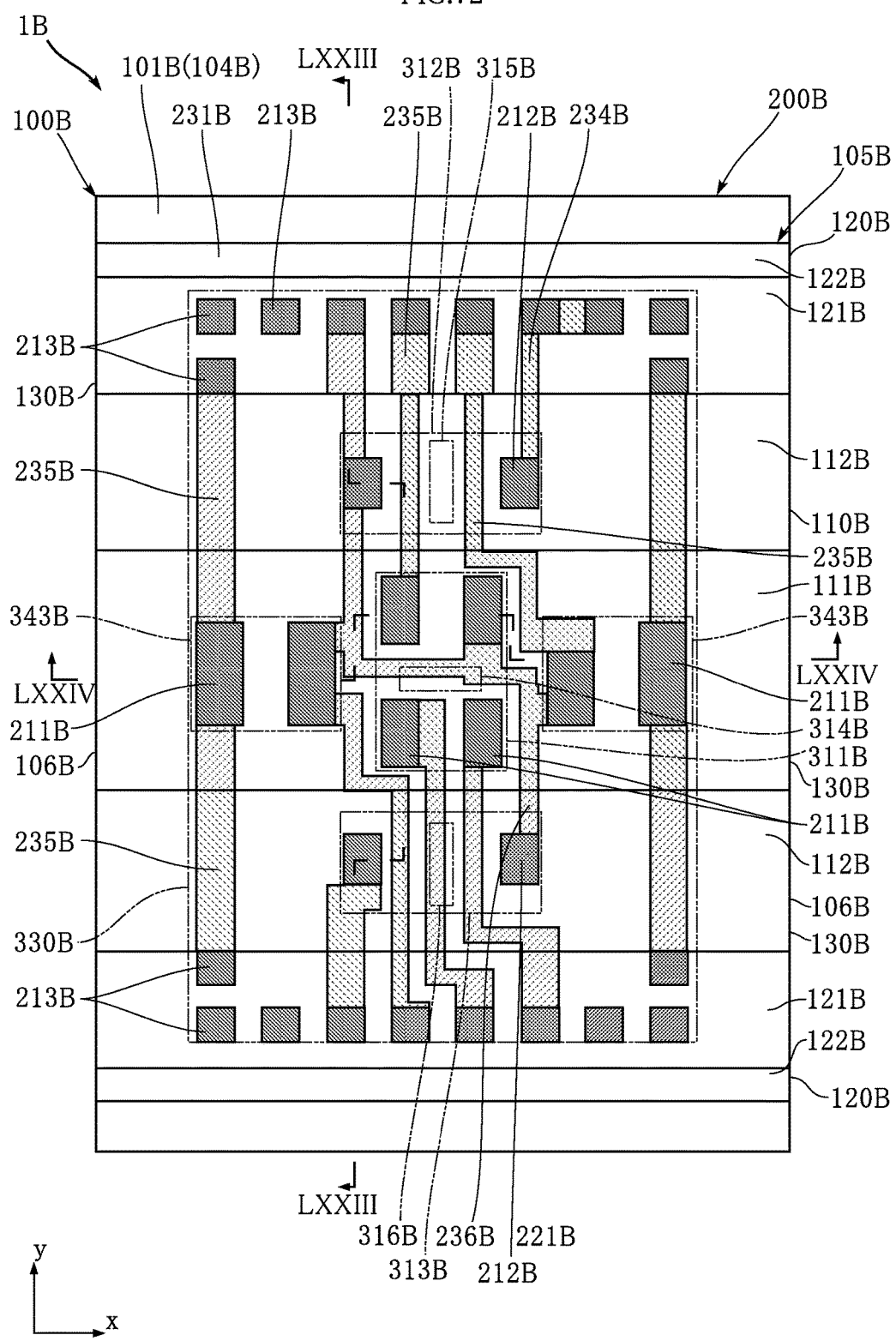
FIG. 72 is a plan view showing a main section of a semiconductor device based on a fourth embodiment of the present invention.
Figure 73:
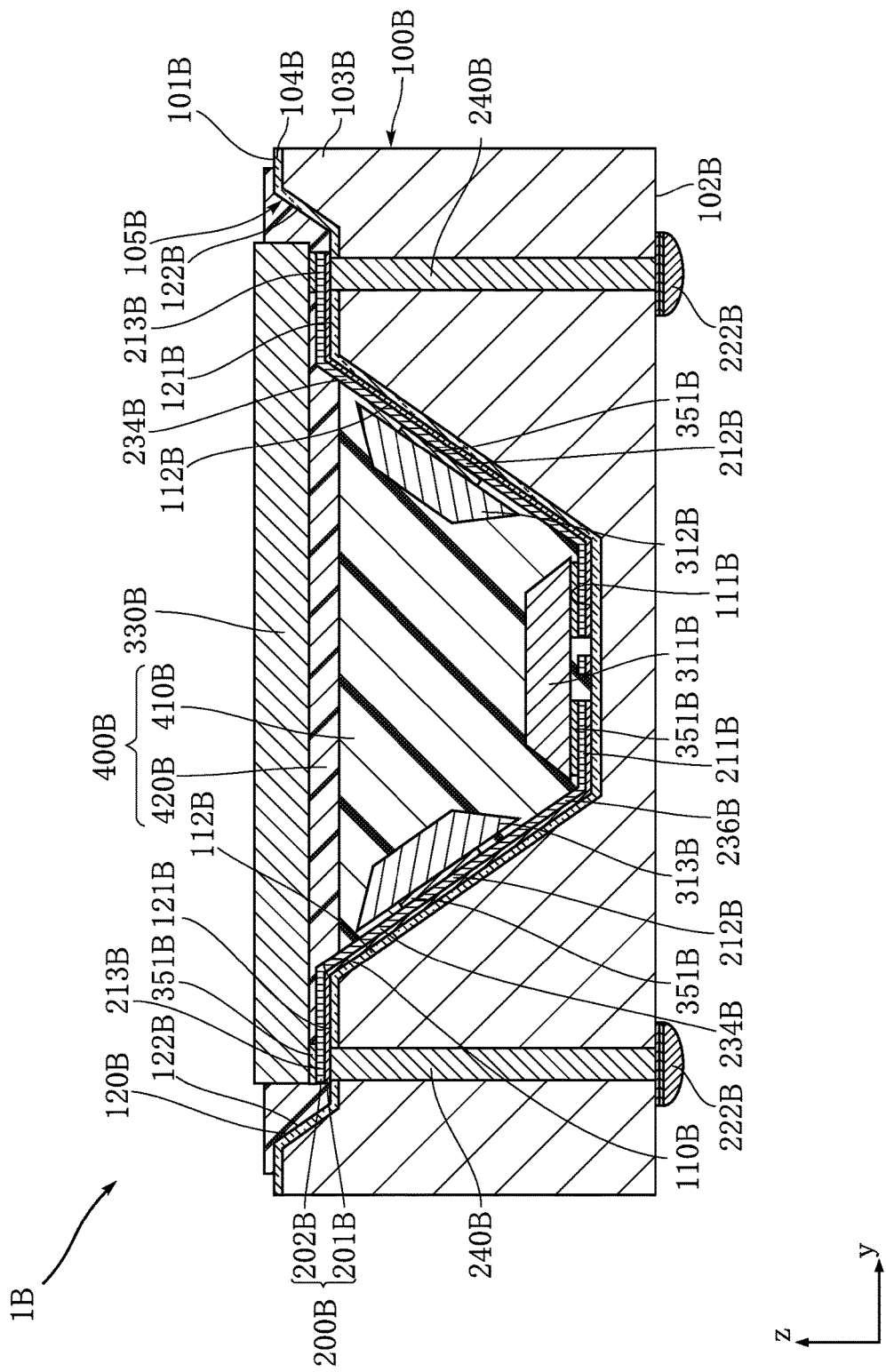
FIG. 73 is a cross-sectional view along a line LXXIII-LXXIII in FIG. 72.
Figure 74:
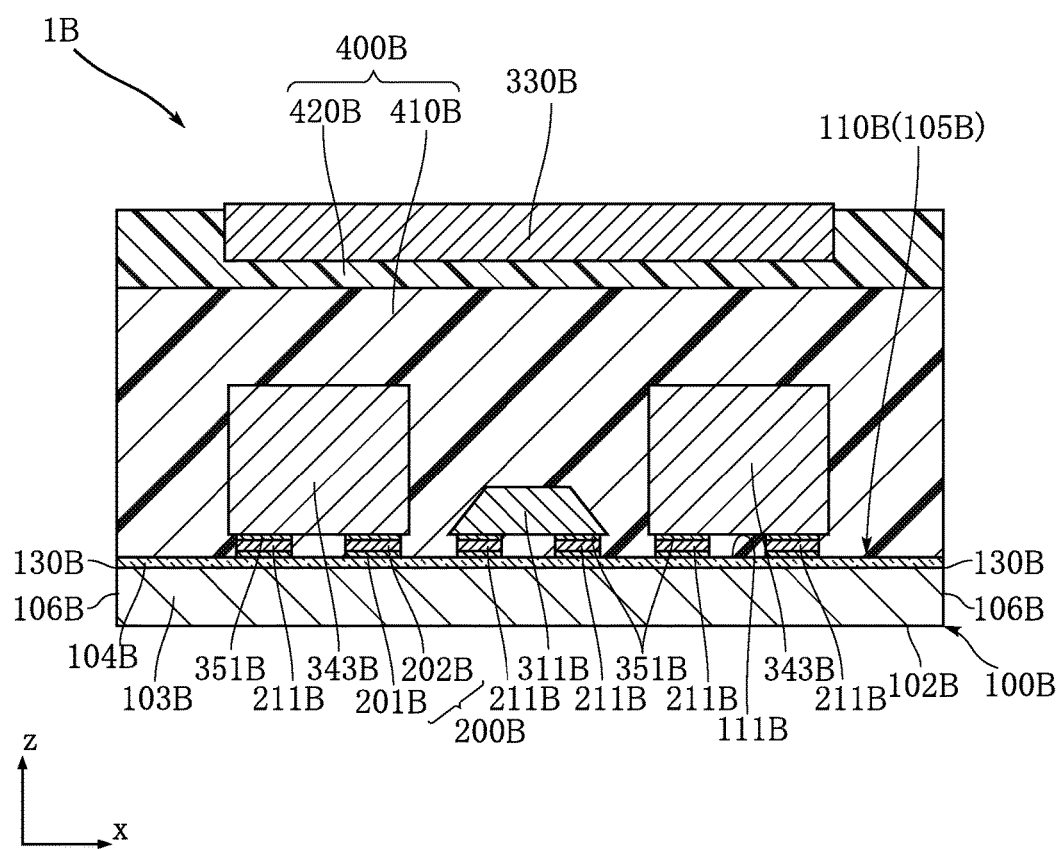
FIG. 74 is a cross-sectional view along a line LXXIV-LXXIV in FIG. 72.

FIGS. 72 to 74 show a semiconductor device based on the second embodiment of the present invention. A semiconductor device 1B of the present embodiment is provided with a substrate 100B, an interconnect layer 200B, three orientation sensor elements 311B, 312B and 313B, an integrated circuit element 330B, two capacitors 343B, and a sealing resin 400B. Note that, in FIG. 72, the sealing resin 400B is omitted, and the three orientation sensor elements 311B, 312B and 313B, the integrated circuit element 330B and the two capacitors 343B are indicated with imaginary outlines. FIG. 73 is a cross-sectional view in an yz plane along a line LXXIII-LXXIII in FIG. 72, and FIG. 74 is a cross-sectional view in a zx plane along a line LXXIV-LXXIV in FIG. 72.

The semiconductor device 1B is configured as a surface-mounted orientation detection module that is capable of detecting orientation in three directions using a configuration that will be described below. To give an example of the size of the semiconductor device 1B, the semiconductor device 1B has a size of about 1.5 mm×2.5 mm in plan view and a thickness of about 0.6 mm.

The substrate 100B forms a base of the semiconductor device 1B, and consists of a base 103B and an insulating layer 104B. The substrate 100B has a main surface 101B, a back surface 102B, a pair of lateral surfaces 106B, and a recessed portion 105B. The substrate 100B has a thickness of about 600 μm, for example. Note that, in the present embodiment, the main surface 101B and the back surface 102B face in opposite directions to each other in the z direction, and the z direction corresponds to the thickness direction of the semiconductor device 1B. Also, the x direction and the y direction are both at a right angle to the z direction. The pair of lateral surfaces 106B are both connected to the main surface 101B, and face in opposite directions to each other in the x direction.

The base 103B is made of a single-crystal semiconductor material, and in the present embodiment is made of single-crystal Si. Also, the insulating layer 104B, in the present embodiment, is made of $SiO_2$. Note that the material of the base 103B is not limited to Si, and need only be a material that enables a recessed portion 105B that meets intentions which will be discussed later to be formed. The insulating layer 104B partially covers the base 103B that faces out from the opposite side to the back surface 102B. The insulating layer 104B has a thickness of about 0.1 to 1.0 μm, for example.

In the present embodiment, the (100) surface of the base 103B is adopted as the main surface 101B. The recessed portion 105B is recessed toward the back surface 102B from the main surface 101B. The recessed portion 105B has a pair of opening portions 130B that open on the pair of lateral surfaces 106B. Note that to favorably achieve the effects intended by the present application which will be discussed later, the recessed portion 105B preferably has a pair of opening portions 130B, but the present application it not limited thereto and may be configured to have only one of the opening portions 130B. Also, the cross-sectional shape of the recessed portion 105B in the yx plane is constant. In the present embodiment, the recessed portion 105B consists of a first recessed portion 110B and a second recessed portion 120B. The first recessed portion 110B is located on the back surface 102B side, and has a first bottom surface 111B and two first sloping surfaces 112B. The second recessed portion 120B is located closer to the main surface 101B than is the first recessed portion 110B, and has two second bottom surfaces 121B and two second sloping surfaces 122B. The first recessed portion 110B and the second recessed portion 120B have shapes that are dependent on having adopted the (100) surface as the main surface 101B.

As a result on the recessed portion 105B being formed, the main surface 101B consists of two regions that are spaced in the y direction.

The first recessed portion 110B has a rectangular shape in plan view. The first recessed portion 110B has a depth of about 400 μm, for example. The first bottom surface 111B has a rectangular shape in plan view. The two first sloping surfaces 112B sandwich the first bottom surface 111B in plan view, and have rectangular shapes that are substantially congruent with each other. Each first sloping surface 112B slopes relative to the first bottom surface 111B. In the present embodiment, the first sloping surfaces 112B are at an angle of about 55 degrees relative to the xy plane. Note that the fact that the first sloping surfaces 112B have substantially trapezoidal shapes that are substantially congruent with each other and the angle is 55 degrees are dependent on having adopted the (100) surface as the main surface 101B.

The second recessed portion 120B has a rectangular shape in plan view. The second recessed portion 120B has a depth of about 120 μm, for example. The two second bottom surfaces 121B have rectangular shapes in plan view, and sandwich the first recessed portion 110B. Also, each second bottom surface 121B is connected to a first sloping surface 112B. The two second sloping surfaces 122B surround the two second bottom surfaces 121B and the first recessed portion 110B in plan view, and have substantially rectangular shapes. The second sloping surfaces 122B slope relative to the second bottom surfaces 121B. In the present embodiment, the second sloping surfaces 122B are at an angle of about 55 degrees relative to the xy plane. Note that the fact that the second sloping surfaces 122B have a substantially trapezoidal shape and the angle is 55 degrees is dependent on having adopted the (100) surface as the main surface 101B.

The interconnect layer 200B is for mounting the three orientation sensor elements 311B, 312B and 313B, the integrated circuit element 330B and the two capacitors 343B, and is for constituting a current path between these parts. The interconnect layer 200B is formed on the insulating layer 104B, and, in the present embodiment, has a structure in which a barrier/seed layer 201B and a plating layer 202B are stacked.

The barrier/seed layer 201B is a base layer for forming a desired plating layer 202B, and is formed on the insulating layer 104B. The barrier/seed layer 201B consists of, for example, a Ti layer serving as a barrier layer and a Cu layer serving as a seed layer stacked on the barrier layer that are formed on the insulating layer 104B. The barrier/seed layer 201B is formed by sputtering, for example.

The plating layer 202B is made of Cu, for example, and is formed by electrolytic plating that utilizes the barrier/seed layer 201B. The plating layer 202B has a thickness of about 5 μm, for example.

In the present embodiment, the interconnect layer 200B has a first bottom surface pad 211B, a first sloping surface pad 212B, a second bottom surface pad 213B, an external terminal 222B, and connection paths 234B, 235B and 236B.

The first bottom surface pad 211B is formed on the first bottom surface 111B of the first recessed portion 110B, and has a rectangular shape, for example. In the present embodiment, six first bottom surface pads 211B are formed. In the present embodiment, the first bottom surface pads 211B are used in order to mount the orientation sensor element 311B and the two capacitors 343B.

The first sloping surface pad 212B is formed on two first sloping surfaces 112B of the first recessed portion 110B, and has a rectangular shape, for example. In the present embodiment, two first sloping surfaces pads 212B are formed on each of the two first sloping surfaces 112B disposed sandwiching the first bottom surface 111B with a space therebetween in they direction. The two first sloping surfaces pads 212B of each first sloping surface 112B are disposed side-by-side in the x direction. In the present embodiment, the first sloping surface pads 212B are used in order to mount the orientation sensor elements 312B and 313B.

The second bottom surface pad 213B is formed on the two second bottom surfaces 121B of the second recessed portion 120B, and has a rectangular shape, for example. In the present embodiment, on each second bottom surface 121B, eight second bottom surface pads 213B are arrayed in the x direction, and the two second bottom surface pads 213B are disposed with a space therebetween in the x direction. In the present embodiment, the second bottom surface pads 213B are used in order to mount the integrated circuit element 330B.

The external terminal 222B is formed on the main surface 101B, and is used in order to surface mount the semiconductor device 1B to the circuit board of an electronic apparatus, for example. The external terminal 222B is configured to have a structure in which a bump obtained by further electroless plating a metal such as Ni, Pd or Au, for example, is formed on the abovementioned barrier/seed layer 201B and plating layer 202B. As shown in FIG. 73, the external terminal 222B is thereby formed to budge in the z direction. In order to electrically connect the first bottom surface pad 211B, the first sloping surface pad 212B and the second bottom surface pad 213B to the external terminal 222B, the semiconductor device 1B has a plurality of through hole paths 240B. Each through hole path 240B passes through the substrate 100B from the second bottom surface 121B to the back surface 102B, and is made of Cu similarly to the plating layer 202B, for example. The through hole paths 240B may be formed at same time with a similar technique to the technique for forming the plating layer 202B. As a result of a plurality of external terminals 222B being provided, the back surface 102B side of the semiconductor device 1B is formed as a mounting surface.

The connection paths 234B, 235B and 236B are for constituting paths that electrically connect the first bottom surface pads 211B, the first sloping surface pads 212B, the second bottom surface pads 213B and the external terminals 222B to each other.

The connection paths 234B constitute paths from the second bottom surfaces 121B to the first sloping surfaces 112B, and electrically connect the second bottom surface pads 213B to the first sloping surface pads 212B. In the present embodiment, some of the connection paths 234B extend linearly in the y direction in plan view. Also, other connection paths 234B are in a bent state on the first sloping surfaces 112B.

The connection paths 235B constitute paths that reach to the first bottom surface 111B from the second bottom surfaces 121B via the first sloping surfaces 112B, and electrically connect the second bottom surface pads 213B to the first bottom surface pads 211B. In the present embodiment, some of the connection paths 235B extend linearly in the y direction in plan view. Also, other connection paths 235B are in a bent state on one of the second bottom surfaces 121B, the first sloping surfaces 112B and the first bottom surface 111B.

The connection paths 236B constitute the paths from the first sloping surfaces 112B to the first bottom surface 111B, and electrically connect the first sloping surface pads 212B to the first bottom surface pads 211B. In the present embodiment, the connection paths 236B extend from one first sloping surface pad 212B to a plurality of first bottom surface pads 211B. Also, the connection paths 236B are in a bent state on the first bottom surface 111B.

Note that, in the present embodiment, the second bottom surface pad 213B that is located third from the left in the upper portion of FIG. 72 is connected to ground. Also, the external terminal 222B, the connection paths 234B, the first sloping surface pads 212B, the connection paths 236B, and the first bottom surface pads 211B that are electrically connected to this second bottom surface pad 213B are connected to ground.

The three orientation sensor elements 311B, 312B and 313B have detection reference axes that extend in different directions to each other, and are used in order to detect the attitude of the semiconductor device 1B relative to geomagnetism, for example. In the present embodiment, the orientation sensor elements 311B, 312B and 313B have magnetic cores 314B, 315B and 316B, as shown in FIG. 72. The magnetic cores 314B, 315B and 316B are metal rod-like members that extend in predetermined directions, and the longitudinal directions thereof correspond to the detection reference axes of the orientation sensor elements 311B, 312B and 313B. The orientation sensor elements 311B, 312B and 313B further have coils (not shown) formed so as to surround the magnetic cores 314B, 315B and 316B. The orientation sensor elements 311B, 312B and 313B have a thickness of about 80 μm, for example.

In the present embodiment, the orientation sensor element 311B is supported by the first bottom surface 111B, and is mounted via solder 351B using three first bottom surface pads 211B. As a result of this form of mounting, the magnetic core 314B of the orientation sensor element 311B extends in the x direction.

The orientation sensor element 312B is supported by the first sloping surface 112B in the upper portion of FIG. 72, and is mounted via solder 351B using three first sloping surface pads 212B. As a result of this form of mounting, the magnetic core 315B of the orientation sensor element 312B is at a right angle to the x direction, and extends in a direction that is included in an yz plane. This direction is parallel to the first sloping surface 112B that supports the orientation sensor element 312B.

The orientation sensor element 313B is supported by the first sloping surface 112B in the lower portion of FIG. 72, and is mounted via solder 351B using three first sloping surface pads 212B. As a result of this form of mounting, the magnetic core 316B of the orientation sensor element 313B is at a right angle to the x direction, and extends in a direction that is included in an yz plane. This direction is parallel to the first sloping surface 112B that supports the orientation sensor element 313B.

Also, in the present embodiment, the orientation sensors 311B, 312B and 313B have a top surface located on an opposite side to a bottom surface on the substrate 100B side that is smaller than the bottom surface. Also, the lateral surfaces connecting the bottom surface and the top surface slope relative to a direction in which the bottom surface and the top surface are spaced from each other.

The integrated circuit element 330B is for controlling orientation detection processing that uses the three orientation sensor elements 311B, 312B and 313B. In the present embodiment, the integrated circuit element 330B is constituted as an ASIC (application-specific integrated circuit) element and has a thickness of about 80 to 100 µm.

The integrated circuit element 330B is supported by the second bottom surfaces 121B, and is mounted via solder 351B utilizing the second bottom surface pads 213B. As shown in FIG. 72, the integrated circuit element 330B is in a state of being supported on two sides, as a result of being mounted using a plurality of second bottom surface pads 213B disposed with a space therebetween in the y direction. Also, the integrated circuit element 330B covers most of the first recessed portion 110B except for a portion thereof in plan view. Also, the integrated circuit element 330B, in plan view, entirely overlaps with the orientation sensor elements 311B and 312B, and partially overlaps with the orientation sensor element 313B. Also, the integrated circuit element 330B also overlaps with the two capacitors 343B. As shown in FIGS. 73 and 74, a portion of the integrated circuit element 330B is contained within the second recessed portion 120B in the z direction.

Direction detection processing by the integrated circuit element 330B using the orientation sensor elements 311B, 312B and 313B is performed as follows, for example. As described above, the orientation sensor elements 311B, 312B and 313B have magnetic cores 314B, 315B and 316B that are each surrounded by a coil. As a result of the orientation sensor elements 311B, 312B and 313B being mounted in the abovementioned form, the orientation sensor elements 311B, 312B and 313B, that is, the magnetic cores 314B, 315B and 316B, extend in different directions to each other. The directions in which these magnetic cores 314B, 315B and 316B extend are stored as known information in the integrated circuit element 330B.

The two capacitors 343B are disposed on the first bottom surface 111B, and are disposed sandwiching the orientation sensor element 311B with a space therebetween in the x direction. The two capacitors 343B and the orientation sensor element 311B are thereby disposed side-by-side in the x direction.

The semiconductor device 1B is able to three dimensionally detect the attitude of the semiconductor device 1B relative to geomagnetism, by using the orientation sensor elements 311B, 312B and 313B based on a technique disclosed in JP-A-2006-47267, for example (3-axis detection). The integrated circuit element 330B outputs the orientation detection result of the semiconductor device 1B as a signal, in response to an external instruction from the external terminals 222B or autonomously.

The sealing resin 400B completely covers the orientation sensor elements 311B, 312B and 313B and the two capacitors 343B, partially covers the integrated circuit element 330B, and fills the recessed portion 105B. In the present embodiment, the sealing resin 400B consists of a first sealing resin 410B and a second sealing resin 420B. Both end faces of the sealing resin 400B in the x direction are exposed from the substrate 100B. Also, both end faces of the sealing resin 400B in the x direction are flush with the two lateral surfaces 106B of the substrate 100B.

The first sealing resin 410B largely fills the first recessed portion 110B, and completely covers the orientation sensor elements 311B, 312B and 313B and the two capacitors 343B. On the other hand, the first sealing resin 410B does not cover the second bottom surface pads 213B or the integrated circuit element 330B.

The second sealing resin 420B largely fills the second recessed portion 120B, and partially covers the integrated circuit element 330B. The upper surface of the integrated circuit element 330B is thereby exposed from the second sealing resin 420B (sealing resin 400B). Also, the second sealing resin 420B is provided in a position slightly removed inwardly from the outer edge of the substrate 100B in the y direction in plan view.

Exemplary materials of the first sealing resin 410B and the second sealing resin 420B include epoxy resin, phenol resin, polyimide resin, polybenzoxazole (PBO) resin, and silicone resin. The first sealing resin 410B and the second sealing resin 420B may be either translucent resins or opaque resins, but in the present embodiment are preferably opaque resins.

Next, the effects of the semiconductor device 1B will be described.

According to the present embodiment, the three orientation sensor elements 311B, 312B and 313B are accommodated in the first recessed portion 110B of the recessed portion 105B of the substrate 100B made of a semiconductor material. For this reason, leads for supporting the three orientation sensor elements 311B, 312B and 313B do not need to be provided. Little cost is involved in reshaping the substrate 100B made of a semiconductor material, as compared with the case where leads are molded. Accordingly, the cost of the semiconductor device 1B can be reduced. In particular, in the case of producing the semiconductor device 1B in small batches, the cost reduction effect is marked. As a result of the recessed portion 105B having the opening portions 130B, the area of the first bottom surface 111B can be enlarged in the x direction. This is suited to achieving the miniaturization of the semiconductor device 1B, while disposing the orientation sensor element 311B and the two capacitors 343B on the first bottom surface 111B. In particular, as a result of the recessed portion 105B having the two opening portions 130B, the first bottom surface 111B reaches to both ends of the semiconductor device 1B in the x direction. This configuration is suited to miniaturization of the semiconductor device 1B.

By forming the recessed portion 105B in a two-stepped shape with the first recessed portion 110B and the second recessed portion 120B, the first recessed portion 110B can be used as a space exclusively for accommodating the orientation sensor elements 311B, 312B and 313B and the two capacitors 343B.

As a result of the orientation sensor elements 312B and 313B being supported by the first sloping surfaces 112B, the magnetic cores 315B and 316B defining the orientation detection axes of the orientation sensor elements 312B and 313B can be accurately set to a known angle. This is suited to performing 3-axis detection by the semiconductor device 1B more accurately. As a result of the orientation sensor element 311B being supported by the first bottom surface 111B, the magnetic core 314B of the orientation sensor element 311B can be accurately installed at a different angle to the magnetic cores 315B and 316B of the orientation sensor elements 312B and 313B. Also, a positional relationship can be established in which the magnetic core 314B and the magnetic cores 315B and 316B installed to form a comparatively large angle. This is advantageous in improving the detection accuracy of the semiconductor device 1B.

As a result of the orientation sensors 311B, 312B and 313B having the abovementioned sloping lateral surfaces, interference between the orientation sensors 311B, 312B and 313B that are adjacent to each other can be avoided. Miniaturization of the semiconductor device 1B can thereby be attained.

As a result of the substrate 100B being made of a single-crystal semiconductor material typified by Si, the first sloping surfaces 112B and the second sloping surfaces 122B can be produced as surfaces that slope accurately at a known predetermined angle relative to the first bottom surface 111B and the second bottom surface 121B. In particular, as a result of the substrate 100B being made of Si and a (100) surface being adopted as the main surface 101B, the angle of the four first sloping surfaces 112B and the four second sloping surfaces 122B relative to the first bottom surface 111B and the second bottom surface 121B can be set to about 55 degrees. The semiconductor device 1B can thereby be configured to have a balanced shape.

As a result of the integrated circuit element 330B being supported by the second bottom surface 121B and partially overlapping with the first recessed portion 110B in plan view, the orientation sensor elements 311B, 312B and 313B and the integrated circuit element 330B can be disposed three-dimensionally in the z direction. Miniaturization of the semiconductor device 1B can thereby be balanced with higher functionality.

As a result of the integrated circuit element 330B being supported by at least two regions of the second bottom surface 121B that sandwich the first recessed portion 110B, the integrated circuit element 330B can be stably supported.

As a result of the external terminals 222B being formed on the back surface 102B, the semiconductor device 1B can be surface mounted, with the external terminal 222B side (back surface 102B side) as the mounting side.

As a result of the second bottom surface pads 213B being formed on the second bottom surface 121B, the integrated circuit element 330B can be appropriately mounted on the second bottom surface 121B.

As a result of the first bottom surface pads 211B being formed on the first bottom surface 111B, the orientation sensor element 311B can be reliably mounted at an attitude along the first bottom surface 111B. As a result of the first sloping surface pads 212B being formed on the first sloping surfaces 112B, the orientation sensor elements 312B and 313B can be reliably mounted at an attitude along the first sloping surfaces 112B.

As a result of the interconnect layer 200B having the connection paths 234B, 235B and 236B and the through hole paths 240B, the external terminals 222B, the second bottom surface pads 213B, the first bottom surface pads 211B and the first sloping surface pads 212B can be reliably electrically connected to each other as desired. As a result of the connection paths 234B, 235B and 236B passing via the first sloping surfaces 112B, there is little possibility of disconnection or the like.

As a result of the three orientation sensor elements 311B, 312B and 313B and the two capacitors 343B being covered with the sealing resin 400B, these orientation sensor elements 311B, 312B and 313B and the two capacitors 343B can be appropriately protected. As a result of configuring the sealing resin 400B from the first sealing resin 410B and the second sealing resin 420B, the two-stepped recessed portion 105B consisting of the first recessed portion 110B and the second recessed portion 120B can be appropriately filled.

As a result of the first sealing resin 410B being configured to mainly fill the first recessed portion 110B, the three orientation sensor elements 311B, 312B and 313B and the two capacitors 343B can be appropriately covered before the integrated circuit element 330B is mounted. Also, as a result of the integrated circuit element 330B being partially covered by the second sealing resin 420B, the sealing resin 400B can be formed so that unintended gaps between the integrated circuit element 330B and the three orientation sensor elements 311B, 312B and 313B and the two capacitors 343B do not occur.

The semiconductor device and the method for making the semiconductor device according to the present invention are not limited to the abovementioned embodiments. Design changes can be freely made to the specific configurations of the semiconductor device and the method for making the semiconductor device according to the present invention.

Configurations of the present invention and variations thereof are enumerated below as Appendixes.

Appendix 1A

An electronic device including:
a substrate that has a main surface and a back surface that face in opposite directions to each other, and is made of a semiconductor material; and
a first electronic element disposed on the substrate;
a conductive layer that is electrically connected to the first electronic element,
wherein a through hole that passes through a portion of the substrate is formed in the substrate, and the through hole has a through hole inner surface, and
the conductive layer is formed from a region on the main surface side of the through hole inner surface to a region on the back surface side of the through hole inner surface.

Appendix 2A

The electronic device according to Appendix 1A,
wherein a recessed portion for element disposition that is recessed from the main surface is formed in the substrate, and
the first electronic element is disposed in the recessed portion for element disposition.

Appendix 3A

The electronic device according to Appendix 2A, wherein the recessed portion for element disposition has a depth of 100 to 300 μm.

Appendix 4A

The electronic device according to Appendix 2A or 3A, wherein the recessed portion for element disposition has a recessed portion bottom surface for element disposition that faces in a first thickness direction that is one thickness direction of the substrate, and a recessed portion lateral surface for element disposition that stands up from the recessed portion bottom surface for element disposition, and the first electronic element is disposed on the recessed portion bottom surface for element disposition.

Appendix 5A

The electronic device according to Appendix 4A, wherein the recessed portion bottom surface for element disposition is orthogonal to the thickness direction.

Appendix 6A

The electronic device according to Appendix 4A or 5A, wherein the recessed portion bottom surface for element disposition includes two band-like surfaces that extends in one direction as viewed in the thickness direction, and the first electronic element is disposed on the two band-like surfaces.

Appendix 7A

The electronic device according to Appendix 6A, wherein the recessed portion bottom surface for element disposition has a connecting surface that connects the two band-like surfaces as viewed in the thickness direction, and the connecting surface extends in a direction that intersects the direction in which each of the two band-like surfaces extend.

Appendix 8A

The electronic device according any of Appendixes 4A to 7A, wherein the recessed portion lateral surface for element disposition is connected to the recessed portion bottom surface for element disposition.

Appendix 9A

The electronic device according to any of Appendixes 4A to 8A, wherein the recessed portion lateral surface for element disposition slopes relative to the thickness direction.

Appendix 10A

The electronic device according to Appendix 9A, wherein the recessed portion lateral surface for element disposition is at an angle of 55 degrees relative to a plane that is orthogonal to the thickness direction.

Appendix 11A

The electronic device according to any of Appendixes 4A to 10A, wherein the recessed portion lateral surface for element disposition is connected to the main surface.

Appendix 12A

The electronic device according to Appendix 4A, wherein the conductive layer is formed on the recessed portion lateral surface for element disposition.

Appendix 13A

The electronic device according to Appendix 12A, wherein the conductive layer includes a plurality of main surface side interconnects, and the plurality of main surface side interconnects are insulated from each other and formed on the recessed portion lateral surface for element disposition.

Appendix 14A

The electronic device according to Appendix 12A or 13A, further including:

a bottom surface electrode pad formed on the recessed portion bottom surface for element disposition, wherein the bottom surface electrode pad is electrically connected to the first electronic element, and is interposed between the first electronic element and the conductive layer.

Appendix 15A

The electronic device according to Appendix 2A, wherein a recessed portion for interconnects is formed on the substrate, and the recessed portion for interconnects communicates with the through hole.

Appendix 16A

The electronic device according to Appendix 15A, wherein the recessed portion for interconnects has a region that overlaps with the first electronic element as viewed in the thickness direction of the substrate.

Appendix 17A

The electronic device according to Appendix 15A or 16A, wherein the recessed portion for interconnects entirely overlaps with the recessed portion for element disposition as viewed in the thickness direction.

Appendix 18A

The electronic device according to any of Appendixes 15A to 17A, wherein the recessed portion for interconnects has a depth of is 250 to 350 μm.

Appendix 19A

The electronic device according to any of Appendixes 15A to 18A, wherein there are a plurality of the recessed portion for interconnects.

Appendix 20A

The electronic device according to Appendix 15A, wherein the recessed portion for interconnects has a recessed portion lateral surface for interconnects, and the recessed portion lateral surface for interconnects is connected to the through hole inner surface.

Appendix 21A

The electronic device according to Appendix 20A, wherein the recessed portion lateral surface for interconnects slopes relative to the thickness direction.

Appendix 22A

The electronic device according to Appendix 21A, wherein the recessed portion lateral surface for interconnects is at an angle of 55 degrees relative to a plane that is orthogonal to the thickness direction.

Appendix 23A

The electronic device according to Appendix 20A, wherein the conductive layer is formed on the recessed portion lateral surface for interconnects.

Appendix 24A

The electronic device according to Appendix 23A, wherein the conductive layer includes a plurality of main surface side interconnects, and the plurality of main surface side interconnects are insulated from each other and formed on the recessed portion lateral surface for interconnects.

Appendix 25A

The electronic device according to Appendix 24A, wherein the main surface side interconnects have a region that is located closer to a center of the through hole than is a portion of the conductive layer formed on the through hole inner surface, as viewed in the depth direction of the through hole.

Appendix 26A

The electronic device according to any of Appendixes 1A to 25A, wherein the through hole has a depth of 10 to 50 μm.

Appendix 27A

The electronic device according to any of Appendixes 1A to 26A, wherein a ratio of the depth of the through hole to a maximum opening size of the through hole as viewed in the thickness direction of the substrate is 0.2 to 5.

Appendix 28A

The electronic device according to any of Appendixes 1A to 27A, wherein there are a plurality of the through hole.

Appendix 29A

The electronic device according to any of Appendixes 1A to 28A, wherein the through hole inner surface extends in the thickness direction of the substrate.

Appendix 30A

The electronic device according to Appendix 1A, wherein the conductive layer includes a plurality of back surface side interconnects, and the plurality of back surface side interconnects are insulated from each other and formed on the through hole inner surface.

Appendix 31A

The electronic device according to any of Appendixes 1A to 30A, wherein the substrate has a thickness of 200 to 550 μm.

Appendix 32A

The electronic device according to any of Appendixes 1A to 31A, wherein the substrate is made of single-crystal semiconductor material.

Appendix 33A

The electronic device according to any of Appendixes 1A to 32A, wherein the semiconductor material is Si.

Appendix 34A

The electronic devices according to any of Appendixes 1A to 33A, wherein the main surface and the back surface are orthogonal to the thickness direction of the substrate and flat.

Appendix 35A

The electronic device according to any of Appendixes 1A to 34A, wherein the main surface is a (100) surface.

Appendix 36A

The electronic device according to Appendix 1A,
wherein the substrate has a first lateral surface, a second lateral surface, a third lateral surface, and a fourth lateral surface,
the first lateral surface, the second lateral surface, the third lateral surface and the fourth lateral surface all face in a direction that is orthogonal to the thickness direction of the substrate, and
the first lateral surface and the second lateral surface, the second lateral surface and the third lateral surface, the third lateral surface and the fourth lateral surface, and the fourth lateral surface and the first lateral surface are respectively connected to each other.

Appendix 37A

The electronic device according to Appendix 1A, further provided with an insulating layer formed on the substrate,
wherein the insulating layer is interposed between the conductive layer and the substrate.

Appendix 38A

The electronic device according to Appendix 37A, wherein the insulating layer is made of $SiO_2$ or SiN.

Appendix 39A

The electronic device according to Appendix 37A, wherein the insulating layer includes a main surface side insulating part, and at least a portion of the main surface side insulating part is formed on the main surface of the substrate.

Appendix 40A

The electronic device according to Appendix 39A, wherein the main surface side insulating part is formed by thermal oxidation.

Appendix 41A

The electronic device according to Appendix 37A, wherein the insulating layer includes a hole inner surface insulating part, the hole inner surface insulating part is formed on the through hole inner surface.

Appendix 42A

The electronic device according to Appendix 41A, wherein the hole inner surface insulating part is formed by CVD.

Appendix 43A

The electronic device according to Appendix 37A, wherein the insulating layer includes a back surface side insulating part, and at least a portion of the back surface side insulating part is formed on the back surface of the substrate.

Appendix 44A

The electronic device according to Appendix 43A, wherein the back surface side insulating part is formed by thermal oxidation.

Appendix 45A

The electronic device according to Appendix 1A, wherein the conductive layer includes a seed layer and a plating layer, and the seed layer is interposed between the substrate and the plating layer.

Appendix 46A

The electronic device according to Appendix 45A, wherein the seed layer has a thickness of less than or equal to 1 μm, and the plating layer has a thickness of 3 to 10 μm.

Appendix 47A

The electronic device according to Appendix 46A, wherein the seed layer is made of Cu, and the plating layer is made of Cu.

Appendix 48A

The electronic device according to any of Appendixes 1A to 47A, further including a main surface side insulating film that is at least partially formed on the main surface, wherein the conductive layer is interposed between the main surface side insulating film and the substrate.

Appendix 49A

The electronic device according to Appendix 48A, further provided with a back surface side insulating film that is at least partially formed on the back surface,
wherein the back surface side insulating film has a region formed inside the through hole, and
the conductive layer is interposed between the back surface side insulating film and the substrate.

Appendix 50A

The electronic device according to Appendix 49A, wherein the main surface side insulating film and the back surface side insulating film are made of SiN.

Appendix 51A

The electronic device according to Appendix 49A or 50A, wherein the main surface side insulating film and the back surface side insulating film are formed by CVD.

Appendix 52A

The electronic device according to Appendix 2A, further including a main surface electrode pad formed on the main surface,
wherein the main surface electrode pad contacts the conductive layer, and is electrically connected to the first electronic element.

Appendix 53A

The electronic device according to Appendix 1A, further including a back surface electrode pad formed on the back surface,
wherein the back surface electrode pad contacts the conductive layer, and is electrically connected to the first electronic element.

Appendix 54A

The electronic device according to Appendix 52A, further including a sealing resin part that fills the recessed portion for element disposition, and covers the first electronic element.

Appendix 55A

The electronic device according to Appendix 54A, wherein the sealing resin part leaves the main surface electrode pad exposed.

Appendix 56A

The electronic device according to Appendix 1A, further including a second electronic element and a third electronic element that are disposed on the back surface side.

Appendix 57A

The electronic device according to Appendix 56A, wherein first electronic element is an integrated circuit element, the second electronic element is an inductor, and the third electronic element is a capacitor.

Appendix 58A

The electronic device according to Appendix 56A, wherein the second electronic element and the third electronic element each have a size in the thickness direction of the substrate of 400 to 600 μm.

Appendix 59A

An electronic device unit including a plurality of the electronic device according to Appendix 1A, wherein the plurality of electronic devices are stacked one on another.

Appendix 60A

The electronic device unit according to Appendix 59A, wherein the plurality of electronic devices are joined to each other via a conductive junction element.

Appendix 1B

An electronic device including:

a substrate having a main surface and a back surface that face in opposite directions to each other, and is made of a semiconductor material;

a first electronic element and an additional first electronic element that are disposed on the substrate and are stacked one on another;

a conductive layer that is electrically connected to the first electronic element, wherein a through hole that passes through a portion of the substrate is formed in the substrate, and the through hole has a through hole inner surface, and the conductive layer is formed from a region on the main surface side of the through hole inner surface to a region on the back surface side of the through hole inner surface.

Appendix 2B

The electronic device according to Appendix 1B, wherein a recessed portion for element disposition that is recessed from the main surface is formed in the substrate, and the first electronic element is disposed in the recessed portion for element disposition.

Appendix 3B

The electronic device according to Appendix 2B, wherein the recessed portion for element disposition has a recessed portion bottom surface for element disposition that faces in a first thickness direction that is one thickness direction of the substrate, and a recessed portion lateral surface for element disposition that stands up from the recessed portion bottom surface for element disposition, and the first electronic element is disposed on the recessed portion bottom surface for element disposition.

Appendix 4B

The electronic device according to Appendix 3B, wherein the recessed portion bottom surface for element disposition is orthogonal to the thickness direction.

Appendix 5B

The electronic device according to Appendix 3B, wherein the recessed portion lateral surface for element disposition slopes relative to the thickness direction.

Appendix 6B

The electronic device according to Appendix 5B, wherein the recessed portion lateral surface for element disposition is at an angle of 55 degrees relative to a plane that is orthogonal to the thickness direction.

Appendix 7B

The electronic device according to any of Appendixes 3B to 6B, wherein the recessed portion lateral surface for element disposition is connected to the main surface.

Appendix 8B

The electronic device according to Appendix 2B, wherein an additional recessed portion for element disposition that is recessed from the recessed portion for element disposition is formed in the substrate, and the additional first electronic element is disposed in the additional recessed portion for element disposition.

Appendix 9B

The electronic device according to Appendix 2B, wherein a recessed portion for interconnects is formed on the substrate, and the recessed portion for interconnects communicates with the through hole.

Appendix 10B

The electronic device according to Appendix 9B, wherein the recessed portion for interconnects has a region that overlaps with the first electronic element as viewed in the thickness direction of the substrate.

Appendix 11B

The electronic device according to Appendix 9B or 10B, wherein the recessed portion for interconnects entirely overlaps with the recessed portion for element disposition as viewed in the thickness direction.

Appendix 12B

The electronic device according to Appendix 9B, wherein the recessed portion for interconnects has a recessed portion lateral surface for interconnects, and the recessed portion lateral surface for interconnects is connected to the through hole inner surface.

Appendix 13B

The electronic device according to Appendix 12B, wherein the recessed portion lateral surface for interconnects slopes relative to the thickness direction.

Appendix 14B

The electronic device according to Appendix 13B, wherein the recessed portion lateral surface for interconnects is at an angle of 55 degrees relative to a plane that is orthogonal to the thickness direction.

Appendix 15B

The electronic device according to Appendix 12B, wherein the conductive layer is formed on the recessed portion lateral surface for interconnects.

Appendix 16B

The electronic device according to Appendix 15B, wherein the conductive layer includes a plurality of main surface side interconnects, and the plurality of main surface side interconnects are insulated from each other and formed on the recessed portion lateral surface for interconnects.

Appendix 17B

The electronic device according to Appendix 16B, wherein the main surface side interconnects have a region that is located closer to a center of the through hole than is a portion of the conductive layer formed on the through hole inner surface, as viewed in the depth direction of the through hole.

Appendix 18B

The electronic device according to any of Appendixes 1B to 17B, wherein the through hole has a depth of 10 to 50 µm.

Appendix 19B

The electronic device according to any of Appendixes 1B to 18B, wherein a ratio of the depth of the through hole to a maximum opening size of the through hole as viewed in the thickness direction of the substrate is 0.2 to 5.

Appendix 20B

The electronic device according to any of Appendixes 1B to 19B, wherein there are a plurality of the through hole.

Appendix 21B

The electronic device according to any of Appendixes 1B to 20B, wherein the through hole inner surface extends in the thickness direction of the substrate.

Appendix 22B

The electronic device according to Appendix 1B, wherein the conductive layer includes a plurality of back surface side interconnects, and the plurality of back surface side interconnects are insulated from each other and formed on the through hole inner surface.

Appendix 23B

The electronic device according to any of Appendixes 1B to 22B, wherein the substrate is made of single-crystal semiconductor material.

Appendix 24B

The electronic device according to any of Appendixes 1B to 23B, wherein the semiconductor material is Si.

Appendix 25B

The electronic device according to any of Appendixes 1B to 24B, wherein the main surface and the back surface are orthogonal to the thickness direction of the substrate and flat.

Appendix 26B

The electronic device according to any of Appendixes 1B to 25B, wherein the main surface is a (100) surface.

Appendix 27B

The electronic device according to Appendix 2B, further including a second electronic element disposed on the substrate,
wherein the second electronic element is disposed on an opposite side to the first electronic element with the through hole sandwiched therebetween.

Appendix 28B

The electronic device according to Appendix 27B,
wherein the recessed portion for element disposition is a main surface side recessed portion for element disposition,
a back surface side recessed portion for element disposition that is recessed from the back surface is formed in the substrate, and
the second electronic element is disposed in the back surface side recessed portion for element disposition.

Appendix 29B

The electronic device according to Appendix 28B, further including an additional second electronic element disposed on the substrate,
wherein the second electronic element and the additional second electronic element are stacked one on another,
an additional back surface side recessed portion for element disposition that is recessed from the back surface side recessed portion for element disposition is formed in the substrate, and
the additional second electronic element is disposed in the additional back surface side recessed portion for element disposition.

Appendix 30B

The electronic device according to Appendix 1B, further provided with an insulating layer formed on the substrate,
wherein the insulating layer is interposed between the conductive layer and the substrate.

Appendix 31B

The electronic device according to Appendix 30B, wherein the insulating layer is made of $SiO_2$ or SiN.

Appendix 32B

The electronic device according to Appendix 30B, wherein the insulating layer includes a main surface side insulating part, and at least a portion of the main surface side insulating part is formed on the main surface of the substrate.

Appendix 33B

The electronic device according to Appendix 32B, wherein the main surface side insulating part is formed by thermal oxidation.

Appendix 34B

The electronic device according to Appendix 30B, wherein the insulating layer includes a hole inner surface insulating part, and the hole inner surface insulating part is formed on the through hole inner surface.

Appendix 35B

The electronic device according to Appendix 34B, wherein the hole inner surface insulating part is formed by CVD.

Appendix 36B

The electronic device according to Appendix 30B, wherein the insulating layer includes a back surface side insulating part, and at least a portion of the back surface side insulating part is formed on the back surface of the substrate.

Appendix 37B

The electronic device according to Appendix 36B, wherein the back surface side insulating part is formed by thermal oxidation.

Appendix 38B

The electronic device according to Appendix 1B, wherein the conductive layer includes a seed layer and a plating layer, the seed layer is interposed between the substrate and the plating layer.

Appendix 39B

The electronic device according to Appendix 38B, wherein the seed layer has a thickness of less than or equal to 1 μm, and the plating layer has a thickness of 3 to 10 μm.

Appendix 40B

The electronic device according to Appendix 39B, wherein the seed layer is made of Cu, and the plating layer is made of Cu.

Appendix 41B

The electronic device according to Appendix 1B, further including a main surface side insulating film that is at least partially formed on the main surface,
wherein the conductive layer is interposed between the main surface side insulating film and the substrate.

Appendix 42B

The electronic device according to Appendix 41B,
further including a back surface side insulating film that is at least partially formed on the back surface,
wherein the back surface side insulating film has a region formed inside the through hole, and the conductive layer is interposed between the back surface side insulating film and the substrate.

Appendix 43B

The electronic device according to Appendix 42B, wherein the main surface side insulating film and the back surface side insulating film are made of SiN.

Appendix 44B

The electronic device according to Appendix 42B or 43B, wherein the main surface side insulating film and the back surface side insulating film are formed by CVD.

Appendix 45B

The electronic device according to Appendix 2B, further including a main surface electrode pad formed on the main surface.

Appendix 46B

The electronic device according to Appendix 2B, further including a back surface electrode pad formed on the back surface.

Appendix 47B

An electronic device unit including a plurality of the electronic device according to Appendix 1B, wherein the plurality of electronic devices are stacked one on another.

Appendix 48B

The electronic device unit according to Appendix 47B, wherein the plurality of electronic devices are joined to each other via a conductive junction element.

The invention claimed is:
1. An electronic device comprising:
a substrate having an obverse surface and a reverse surface that face in opposite directions to each other, the substrate being made of a semiconductor material;
a first electronic element and a first additional electronic element that are disposed on the substrate and are stacked one on another;
a conductive layer that is electrically connected to the first electronic element,
wherein the substrate is formed with at least one through-hole that passes through the substrate, the through-hole having a through-hole inner surface, and
the conductive layer is formed on the through-hole inner surface so as to extend from a region thereof close to the obverse surface to a region thereof close to the reverse surface,
the substrate is formed with an interconnects recessed portion, and the interconnects recessed portion communicates with the through-hole,
the interconnects recessed portion has an interconnects recessed portion lateral surface that is connected to the through-hole inner surface,
the conductive layer includes a plurality of obverse surface side interconnects that are insulated from each other and formed on the interconnects recessed portion lateral surface, and
the obverse surface side interconnects have a region that is located closer to a center of the through-hole than is a portion of the conductive layer formed on the through-hole inner surface, as viewed in a depth direction of the through-hole.

2. The electronic device according to claim 1, wherein the substrate is formed with a first element-disposition recessed portion that is recessed from the obverse surface, and
the first electronic element is disposed in the element-disposition recessed portion.

3. The electronic device according to claim 2, wherein the element-disposition recessed portion has an element-disposition recessed portion bottom surface that faces in a thickness direction of the substrate, and an element-disposition recessed portion lateral surface that stands up from the element-disposition recessed portion bottom surface, and
the first electronic element is disposed on the element-disposition recessed portion bottom surface.

4. The electronic device according to claim 3, wherein the element-disposition recessed portion bottom surface is orthogonal to the thickness direction.

5. The electronic device according to claim 3, wherein the element-disposition recessed portion lateral surface slopes relative to the thickness direction.

6. The electronic device according to claim 5, wherein the element-disposition recessed portion lateral surface is at an angle of 55 degrees relative to a plane that is orthogonal to the thickness direction.

7. The electronic device according to claim 3, wherein the element-disposition recessed portion lateral surface is connected to the obverse surface.

8. The electronic device according to claim 2, wherein the substrate is formed with an additional element-disposition recessed portion that is recessed from the first element-disposition recessed portion, and
the first additional electronic element is disposed in the additional element-disposition recessed portion.

9. The electronic device according to claim 2, wherein an entirety of the interconnects recessed portion overlaps with the element-disposition recessed portion as viewed in the thickness direction.

10. The electronic device according to claim 2, further comprising a second electronic element disposed on the substrate, wherein the second electronic element is disposed on an opposite side to the first electronic element with the through-hole sandwiched therebetween.

11. The electronic device according to claim 10, wherein the substrate is formed with a first reverse surface side element-disposition recessed portion that is recessed from the reverse surface, and
the second electronic element is disposed in the reverse surface side element-disposition recessed portion.

12. The electronic device according to claim 11, further comprising a second additional electronic element disposed on the substrate,
wherein the second electronic element and the second additional electronic element are stacked one on another,
the substrate is formed with an additional reverse surface side element-disposition recessed portion that is recessed from the first reverse surface side element-disposition recessed portion, and
the second additional electronic element is disposed in the additional reverse surface side element-disposition recessed portion.

13. The electronic device according to claim 10, wherein the insulating layer includes a reverse surface side insulating part, and at least a portion of the reverse surface side insulating part is formed on the reverse surface of the substrate.

14. The electronic device according to claim 13, wherein the reverse surface side insulating part is formed by thermal oxidation.

15. The electronic device according to claim 2, further comprising an obverse surface electrode pad formed on the obverse surface.

16. The electronic device according to claim 2, further comprising a reverse surface electrode pad formed on the reverse surface.

17. The electronic device according to claim 1, wherein the interconnects recessed portion has a region that overlaps with the first electronic element as viewed in the thickness direction of the substrate.

18. The electronic device according to claim 1, wherein the interconnects recessed portion lateral surface slopes relative to the thickness direction.

19. The electronic device according to claim 18, wherein the interconnects recessed portion lateral surface is at an angle of 55 degrees relative to a plane that is orthogonal to the thickness direction.

20. The electronic device according to claim 1, wherein the through-hole has a depth of 10 to 50 µm.

21. The electronic device according to claim 1, wherein a ratio of the depth of the through-hole to a maximum opening size of the through-hole as viewed in the thickness direction of the substrate is 0.2 to 5.

22. The electronic device according to claim 1, wherein the at least one through-hole comprises a plurality of through-holes.

23. The electronic device according to claim 1, wherein the through-hole inner surface extends in the thickness direction of the substrate.

24. The electronic device according to claim 1, wherein the conductive layer includes a plurality of reverse surface side interconnects, and the plurality of reverse surface side interconnects are insulated from each other and formed on the through-hole inner surface.

25. The electronic device according to claim 1, wherein the substrate is made of a single-crystal semiconductor material.

26. The electronic device according to claim 1, wherein the semiconductor material is Si.

27. The electronic device according to claim 1, wherein the obverse surface and the reverse surface are orthogonal to the thickness direction of the substrate and flat.

28. The electronic device according to claim 1, wherein the obverse surface is a (100) surface.

29. The electronic device according to claim 1, further comprising an insulating layer formed on the substrate, wherein the insulating layer is interposed between the conductive layer and the substrate.

30. The electronic device according to claim 29, wherein the insulating layer is made of $SiO_2$ or SiN.

31. The electronic device according to claim 29, wherein the insulating layer includes an obverse surface side insulating part, and at least a portion of the obverse surface side insulating part is formed on the obverse surface of the substrate.

32. The electronic device according to claim 31, wherein the obverse surface side insulating part is formed by thermal oxidation.

33. The electronic device according to claim 29, wherein the insulating layer includes a hole inner surface insulating part that is formed on the through-hole inner surface.

34. The electronic device according to claim 33, wherein the hole inner surface insulating part is formed by CVD.

35. The electronic device according to claim 1, wherein the conductive layer includes a seed layer and a plating layer, and the seed layer is interposed between the substrate and the plating layer.

36. The electronic device according to claim 35, wherein the seed layer has a thickness of less than or equal to 1 μm, and the plating layer has a thickness of 3 to 10 μm.

37. The electronic device according to claim 36, wherein the seed layer is made of Cu, and the plating layer is made of Cu.

38. The electronic device according to claim 1, further comprising an obverse surface side insulating film that is at least partially formed on the obverse surface, wherein the conductive layer is interposed between the obverse surface side insulating film and the substrate.

39. The electronic device according to claim 38, further comprising a reverse surface side insulating film that is at least partially formed on the reverse surface, wherein the reverse surface side insulating film has a region formed inside the through-hole, and the conductive layer is interposed between the reverse surface side insulating film and the substrate.

40. The electronic device according to claim 39, wherein the obverse surface side insulating film and the reverse surface side insulating film are made of SiN.

41. The electronic device according to claim 39, wherein the obverse surface side insulating film and the reverse surface side insulating film are formed by CVD.

42. An electronic device unit comprising a plurality of electronic devices according to claim 1, wherein the plurality of electronic devices are stacked one on another.

43. The electronic device unit according to claim 42, wherein the plurality of electronic devices are joined to each other via a conductive junction element.

* * * * *